United States Patent
Hosoi et al.

(10) Patent No.: US 7,433,222 B2
(45) Date of Patent: Oct. 7, 2008

(54) NONVOLATILE SEMICONDUCTOR MEMORY DEVICE

(75) Inventors: Yasunari Hosoi, Fukuyama (JP); Nobuyoshi Awaya, Fukuyama (JP); Isao Inoue, Tsukuba (JP)

(73) Assignees: Sharp Kabushiki Kaisha, Osaka (JP); Institute of Advanced Industrial Science and Technology, Tokyo (JP)

( * ) Notice: Subject to any disclaimer, the term of this patent is extended or adjusted under 35 U.S.C. 154(b) by 101 days.

(21) Appl. No.: 11/647,329

(22) Filed: Dec. 29, 2006

(65) Prior Publication Data

US 2007/0165442 A1  Jul. 19, 2007

(30) Foreign Application Priority Data

Jan. 13, 2006 (JP) .............................. 2006-006738

(51) Int. Cl.
*G11C 11/00* (2006.01)

(52) U.S. Cl. ...................................... 365/148; 365/100
(58) Field of Classification Search .................. 365/148, 365/100, 163
See application file for complete search history.

(56) References Cited

U.S. PATENT DOCUMENTS

| | | | | |
|---|---|---|---|---|
| 6,992,920 | B2 * | 1/2006 | Tamai et al. ........... | 365/189.15 |
| 7,002,837 | B2 * | 2/2006 | Morimoto .................. | 365/148 |
| 7,145,791 | B2 * | 12/2006 | Tsushima et al. ........... | 365/148 |
| 2004/0264244 | A1 | 12/2004 | Morimoto | |
| 2007/0195590 | A1 * | 8/2007 | Sugita ......................... | 365/163 |

FOREIGN PATENT DOCUMENTS

WO  2006/137111 A1  12/2006

OTHER PUBLICATIONS

Pagnia et al., "Bistable Switching in Electroformed Metal-Insulator-Metal Devices," Physica Status Solidi (a), 108, pp. 11-65, 1988.
Zhuang et al., "Novell Colossal Magnetoresistive Thin Film Nonvolatile Resistance Random Access Memory (RRAM)," IEDM Technical Digest, pp. 193-196, Dec. 2000.

* cited by examiner

*Primary Examiner*—Anh Phung
(74) *Attorney, Agent, or Firm*—Nixon & Vanderhye, P.C.

(57) ABSTRACT

A nonvolatile semiconductor device is configured so that a load circuit applying voltage to a variable resistive element is provided electrically connecting in series to the variable resistive element, a load resistive characteristic of the load circuit can be switched between two different characteristics. The two load resistive characteristics are selectively switched depending on whether a resistive characteristic of the variable resistive element transits from low resistance state to high resistance state, or vice versa, voltage necessary for transition from one of the two resistive characteristics to the other is applied by applying writing voltage to a serial circuit of the variable resistive element and load circuit. After the resistive characteristic of the variable resistive element transits from one to the other, voltage applied to the variable resistive element does not allow a resistive characteristic to return from the other to one depending on the selected load resistive characteristic.

34 Claims, 29 Drawing Sheets

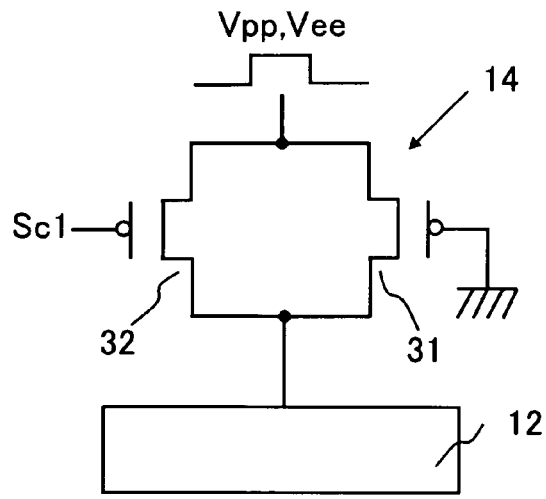
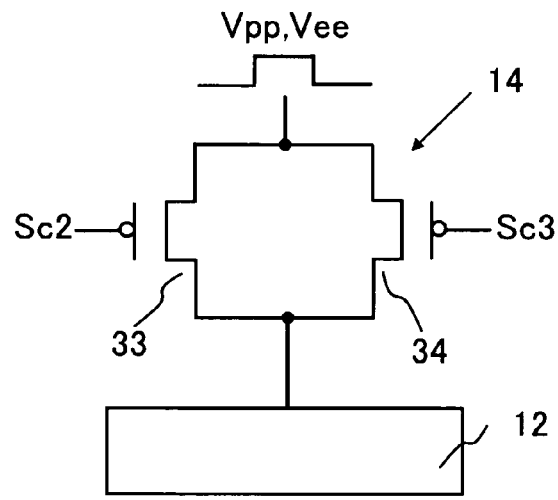
Fig. 10A            Fig. 10B
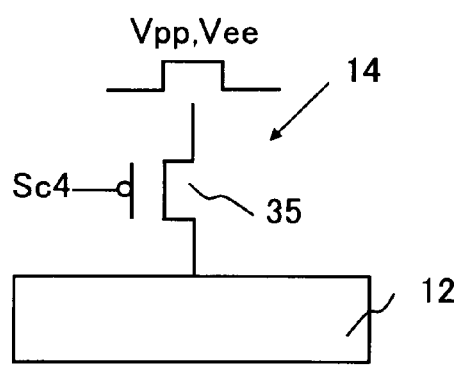
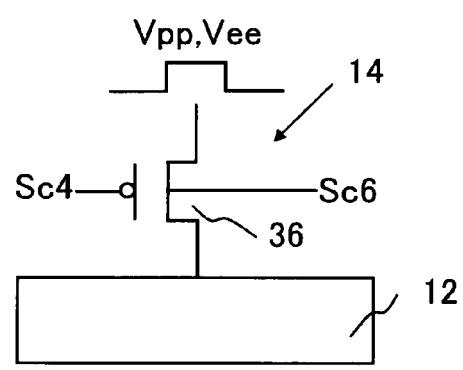
Fig. 10C            Fig. 10D
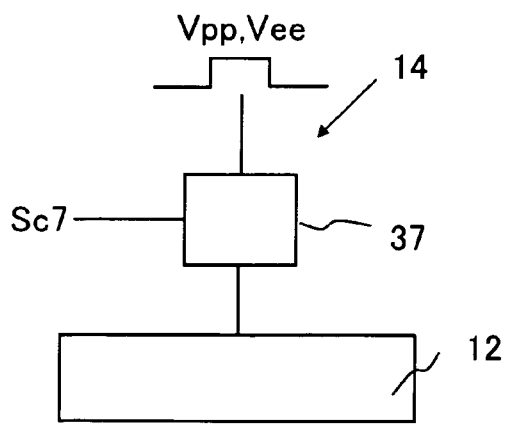
Fig. 10E

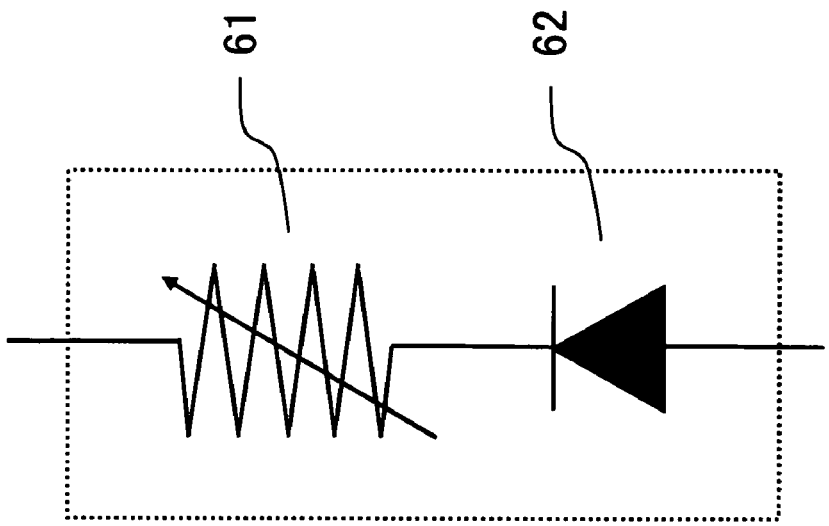
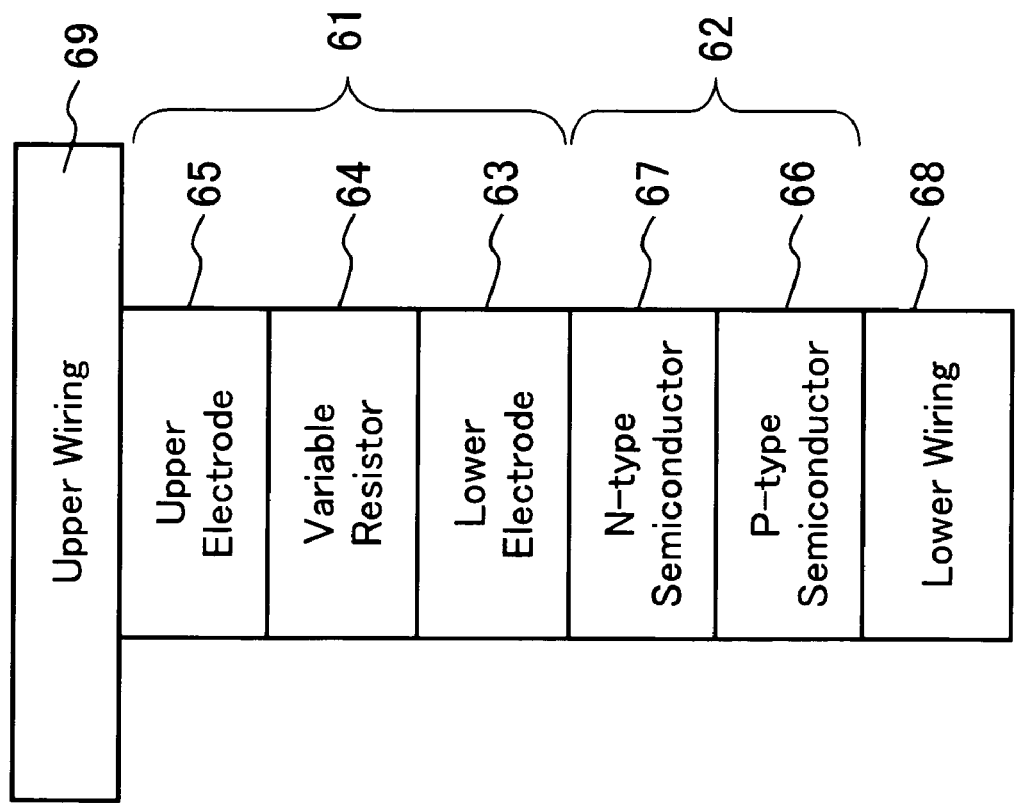
Fig. 18B
Fig. 18A

NONVOLATILE SEMICONDUCTOR MEMORY DEVICE

CROSS REFERENCE TO RELATED APPLICATION

This Nonprovisional application claims priority under 35 U.S.C. §119(a) on Patent Application No. 2006-006738 filed in Japan on 13 Jan. 2006, the entire contents of which are hereby incorporated by reference.

BACKGROUND OF THE INVENTION

1. Field of the Invention

The present invention relates to a nonvolatile semiconductor memory device comprising a variable resistive element whose resistive characteristic varies in accordance with application of voltage.

2. Description of the Related Art

Nonvolatile semiconductor memory devices have been applied to portable phones, personal computers, household electrical appliances, gaming devices or the like, and widely used in the industrial world. The main nonvolatile semiconductor memory device currently being utilized in the industry is flash memory. In principle, flash memory is expected to face limit of miniaturization, and thus research on new nonvolatile semiconductor memory devices that will replace flash memory has been widely carried out. Among them, a study of resistance change memory that utilizes the phenomenon that application of voltage to a metal oxide film causes resistance to change has been actively conducted recently, because the memory is more advantageous than flash memory in terms of limitation of miniaturization and because it is also capable of writing data at a high speed.

Although the study of the phenomenon that application of voltage to metal oxides such as nickel, iron, copper, titanium or the like changes resistance had been under way since 1960s (See H. Pagnia, et. al, "Bistable Switching in Electroformed Metal-Insulator-Metal Devices", Physica Status Solidi (a), 108, pp. 11-65, 1988), then, it was never put into practical use in actual devices. At the end of 1990s, it was proposed to apply to nonvolatile semiconductor memory device the fact that by giving voltage pulse for a short time to such oxides of manganese or copper having the Perovskite-type structure, deterioration of materials can be minimized and resistance can be increased or decreased. Then, it was demonstrated that a memory array of nonvolatile unit memory devices in which variable resistive elements using these metal oxides were combined with a transistor or a diode could be really formed on a semiconductor chip. This was reported in IEDM (International Electron Device Meeting) in 2002 (See W. W. Zhuang, et. al, "Novell Colossal Magnetoresistive Thin Film NonVolatile Resistance Random Access Memory (RRAM)", IEDM Technical Digest, pp. 193-196, December 2000), which triggered wide research to be undertaken in the semiconductor industry. Later, a similar approach was also taken in the research on oxides of nickel or copper carried out in 1960s, and memory devices produced by being combined with a transistor or diode were also reported.

All of these technologies are basically considered a same technology as they utilize resistance change in a metal oxide film to be induced by application of voltage pulse and use different resistance states as stored information in nonvolatile memory devices.

Variable resistive elements whose resistance change is induced by application of voltage, as described above, exhibit various resistive characteristics or resistance change characteristics, depending on a material of a variable resistor, that of an electrode, form and size of a device, and measurement condition. However, it is not known what causes the diversity in these characteristics. In other words, when researchers fabricated nonvolatile memory devices, they simply made operating conditions that happened to exhibit the best characteristics as a nonvolatile memory device operating conditions of that device. Therefore, the overall picture of these characteristics has not been well understood, which still leaves us without any uniform design guideline.

Such condition without any uniform design guideline indicates that the above variable resistive element has not yet grown to be an industrially applicable technology in a true sense. In other words, in the empirically optimized technology as above, although the variable resistive element described above could be used as a single nonvolatile memory device or as a component in which the nonvolatile memory devices are integrated at a small scale, it cannot be applied to modern semiconductor devices that demand high quality assurance of large-scale integration of 1 million to 100 million units as with flash memory.

Specific instances the overall picture of which has not yet been understood, as described above, include bipolar (two polarities) switching characteristic and unipolar (unipolarity) switching characteristic. The switching characteristics of the both and applications thereof have already been reported in IEDM (See W. W. Zhuang, et. al, "Novell Colossal Magnetoresistive Thin Film Nonvolatile Resistance Random Access Memory (RRAM)", IEDM Technical Digest, pp. 193-196, December 2002).

The bipolar switching implements switching between two resistance states by utilizing voltage pulses having two different polarities of plus and minus, having resistance of a variable resistive element transit from low resistance state to high resistance state with voltage pulse of any one of the polarities, and then having it transit from the high resistance state to the low resistance state with voltage pulse of the other polarity.

In contrast, the unipolar switching implements switching between two resistance states by utilizing voltage pulses having a same polarity and two different durations of long and short application (pulse width), having resistance of a variable resistive element transit from the low resistance state to the high resistance state with voltage pulse of one duration of application and then having it transit from the high resistance state to the low resistance state with voltage pulse of other duration of application.

Although so far there have been some reports on the both switching characteristics as described above, no report has done more than stating the characteristics in the operating conditions of any specific memory device fabricated.

Switching operations based on the two switching characteristics described above have benefits and problems, respectively. In fact, since the bipolar switching can implement transit time of several 10 ns or shorter as resistance increases or decreases, a memory device utilizing this can write accumulated data at a very high rate. However, due to use of application of voltage pulses of both positive and negative polarities, configuration of a circuit for implementing a semiconductor memory device becomes complex and chip size expands, thus leading to increased manufacturing cost.

On the other hand, as the unipolar switching can implement switching operation with voltage pulses of a single polarity, circuit configuration can be simplified, chip size can be smaller than that of the bipolar switching, and thus the former is better in terms of the manufacturing cost. In addition, as a combination of a diode and a variable resistive element can be used for a unit memory device, possible effect of current leakage from adjacent memory cells, which will be a problem when a memory cell array is configured as a cross point type, can be substantially reduced, thereby resulting in considerably improved electric characteristics in readout operation. However, as the unipolar switching uses two long and short voltage pulses, and, in particular, the former one needs the pulse width of a few μs, writing thereof takes 100 times longer than that of the bipolar switch. In addition, since the memory cell current during writing ranges from about several hundreds μA to a few mA as with the case of the bipolar switching, to write each memory cell, the unipolar switching also requires about 100 times as high power consumption as the bipolar switching. Thus, it is severely inferior to the bipolar switching in terms of performance during writing.

On the one hand, in terms of stability of switching operations, there exist challenges in any switching characteristics. In order to start switching operations in a stable manner, voltage pulses having optimal voltage amplitude should be selected. However, the voltage amplitude must be determined through trial and error and according to characteristics of a memory device. Thus, even in the case of the bipolar switching, stable switching operation can often be obtained by using voltage pulses to be applied that have different voltage amplitude as well as different polarities.

First, before describing the problems to be resolved by the invention and the means for solving the problems, we describe conditions that can stably implement switching operations based on the bipolar and unipolar switching characteristics as described above, as technological idea on which the present invention is founded. In other words, our description will be based on new knowledge discovered by the inventor for what enables the bipolar and unipolar switching characteristics to develop with similar materials and configuration, no theoretical explanation of stable switching operations of which has been so far given, although the phenomenon itself has been conventionally recognized.

FIG. 25 is representative of current-voltage characteristics showing basic characteristics of resistance change due to application of voltage between both electrodes in a variable resistive element that is configured to sandwich a variable resistor between an upper electrode and a lower electrode. The current-voltage characteristics as shown in FIG. 25 were measured by using a commercially available measuring apparatus (e.g., a parameter analyzer made by Agilent Technologies with the model number 4156B) that can set the upper limit (compliance) of current. Specific voltage and current values differ, depending on a material, a device structure, a manufacturing process, and a device size of individual samples to be measured. However, irrespective of a type of a variable resistor, qualitative characteristics such as those in FIG. 25 can be seen, when a variable resistor is made of an oxide metal of iron, nickel, copper, titanium or the like.

More specifically, when voltage equal to or higher than threshold voltage Va ($Va^+$ or $Va^-$) is applied to a variable resistive element showing resistive characteristic of high resistance state (A in the figure), it transits to resistive characteristic of low resistance state (B in the figure). The current flowing through the variable resistive element rises to the compliance value of Ic1 when applied voltage is Va or higher. Then, when the current compliance value Ic1 is set to a value that will not exceed a current value at a transit position Tb from the low resistance state (characteristic B) to the high resistance state (characteristic A), the current greater than the compliance value Ic1 does not run. Then, if applied voltage is lowered while maintaining the current value Ic1, transition from the high resistance state (characteristic A) to the low resistance state (characteristic B) will take place. Since the applied voltage after the transition to the low resistance state is lower than the threshold voltage Vb ($Vb^+$ or $Vb^-$) at the transit position Tb, the resistive characteristic steadily transits to the low resistance state (characteristic B) rather than going back to the high resistance state (characteristic A). Next, either when the current compliance value is set greater than the current value at the transition point Tb or when the original setting is cancelled and voltage higher than the threshold voltage Vb is applied to a variable resistive element exhibiting the resistive characteristic (B in the figure) of the low resistance state, current flowing through the variable resistive element will decrease and the resistive characteristic will transit to high resistance value (A in the figure).

If voltage equal to or higher than the threshold voltage Va continues to be applied while the variable resistive element is in the high resistance state (A in the figure), without setting the current compliance value, a transition from the low resistance state (characteristic B) to the high resistance state (characteristic A) occurs immediately after a transition from the high resistance state (characteristic A) to the low resistance state (characteristic B) because the applied voltage is higher than the threshold voltage Vb. This results in an unstable oscillation phenomenon that the resistive characteristic of a variable resistive element keeps on changing between the high resistance state (characteristic A) and the low resistance state (characteristic B). If the applied voltage is lowered in such the oscillating condition, oscillation stops when the applied voltage reaches voltage less than the higher threshold voltage Va. As the applied voltage is then higher than the threshold voltage Vb, the resistive characteristic of the variable resistive element is in the high resistance state (characteristic A), and thus no transition to the low resistance state (characteristic B) occurs even if voltage equal to or higher than the threshold voltage Va is actually applied. In sum, application of voltage to a variable resistive element alone without setting a current compliance value could not implement desired switching operations.

In addition, although FIG. 25 shows the case of resistive characteristic in which the threshold voltage Vb for the transition from the low resistance state to the high resistance state is lower than the threshold voltage Va for the transition from the high resistance state to the low resistance state, magnitude relation of these threshold voltages Va, Vb may be reversed. In such a case, although at the threshold voltage Va, a transition from the high resistance state to the low resistance state takes place in stable manner, oscillation occurs when the threshold voltage is equal to or higher than Vb, and application of voltage pulses higher than the threshold voltage Vb does not cause a transition to the high resistance state.

Thus, for a variable resistive element to perform switching operations in a stable manner, the following two conditions should be satisfied in each of the operations of transiting from the high resistance state to the low resistance state, and of transiting from the low resistance state to the high resistance state, respectively.

Firstly, when the resistive characteristic of a variable resistive element transits from the high resistance state to the low resistance state, it is necessary to apply voltage higher than the threshold voltage Va wherein the threshold voltage Va is lower than the threshold voltage Vb. Secondly, when the resistive characteristic of a variable resistive element transits from the low resistance state to the high resistance state, it is necessary to apply voltage higher than the threshold voltage Vb wherein the threshold voltage Vb is lower than the threshold voltage Va.

In a symmetrically configured variable resistive element that was reported in the past, if switching operations are performed in the variable resistive element alone, i.e., when voltage applied to the variable resistive element is turned ON and OFF under the condition that load resistance is zero or fixed to a certain load resistive characteristic, applied voltage to cause transitions between the two resistance states cannot satisfy the above two conditions simultaneously if the respective applied voltage have a same polarity. Then, in order to meet the above two conditions, it was necessary to use asymmetric nature of the bipolar switching characteristic to an asymmetrically configured variable resistive element to be discussed later or the unipolar switching operation that uses changes in the resistive characteristic due to elevated temperatures.

FIG. 26 shows resistive characteristics (current-voltage characteristics) of a variable resistive element capable of bipolar switching operation by satisfying the above two conditions. FIG. 26 shows load resistive characteristic C as well as two resistive characteristics A, B of a variable resistive element. A load circuit forms a serial circuit by electrically connecting to the variable resistive element in series, and when voltage is applied to both ends of the serial circuit, resistive voltage division of the variable resistive element and the load circuit determines voltage to be applied to the variable resistive element. In FIG. 26, voltage at each intersection of the load resistive characteristic C and the resistive characteristics A, B is voltage to be actually applied to the variable resistive element, and the intersection of the load resistive characteristic C and the voltage axis represents voltage to be applied to both ends of the serial circuit. Increasing and decreasing voltage to be applied to both ends of the serial circuit results in lateral translation (in the direction of voltage axis) of a characteristic curve or a characteristic line representative of the load resistive characteristic C. In the example shown in FIG. 26, load resistance exhibiting a linear load resistive characteristic as a load circuit is assumed in the description.

In the current-voltage characteristics shown in FIG. 26, threshold voltage VA+ that transits from the high resistance state (characteristic A) to the low resistance state (characteristic B) as a result of application of voltage to the serial circuit on the side of one polarity (positive polarity) is smaller in absolute value than threshold voltage $VB^+$ that transits from the low resistance state to the high resistance state on the side of the same polarity (positive polarity), wherein voltage equal to or higher than threshold voltage $Va^+$ is applied between both terminals of the variable resistive element when voltage absolute value of which is equal to or higher than the threshold voltage $VA^+$ is applied to both ends of the serial circuit, thus causing a transition from the high resistance state to the low resistance state. The example shown in FIG. 26 has achieved similar effect to that described in FIG. 25, by substituting a load circuit for setting a current compliance. In fact, due to presence of the load circuit, increase in the current through the variable resistive element caused by a transition from the high resistance state to the low resistance state lowers voltage through the load circuit, thus automatically reducing voltage applied to the variable resistive element. If the load resistive characteristic of a load circuit is properly set, an absolute value of the voltage applied to the variable resistive element after transition to low resistance is lower than the threshold voltage $Vb^+$ that transits the resistive characteristic from the low resistance state to the high resistance state, thus implementing stable transition from the high resistance state to the low resistance state. However, even if voltage equal to or higher than the threshold voltage $VB^+$ of the same polarity (positive polarity) is applied to the serial circuit after transition to the low resistance state, no transition from the low resistance state to the high resistance state occurs because voltage no less than the threshold voltage $Vb^+$ that is higher than the threshold voltage $Va^+$ is applied between both terminals of the variable resistive element.

On the contrary, threshold voltage $VB^-$ that transits from the low resistance state (characteristic B) to the high resistance state (characteristic A) as a result of application of voltage to a serial circuit on the side of the other polarity (negative polarity) is smaller in absolute value than threshold voltage $VA^-$ that transits from the high resistance state to the low resistance state on the side of the same polarity (negative polarity), wherein voltage absolute value of which is equal to or higher than threshold voltage $Vb^-$ is applied between both terminals of the variable resistive element when voltage absolute value of which is equal to or higher than the threshold voltage $VB^-$ is applied to both ends of the serial circuit, thus causing a transition from the low resistance state to the high resistance state. If the load resistive characteristic of the load circuit common to the positive and negative polarities is set, the absolute value of voltage applied to the variable resistive element after transition to the high resistance state is lower than the threshold voltage $Va^-$ that transits the resistive characteristic from the high resistance state to the low resistance state, thus implementing a transition from the low resistance state to the high resistance state in a stable manner. However, even if voltage absolute value of which is equal to or higher than the threshold voltage $VA^-$ is applied to the serial circuit of same polarity (negative polarity) after transition to the high resistance state, no transition from the high resistance state to the low resistance state occurs because voltage no less than the threshold voltage $Va^-$ that is higher than the threshold voltage $Vb^-$ is applied between both terminals of the variable resistive element.

The point to be noted here is as follows: for a variable resistive element alone, irrespective of polarity of applied voltage, threshold voltages $Vb^+$ and $Vb^-$ for the transition from the low resistance state to the high resistance state are respectively lower than threshold voltages $Va^+$ and $Va^-$ for the transition from the high resistance state to the low resistance state. Nevertheless, by making a correlation (e.g., voltage difference or voltage ratio) of the threshold voltages $Va^+$ and $Vb^+$ asymmetrical to that of the threshold voltages $Va^-$ and $Vb^-$, and by properly setting the load resistive characteristic of the load circuit, as threshold voltage of voltage applied to the serial circuit, it is possible to set the threshold voltage $VA^+$ lower in absolute value than the threshold voltage $VB^+$ on the side of positive polarity, and the threshold voltage $VB^-$ lower in absolute value than the threshold voltage $VA^-$ on the side of negative polarity. Consequently, the magnitude relation of the threshold voltages $VA^+$ and $VB^+$ and of the threshold voltages $VB^-$ and $VA^-$ can be reversed, thus enabling stable bipolar switching operations by applying voltage of both positive and negative polarities.

Now, the asymmetrical nature of both positive and negative polarities in the correlation of threshold voltages of the variable resistive element shown in FIG. 26 can be obtained by configuring in up-down asymmetrical manner a material of a lower electrode and an upper electrode of the variable resistive element, composition of a variable resistor, device shape, or device size or the like. In particular, implementation of stable bipolar switching may require extremely asymmetrical nature, for instance, the lower and upper electrodes being made of different materials, interface structure between the lower electrode and a variable resistor being different from that between the upper electrode and the variable resistor or the like. Excellent asymmetrical nature is easy to be occurred if rectifying characteristic such as Schottky junction is exhibited on either one of the interface between the lower electrode and the variable resistor and that between the upper electrode and the variable resistor.

However, since the conventional bipolar switching operations use voltage pulses of both the positive and negative polarities, as described above, not only the circuit configuration for implementing a semiconductor memory device becomes complex, chip size expands, and the manufacturing cost increases, but also such the structural asymmetrical nature of the variable resistive element necessitates use of different materials for the lower and upper electrodes in the manufacturing process, which thus complicates manufacturing processes and contributes to another rise in the manufacturing cost.

Aside from the bipolar switching operations to the variable resistive element of the asymmetrical structure as described above, the two conditions for conducting stable switching operations described earlier may be satisfied even by application of voltage of a same polarity if two different values are set for the duration of voltage application to the variable resistive elements.

FIGS. 27A and 27B show resistive characteristics (current-voltage characteristics) of a variable resistive element that can satisfy the above two conditions and perform unipolar switching operations. FIG. 27A shows resistive characteristics (current-voltage characteristics) of a variable resistive element when voltage pulses having short pulse width (voltage application duration) are applied, and FIG. 27B shows resistive characteristics (current-voltage characteristics) of a variable resistive element when voltage pulses having long pulse width (voltage application duration) are applied. In addition, similar to FIG. 26, FIG. 27 also shows load resistive characteristic C as well as two resistive characteristics A, B of a variable resistive element.

In the current-voltage characteristics shown in FIG. 27A, threshold voltage VAs for transition from the high resistance state (characteristic A) to the low resistance state (characteristic B) as a result of application of voltage having short pulse width to a serial circuit is lower in absolute value than threshold voltage VBs for transition from the low resistance state to the high resistance state as a result of application of voltage having the same pulse width, wherein voltage equal to or higher than threshold voltage Vas is applied between both terminals of the variable resistive element when voltage pulses absolute value of which is equal to or higher than threshold voltage VAs is applied to both ends of the serial circuit, thus causing a transition from the high resistance state to the low resistance state. Now in the example shown in FIG. 27A, similar effect to that described in FIG. 25 is obtained by substituting a load circuit for setting a current compliance shown in FIG. 25. In fact, due to presence of the load circuit, increase in the current through the variable resistive element caused by a transition from the high resistance state to the low resistance state lowers voltage through the load circuit, thus automatically reducing voltage applied to the variable resistive element. If the load resistive characteristic of a load circuit is properly set, an absolute value of the voltage applied to the variable resistive element after transition to low resistance is lower than the threshold voltage Vbs for having the resistive characteristic transit from the low resistance state to the high resistance state, thus implementing stable transition from the high resistance state to the low resistance state. However, even if voltage equal to or higher than the threshold voltage VBs is applied to the serial circuit by applying voltage pulses of same pulse width after transition to the low resistance state, no transition from the low resistance state to the high resistance state occurs because voltage no less than the threshold voltage Vbs that is higher than the threshold voltage Vas is applied between both terminals of the variable resistive element.

On the contrary, in the current-voltage characteristics shown in FIG. 27B, threshold voltage VB1 for transition from the low resistance state (characteristic B) to the high resistance state (characteristic A) as a result of application of voltage pulses having long pulse width to the serial circuit is lower in absolute value than threshold voltage VA1 for transition from the high resistance state to the low resistance state in the same long pulse width, wherein voltage absolute value of which is higher than the threshold voltage Vb1 is applied between both terminals of the variable resistive element when voltage absolute value of which is equal to or higher than the threshold voltage VB1 is applied to both ends of the serial circuit, causing a transition from the low resistance state to the high resistance state. If the load resistive characteristic of the load circuit that is common to the long and short pulse width is set, the absolute value of voltage applied to the variable resistive element after transition to the high resistance state is lower than the threshold voltage Va1 for having the resistive characteristic transit from the high resistance state to the low resistance state, thus implementing a transition from the low resistance state to the high resistance state in a stable manner. However, even if voltage equal to or higher than the threshold voltage VA1 is applied to the serial circuit, by applying voltage pulses of the same long pulse width after transition to the high resistance state, no transition from the high resistance state to the low resistance state occurs because voltage no less than the threshold voltage Va1 that is higher than the threshold voltage Vb1 is applied between both terminals of the variable resistive element.

Thus, with the same pulse width, while the resistive characteristic of the variable resistive element only transits from one to the other of the high resistance state (characteristic A) and the low resistance state (characteristic B), it cannot transit in the reverse orientation, which thus makes stable switching operations impossible. In contrast, in the conventional unipolar switching operations, through the use of application of voltage pulses having two long and short pulse width and of same polarity, a transition from the high resistance state to the low resistance state is stably implemented on one application of voltage pulse of the two different pulse width, while a transition from the low resistance state to the high resistance state can be stably implemented.

The point to be noted here is as follows: for a variable resistive element alone, irrespective of whether pulse width is long or short, threshold voltages Vbs and Vb1 for transition from the low resistance state to the high resistance state are respectively lower than threshold voltages Vas and Va1 for transition from the high resistance state to the low resistance state. Nevertheless, by making a correlation (e.g., voltage difference or voltage ratio) of the threshold voltages Vas and Vbs differ from that of the threshold voltages Va1 and Vb1 in terms of whether pulse width is long or short, and by properly setting the load resistive characteristic of the load circuit, as threshold voltage of voltage applied to the serial circuit, it is possible to set the threshold voltage VAs lower in absolute value than the threshold voltage VBs in short pulse width, and the threshold voltage VB1 lower in absolute value than the threshold voltage VA1 in the long pulse width. Consequently, the magnitude relation of the threshold voltages VAs and VBs and of the threshold voltages VB1 and VA1 can be reversed, thus enabling stable unipolar switching operations by applying voltage pulses of different pulse width.

Now it is believed that a difference in correlation between the threshold voltages Va1 and Vb1 of the variable resistive element shown in FIG. 27 due to the length of pulse width results from a change in the high resistance state (characteristic A) and the low resistance state (characteristic B) of the variable resistive element caused by changing resistance values of the variable resistive element and resistance components in the vicinity thereof due to Joule heat generated at the variable resistive element when voltage pulses of longer pulse width are applied. In particular, when voltage amplitude of voltage pulses applied to the serial circuit is fixed, generation of Joule heat will be remarkable in the case that voltage pulses of long pulse width are applied to the variable resistive element in the low resistance state (characteristic B). Thus, it is believed that characteristic change due to difference in pulse width is most obvious in the resistive characteristic in the low resistance state (characteristic B). In fact as can be seen from a comparison of FIGS. 27A and 27B, due to effect of Joule heat, the resistive characteristic in the low resistance state (characteristic B) becomes less resistive when voltage pulses of long pulse width are applied, and the threshold voltage VB1 becomes lower than the threshold voltage VBs of when the pulse width is short.

However, the conventional unipolar switching operations are disadvantageous in terms of time and power consumption needed for writing, because two types of voltage pulses of long and short pulse width should be used.

In Japanese Patent Application Laid-Open (Kokai) No. 2005-25914, there is proposed a method of implementing stable switching operations by changing voltage to be applied to gate voltage of selective transistors during programming or erasing, thereby controlling the amount of current flowing through the variable resistive elements, in nonvolatile semiconductor memory device comprising memory cells through combination of selective transistors and variable resistive elements. In this method, the amount of current flowing through the above variable resistive elements is controlled by varying ON resistance of the selective transistors connected to the variable resistive elements to be switched. However, it only provides a method of adjusting operable voltage value or resistance value when setting magnitude of voltage amplitude of applied voltage pulses to be used in changing resistance in the variable resistive elements or a resistance value of the selective transistors, and has not been successful in specifically presenting a fundamental solution to the problems of the above described conventional bipolar switching operations or unipolar switching operations. Hence, there was a need to study with large amount of labor towards optimization of materials of variable resistive elements or electrodes, a shape of a device or the like, in order to enable stable switching operations with voltage pulses having optimal voltage amplitude and pulse width in circuit designing for many purposes.

SUMMARY OF THE INVENTION

The present invention was made in light of the above problems of the conventional bipolar switching operations or unipolar switching operations in a nonvolatile semiconductor memory device comprising a variable resistive element resistive characteristic of which varies as a result of application of voltage. The invention aims to provide a nonvolatile semiconductor memory device capable of stable switching operations at a high speed to variable resistive elements, based on uniform understanding of the phenomenon of bipolar switching operations or unipolar switching operations and without relying only on implementation of structural asymmetrical nature of variable resistive elements or distinction of long and short durations of voltage application.

A nonvolatile semiconductor memory device for achieving the above object according to the present invention is a nonvolatile semiconductor memory device comprising a variable resistive element having a two-terminal structure wherein a resistive characteristic specified by current-voltage characteristics between the two terminals can transit between two resistive characteristics of low resistance state and high resistance state that can be taken stably when voltage is applied to one terminal based on the other terminal with at least one of positive or negative polarities, the variable resistive element including different first threshold voltage and second threshold voltage, the first threshold voltage being the lower limit of an absolute value of applied voltage necessary for the resistive characteristic to transit from the low resistance state to the high resistance state, and the second threshold voltage being the lower limit of an absolute value of applied voltage necessary for the resistive characteristic to transit from the high resistance state to the low resistance state, the volatile semiconductor memory device having a first characteristic that a memory state of the variable resistive element is determined by whether the resistive characteristic is either in the low resistance state or in the high resistance state, the memory state can be written as a result of a transition of the resistive characteristic between the low resistance state and the high resistance state by applying voltage between both terminals of the variable resistive element, a load circuit for applying voltage between both terminals of the variable resistive element when the memory state of the variable resistive element is written is provided so as to be electrically connected in series with the variable resistive element to be written, a load resistive characteristic specified by current-voltage characteristics of the load circuit can be switched between two different load resistive characteristics, the two load resistive characteristics of the load circuit are selectively switched depending on whether the resistive characteristic of the variable resistive element to be written transits from the low resistance state to the high resistance state or from the high resistance state to the low resistance state, predetermined voltage for writing applied to both ends of a serial circuit of the variable resistive element to be written and the load circuit allows voltage necessary for transition from one of the two resistive characteristics to the other to be applied between both terminals of the variable resistive element, and after the resistive characteristic of the variable resistive element transits from the one resistive characteristic to the other resistive characteristic, the voltage applied between both terminals of the variable resistive element does not allow the resistive characteristic to return from the other resistive characteristic to the one resistive characteristic.

According to the nonvolatile semiconductor memory device of the first characteristic, as it is such configured that a load resistive characteristic of the load circuit can be switched between two different load resistive characteristics, and that the two load resistive characteristics can be selectively switched depending on whether the resistive characteristic of the variable resistive element to be written transits from the low resistance state to the high resistance state or from the high resistance state to the low resistance state, it is possible to set the load resistive characteristic that can individually satisfy two conditions for performing stable switching operations as a variable resistive element, which is a new aspect revealed by the inventors of the present invention, irrespective of whether a variable resistive element has a symmetrical or a asymmetrical structure, whether durations of voltage application is short or long, or polarity of applied voltage, namely, 1) when the resistive characteristic of the variable resistive element transits from the high resistance state to the low resistance state, voltage that is higher than threshold voltage of the transition is applied where the threshold voltage of the transition is lower than threshold voltage of a transition in the opposite direction, and 2) when the resistive characteristic of the variable resistive element transits from the low resistance state to the high resistance state, voltage that is higher than threshold voltage of the transition is applied where the threshold voltage of the transition is lower than a transition in the opposite direction, thus implements stable switching operations mutually between the high resistance state and the low resistance state of the resistive characteristic of the variable resistive element. Consequently, the problems in the conventional bipolar switching operations or the unipolar switching operations are to be solved, and hence, in a nonvolatile semiconductor memory device comprising a variable resistive element whose resistive characteristic varies as a result of application of voltage, stable switching operations to the variable resistive element at a high speed and control of rising manufacturing cost will be possible.

In the following, with reference to the drawings, we describe how the present invention enables stable unipolar switching operations between the high resistance state and the low resistance state to the resistive characteristics in the low resistance state and the high resistance state of one given set of variable resistive elements.

FIGS. 28A and 28B show resistive characteristics (current-voltage characteristics) of a variable resistive element that can satisfy the above two conditions based on the present invention and perform unipolar switching operations. Both FIGS. 28A and 28B show resistive characteristics A, B of a variable resistive element when voltage pulses having same pulse width (duration of voltage application) is applied. In FIGS. 28A and 28B, the respective resistive characteristics A and B are same, while load resistive characteristics C1 and C2 are different. FIG. 28 shows the two resistive characteristics A and B of the variable resistive element as well as the load resistive characteristics C1 or C2 of the load circuit. A load circuit forms a serial circuit by electrically connecting to the variable resistive element in series, and when voltage is applied to both ends of the serial circuit, resistive voltage division of the variable resistive element and the load circuit determines voltage to be applied to the variable resistive element. In FIG. 28, voltage at each intersection of the load resistive characteristics C1, C2 and the resistive characteristics A, B is voltage to be actually applied to the variable resistive element, and each intersection between the load resistive characteristics C1, C2 and the voltage axis represents voltage to be applied to both ends of the serial circuit. Increasing and decreasing voltage to be applied to both ends of the serial circuit results in lateral translation (in the direction of voltage axis) of a characteristic curve or a characteristic line representative of the load resistive characteristic C1, C2. In the example shown in FIG. 28, although the description assumes load resistance showing a linear load resistive characteristics as the load circuit, similar description is applicable even when the load resistive characteristics is nonlinear.

In the current-voltage characteristics shown in FIG. 28A, threshold voltage VA1 that transits from the high resistance state (characteristic A) to the low resistance state (characteristic B) as a result of application of voltage pulses to a serial circuit including a load circuit of the load resistive characteristic C1 is lower in absolute value than threshold voltage VB1 that transits from the low resistance state to the high resistance state, wherein voltage higher than threshold voltage Va1 is applied between both terminals of the variable resistive element when voltage pulses an absolute value of which is equal to or higher than the threshold voltage VA1 are applied to both ends of the serial circuit, thus causing a transition from the high resistance state to the low resistance state. Due to presence of the load circuit of the load resistive characteristic C1, increase in the current flowing through the variable resistive element caused by a transition from the high resistance state to the low resistance state lowers voltage through the load circuit, thus automatically reducing voltage applied to the variable resistive element. If the load resistive characteristic C1 of a load circuit is properly set, an absolute value of the voltage applied to the variable resistive element after transition to low resistance is lower than the threshold voltage Vb1 for having the resistive characteristic transit from the low resistance state to the high resistance state, thus implementing stable transition from the high resistance state to the low resistance state. However, even if voltage equal to or higher than threshold voltage VB1 is applied to the serial circuit including the load circuit of the same load resistive characteristic C1 after transition to the low resistance state, no transition from the low resistance state to the high resistance state occurs because voltage no less than the threshold voltage Vb1 that is higher than the threshold voltage value Va1 is applied between both terminals of the variable resistive element. In fact, if voltage pulses equal to or higher than the threshold voltage VB1 are applied to both ends of the serial circuit, voltage equal to or higher than the threshold voltages Va1 and Vb1 is applied between both terminals of the variable resistive element while voltage pulses are being applied, thus causing transitions in both directions between the high resistance state and the low resistance state and leading to unstable condition (oscillation condition). However, since voltage is applied like pulses, and at the end of the voltage application duration, there will be voltage applied condition in which the absolute value of the applied voltage (voltage amplitude of the voltage pulses) is equal to or higher than the threshold voltage VA1 and lower than the threshold voltage VB1, the resistive characteristics of the variable resistive element will finally converge to the low resistance state.

In contrast, in the current-voltage characteristics shown in FIG. 28B, threshold voltage VB2 that transits from the low resistance state (characteristic B) to the high resistance state (characteristic A) as a result of application of voltage pulse to a serial circuit including a load circuit of the load resistive characteristic C2 lower than the load resistive characteristic C1 is lower in absolute value than threshold voltage VA2 for transition from the high resistance state to the low resistance state, wherein voltage of which an absolute value is higher than threshold voltage Vb2 (=Vb1) is applied between both terminals of the variable resistive element when voltage of which an absolute value is equal to or higher than the threshold voltage VB2 is applied to both ends of the serial circuit, thus causing a transition from the low resistance state to the high resistance state. If the load resistive characteristic C2 of the load circuit is properly set, the absolute value of voltage applied to the variable resistive element after transition to the high resistance state falls below threshold voltage Va2 (=Va1) for having the resistive characteristic transit from the high resistance state to the low resistance state, thus implementing stable transition from the low resistance state to the high resistance state. However, even if voltage no less than the threshold voltage VA2 is applied to the serial circuit including the load circuit of the same load resistance characteristic C2, no transition from the high resistance state to the low resistance state occurs because voltage no less than the threshold voltage Va2 that is higher than the threshold voltage Vb2 is applied between both terminals of the variable resistive element. In fact, if voltage pulses equal to or higher than the threshold voltage VA2 are applied to both ends of the serial circuit, voltage equal to or higher than the threshold voltages Va2 and Vb2 is applied between both terminals of the variable resistive element while voltage pulses are being applied, thus causing transitions in both directions between the high resistance state and the low resistance state and leading to unstable condition (oscillation condition). However, as voltage is applied like pulses, there will be voltage applied condition at the end of the voltage application duration, in which the absolute value of the applied voltage (voltage amplitude of the voltage pulses) is equal to or higher than the threshold voltage VB2 and lower than the threshold voltage VA2, and thus the resistive characteristics of the variable resistive element will finally converge to the high resistance state.

Therefore, according to the present invention, even for voltage pulses of same pulse width, by switching the load resistive characteristics C1, C2 of the load circuit according to switching direction, a transition from the high resistance state to the low resistance state can be implemented in a stable manner because of the resistive characteristic C1 and a transition from the low resistance state to the high resistance state can be implemented in a stable manner because of the resistive characteristic C2.

The point to be noted here is as follows: for a variable resistive element alone, irrespective of the load resistive characteristics, threshold voltage Vb1 (=Vb2) for transition from the low resistance state to the high resistance state is lower than threshold voltage Va1 (=Va2) for transition from the high resistance state to the low resistance state. Nevertheless, by properly setting the load resistive characteristics C1, C2 and switching them in accordance with the switching direction, as threshold voltage of voltage to be applied to the serial circuit, it is possible to set the threshold voltage VA1 lower in absolute value than the threshold voltage VB1 in a transition from the high resistance state to the low resistance state, and set the threshold voltage VB2 lower in absolute value than the threshold voltage VA2 in a transition from the low resistance state to the high resistance state. Consequently, the magnitude relation of the threshold voltages VA1 and VB1 and of the threshold voltages VB2 and VA2 can be reversed, thus enabling stable unipolar switching operations by applying voltage pulses of same pulse width.

Next, FIG. 29 shows the resistive characteristics (current-volume characteristics) of the variable resistive element that can satisfy the above two conditions and perform bipolar switching operations. In FIG. 29, two resistive characteristics A, B of the variable resistive element and load resistive characteristics C1, C2 of a load circuit are shown together. In addition, unlike the conventional bipolar switching characteristics (See FIG. 26), the two resistive characteristics A, B of the variable resistive element serve as symmetrical characteristics on the side of positive polarity and of negative polarity. The load circuit forms a serial circuit by electrically connecting to the variable resistive element in series, and when voltage is applied to both ends of the serial circuit, resistive voltage division of the variable resistive element and the load circuit determines voltage to be applied to the variable resistive element. In FIG. 29, voltage at each intersection of the load resistive characteristics C1, C2 and the resistive characteristics A, B is voltage to be actually applied to the variable resistive element, and each intersection between the load resistive characteristics C1, C2 and the voltage axis represents voltage to be applied to both ends of the serial circuit. Increasing and decreasing voltage to be applied to both ends of the serial circuit results in lateral translation (in the direction of voltage axis) of a characteristic curve or a characteristic line representative of the load resistive characteristics C1, C2. In the example shown in FIG. 29, although the description assumes load resistance showing a linear load resistive characteristics as the load circuit, similar description is applicable even when the load resistive characteristics is nonlinear.

In the current-voltage characteristics shown in FIG. 29, threshold voltage $VA^+$ for transition from the high resistance state (characteristic A) to the low resistance state (characteristic B) as a result of application of voltage to a serial circuit on the side of one polarity (positive polarity) is lower in absolute value than threshold voltage $VB^+$ for transition from the low resistance state to the high-resistance state, wherein voltage equal to or higher than the threshold voltage $Va^+$ is applied between both terminals of the variable resistive element, when the absolute value of which is equal to or higher than the threshold voltage $VA^+$ is applied to both ends of the serial circuit, thus causing a transition from the high resistance state to the low resistance state. Due to presence of the load circuit, increase in the current flowing through the variable resistive element caused by a transition from the high resistance state to the low resistance state lowers voltage through the load circuit, thus automatically reducing voltage applied to the variable resistive element. If the load resistive characteristic C1 of a load circuit is properly set, an absolute value of the voltage applied to the variable resistive element after transition to low resistance is lower than the threshold voltage $Vb^+$ for having the resistive characteristic transit from the low resistance state to the high resistance state, thus implementing stable transition from the high resistance state to the low resistance state. However, even if voltage equal to or higher than threshold voltage $VB^+$ of the same polarity (positive polarity) is applied to the serial circuit including the load circuit of the same load resistive characteristic C1 after transition to the low resistance state, no transition from the low resistance state to the high resistance state occurs because voltage no less than the threshold voltage $Vb^+$ that is higher than the threshold voltage value $Va^+$ is applied between both terminals of the variable resistive element. In fact, if voltage pulses equal to or higher than the threshold voltage $VB^+$ are applied to both ends of the serial circuit, voltage equal to or higher than the threshold voltages $Va^+$ and $Vb^+$ is applied between both terminals of the variable resistive element while voltage pulses are being applied, thus causing transitions in both directions between the high resistance state and the low resistance state and leading to unstable condition (oscillation condition). However, since voltage is applied like pulses, and at the end of the voltage application duration, there will be the voltage applied condition in which the absolute value of the applied voltage (voltage amplitude of the voltage pulses) is equal to or higher than the threshold voltage $VA^+$ and lower than the threshold voltage $VB^+$, the resistive characteristics of the variable resistive element will finally converge to the low resistance state.

In contrast, threshold voltage $VB^-$ for transition from the low resistance state (characteristic B) to the high resistance state (characteristic A) as a result of application of voltage to a serial circuit on the side of other polarity (negative polarity) is lower in absolute value than threshold voltage $VA^-$ for transition from the high resistance state to the low resistance state on the side of same polarity (negative polarity), wherein voltage equal to or higher than threshold voltage $Vb^-$ is applied between both terminals of the variable resistive element when voltage of which an absolute value is equal to or higher than the threshold voltage $VB^-$ is applied to both ends of the serial circuit, thus causing a transition from the low resistance state to the high resistance state. If the load resistive characteristic C2 of the load circuit is properly set also on the side of negative polarity, the absolute value of voltage applied to the variable resistive element after transition to the high resistance state is lower than the threshold voltage Va⁻ for having the resistive characteristic transit from the high resistance state to the low resistance state, thus implementing transitions from the low resistance state to the high resistance state in a stable manner. However, even if voltage of the same polarity (negative polarity) the absolute value of which is equal to or higher than the threshold voltage VA⁻ is applied to the serial circuit including the load circuit of the same load resistive characteristic C2, no transition from the high resistance state to the low resistance state occurs because voltage no less than the threshold voltage Va that is higher than the threshold voltage Vb⁻ is applied between both terminals of the variable resistive element. In fact, if negative voltage pulses the absolute value of which is equal to or higher than the threshold voltage VA⁻ are applied to both ends of the serial circuit, voltage equal to or higher than the threshold voltages Va⁻ and Vb⁻ is applied between both terminals of the variable resistive element while voltage pulses are being applied, thus causing transitions in both directions between the high resistance state and the low resistance state and leading to unstable condition (oscillation condition). However, since voltage is applied like pulses, and at the end of the voltage application duration, there will be the voltage applied condition in which the absolute value of the applied voltage (voltage amplitude of the voltage pulses) is equal to or higher than the threshold voltage VB⁻ and lower than the threshold voltage VA⁻, the resistive characteristics of the variable resistive element will finally converge to the high resistance state.

Therefore, according to the present invention, even though the two resistive characteristics A, B of the variable resistive element are symmetrical on the side of positive polarity and of negative polarity, by switching the load resistive characteristics C1, C2 of the load circuit according to the polarity of applied voltage (i.e., switching direction), a transition from the high resistance state to the low resistance state can be stably implemented through voltage application on the side of positive polarity and the load resistive characteristic C1, while a transition from the low resistance state to the high resistance state can be stably implemented through voltage application on the side of negative polarity and the load resistive characteristic C2.

The point to be noted here is as follows: for a variable resistive element alone, irrespective of the load resistive characteristics and the polarities of applied voltage, the threshold voltage Vb⁺ (=Vb⁻) for transition from the low resistance state to the high resistance state is lower in absolute value than the threshold voltage Va⁺ (=Va⁻) for transition from the high resistance state to the low resistance state. Nevertheless, by properly setting the load resistive characteristics C1, C2 and switching them in accordance with the polarities of applied voltage (switching direction), as threshold voltage of voltage to be applied to the serial circuit, it is possible to set the threshold voltage VA⁺ lower in absolute value than the threshold voltage VB⁺ on the side of positive polarity, and the threshold voltage VB⁻ lower in absolute value than the threshold voltage VA⁻ on the side of negative polarity. Consequently, the magnitude relation of the threshold voltages VA⁺ and VB⁺ and of the threshold voltages VB⁻ and VA⁻ can be reversed, thus enabling stable bipolar switching operations irrespective of whether the variable resistive element has a symmetrical or a asymmetrical structure by applying voltage of both positive and negative polarities.

The nonvolatile semiconductor memory device having the first characteristic described above shall further have a second characteristic that it is such configured that a memory state of the variable resistive element can be switched between the two resistance states by applying voltage of same polarity to one terminal based on the other terminal, and each of the two load resistive characteristics of the load circuit selectively occurs when voltage having same polarity is applied to the load circuit.

The nonvolatile semiconductor memory device having the above second characteristic shall further have a third characteristic in which under a first load resistive characteristic which is one of the two load resistive characteristics when the resistive characteristic of the variable resistive element transits from the low resistance state to the high resistance state, an absolute value of applied voltage between both terminals of the variable resistive element will be the first threshold voltage by resistive voltage division of the variable resistive element and the load circuit when first critical voltage is applied to both ends of the serial circuit of the variable resistive element of which the resistive characteristic is in the low resistance state and the load circuit, and will be second device voltage that is lower than the second threshold voltage after the resistive characteristic of the variable resistive element transits to the high resistance state, and under a second load resistive characteristic which is the other of the two load resistive characteristics when the resistive characteristic of the variable resistive element transits from the high resistance state to the low resistance state, an absolute value of the applied voltage between both terminals of the variable resistive element will be the second threshold voltage by resistive voltage division of the variable resistive element and the load circuit when second critical voltage having same polarity as the first critical voltage is applied to both ends of the serial circuit of the variable resistive element of which the resistive characteristic is in the high resistance state and the load circuit, and will be first device voltage that is lower than the first threshold voltage after the resistive characteristic of the variable resistive element transits to the low resistance state.

The nonvolatile semiconductor memory device having the above third characteristic shall further have a fourth characteristic that the first threshold voltage is lower than the second threshold voltage, and a first resistance value representing the first load resistive characteristic which is equal to a difference between the second device voltage and the first threshold voltage divided by a difference between a first device current and a second device current is less than a critical resistance value, and a second resistance value representing the second load resistive characteristic which is equal to a difference between the second threshold voltage and the first device voltage divided by a difference between a first device current and a second threshold current is more than a critical resistance value, wherein the first threshold current is an absolute value of current when voltage between both terminals when the resistive characteristic of the variable resistive element is in the low resistance state is the first threshold voltage, the first device current is an absolute value of current at the first device voltage, the second threshold current is an absolute value of current when voltage between both terminals when the resistive characteristic of the variable resistive element is in the high resistance state is the second threshold voltage, the second device current is an absolute value of current at the second device voltage, and the critical resistance value is a resistance value equal to a difference between the second threshold voltage and the first threshold voltage divided by a difference between the first threshold current and the second threshold current.

The nonvolatile semiconductor memory device having the above third or fourth characteristics shall further have a fifth characteristic that an absolute value of voltage amplitude of a first voltage pulse to be applied to both ends of the serial circuit of the variable resistive element of which the resistive characteristic is in the low resistance state and the load circuit is set higher than an absolute value of the first critical voltage when the resistive characteristic of the variable resistive element transits from the low resistance state to the high resistance state, and an absolute value of voltage amplitude of a second voltage pulse to be applied to both ends of the serial circuit of the variable resistive element of which the resistive characteristic is in the high resistance state and the load circuit is set higher than an absolute value of the second critical voltage when the resistive characteristic of the variable resistive element transits from the high resistance state to the low resistance state, wherein the first voltage pulse and the second voltage pulse have same polarity.

The nonvolatile semiconductor memory device having the above fifth characteristic shall further have a sixth characteristic that an absolute values of voltage amplitude is same between the first voltage pulse and the second voltage pulse.

The nonvolatile semiconductor memory device having the above fifth or sixth characteristics shall further have a seventh characteristic that pulse width of the first voltage pulse and that of the second voltage pulse are both 100 ns or less.

The nonvolatile semiconductor memory device having any of the fifth to seventh characteristics shall further have an eighth characteristic that pulse width of the first voltage pulse and that of the second voltage pulse have same length.

The nonvolatile semiconductor memory device having any of the second to eighth characteristics shall further have a ninth characteristic that the nonvolatile semiconductor memory device comprises the variable resistive element in which a resistive characteristic to be specified by current-voltage characteristics between both terminals of the variable resistive element can transit between the two resistive characteristics of low resistance state and high resistance state even when application of voltage to one terminal based on the other terminal is conducted at either positive or negative polarity, to voltage application at one polarity, first threshold voltage that is the lower limit of the absolute value of the applied voltage necessary for the resistive characteristic to transit from the low resistance state to the high resistance state differs from second threshold voltage that is the lower limit of the absolute value of the applied voltage necessary for the resistive characteristic to transit from the high resistance state to the low resistance state, also to voltage application at the other polarity, third threshold voltage that is the lower limit of the absolute value of the applied voltage necessary for the resistive characteristic to transit from the low resistance state to the high resistance state differs from fourth threshold voltage that is the lower limit of an absolute value of the applied voltage necessary for the resistive characteristic to transit from the high resistance state to the low resistance state, and the polarity of voltages having the same polarity to be applied to the load circuit is either one or the other polarity corresponding to lower voltage as a result of comparing higher voltage of the first threshold voltage and the second threshold voltage with higher voltage of the third threshold voltage and the fourth threshold voltage.

The nonvolatile semiconductor memory device having any of the first to ninth characteristics shall further have a tenth characteristic that the load circuit is configured so that the two load resistive characteristics can be switched on a current pathway which is commonly used when the resistive characteristic of the variable resistive element transits from the low resistance state to the high resistance state and when it transits from the high resistance state to the low resistance state, and a transistor element whose load resistive characteristic can be switched by voltage control or current control is provided on the current pathway which is commonly used.

The nonvolatile semiconductor memory device having any of the first to ninth characteristics shall further have an eleventh characteristic that the load circuit is configured so that the two load resistive characteristics can be switched by switching at least a part of a circuit which activates when the resistive characteristic of the variable resistive element transits from the low resistance state to the high resistance state and at least a part of a circuit which activates when the resistive characteristic of the variable resistive element transits from the high resistance state to the low resistance state.

According to the nonvolatile semiconductor memory device having any of the second to eleventh characteristics, the nonvolatile semiconductor memory device capable of stable unipolar switching operations that can produce the effect of the first characteristic described above can be embodied in concrete form.

In particular, according to the nonvolatile semiconductor memory device having the above ninth characteristic, voltage pulses to be applied during writing can be reduced, thereby facilitating low power consumption during writing. In fact, it has now become possible to use a variable resistive element having the asymmetrical structure, which was available as a variable resistive element capable of bipolar switching operations in the past, for unipolar switching operations at low voltage.

The nonvolatile semiconductor memory device having the above first characteristics shall further have a twelfth characteristic that the nonvolatile semiconductor memory device comprises the variable resistive element in which a resistive characteristic to be specified by current-voltage characteristics between both terminals of the variable resistive element can transit between the two resistive characteristics of low resistance state and high resistance state even when application of voltage to one terminal based on the other terminal is conducted at either positive or negative polarity, to voltage application at one polarity, first threshold voltage that is the lower limit of the absolute value of the applied voltage necessary for the resistive characteristics to transit from the low resistance state to the high resistance state differs from second threshold voltage that is the lower limit of the absolute value of the applied voltage necessary for the resistive characteristic to transit from the high resistance state to the low resistance state, also to voltage application at the other polarity, third threshold voltage that is the lower limit of the absolute value of the applied voltage necessary for the resistive characteristic to transit from the low resistance state to the high resistance state differs from fourth threshold voltage that is the lower limit of the absolute value of the applied voltage necessary for the resistive characteristic to transit from the high resistance state to the low resistance state, and a memory state of the variable resistive element can be written by voltage application at both positive and negative polarities to one terminal based on the other terminal of the variable resistive element, and one of the two load resistive characteristics of the load circuit occurs when voltage of one polarity is applied to the load circuit, and the other of the two load resistive characteristics of the load circuit occurs when voltage of the other polarity is applied to the load circuit.

The nonvolatile semiconductor memory device having the above twelfth characteristic shall further have a thirteenth characteristic in which under a first load resistive characteristic which is one of the two load resistive characteristics when the resistive characteristic of the variable resistive element transits from the low resistance state to the high resistance state, an absolute value of applied voltage between both terminals of the variable resistive element will be the first threshold voltage by resistive voltage division of the variable resistive element and the load circuit when first critical voltage is applied to both ends of the serial circuit of the variable resistive element of which the resistive characteristic is in the low resistance state and the load circuit, and will be second device voltage that is lower than the second threshold voltage after the resistive characteristic of the variable resistive element transits to the high resistance state, and under a third load resistive characteristic which is the other of the two load resistive characteristics when the resistive characteristic of the variable resistive element transits from the high resistance state to the low resistance state, an absolute value of the applied voltage between both terminals of the variable resistive element will be the fourth threshold voltage by resistive voltage division of the variable resistive element and the load circuit when third critical voltage having opposite polarity to the first critical voltage is applied to both ends of the serial circuit of the variable resistive element of which the resistive characteristic is in the high resistance state and the load circuit, and will be third device voltage that is lower than the third threshold voltage after the resistive characteristic of the variable resistive element transits to the low resistance state.

The nonvolatile semiconductor memory device having the above thirteenth characteristics shall further have a fourteenth characteristic that the first threshold voltage is lower than the second threshold voltage, and the third threshold voltage is lower than the fourth threshold voltage, and a first resistance value representing the first load resistive characteristic which is equal to a difference between the second device voltage and the first threshold voltage divided by a difference between a first threshold current and a second device current is less than a first critical resistance value, and a third resistance value representing the third load resistive characteristic which is equal to a difference between the fourth threshold voltage and the third device voltage divided by a difference between a third device current and a fourth threshold current is more than a second critical resistance value, wherein with the first critical voltage applied, the first threshold current is an absolute value of current when voltage between both terminals when the resistive characteristic of the variable resistive element is in the low resistance state is the first threshold voltage, the second device current is an absolute value of current when voltage between both terminals when the resistive characteristic of the variable resistive element is in the high resistance state is the second device voltage, the second threshold current is an absolute value of current when voltage between both terminals when the resistive characteristic of the variable resistive element is in the high resistance state is the second threshold voltage, with the third critical voltage applied, the fourth threshold current is an absolute value of current when voltage between both terminals when the resistive characteristic of the variable resistive element is in the high resistance state is the fourth threshold voltage, the third device current is an absolute value of current when voltage between both terminals when the resistive characteristic of the variable resistive element is in the low resistance state is the third device voltage, the third threshold current is an absolute value of current when voltage between both terminals when the resistive characteristic of the variable resistive element is in the low resistance state is the third threshold voltage, the first critical resistance value is a resistance value equal to a difference between the second threshold voltage and the first threshold voltage divided by a difference between the first threshold current and the second threshold current, and the second critical resistance value is a resistance value equal to a difference between the fourth threshold voltage and the third threshold voltage divided by a difference between the third threshold current and the fourth threshold current.

The nonvolatile semiconductor memory device having the above thirteenth or fourteenth characteristics shall further have a fifteenth characteristic that an absolute value of voltage amplitude of the first voltage pulse to be applied to both ends of the serial circuit of the variable resistive element of which the resistive characteristic is in the low resistance state and the load circuit is set higher than an absolute value of the first critical voltage when the resistive characteristic of the variable resistive element transits from the low resistance state to the high resistance state, wherein an absolute value of the voltage amplitude of the third voltage pulse to be applied to both ends of the serial circuit of the variable resistive element of which the resistive characteristic is in the high resistance state and the load circuit is set higher than an absolute value of the third critical voltage when the resistive characteristic of the variable resistive element transits from the high resistance state to the low resistance state, and wherein the first voltage pulse and the third voltage pulse have a polarity opposite to each other.

The nonvolatile semiconductor memory device having the above fifteenth characteristics shall further have a sixteenth characteristic that an absolute value of voltage amplitude is same between the first voltage pulse and the third voltage pulse.

The nonvolatile semiconductor memory device having the above fifteenth or sixteenth characteristics shall further have a seventeenth characteristic that pulse width of the first voltage pulse and that of the third voltage pulse have same length.

The nonvolatile semiconductor memory device having any of the twelfth to seventeenth characteristics shall further have an eighteenth characteristic that the load circuit is configured so that the two load resistive characteristics can be switched on a current pathway which is commonly used when the resistive characteristic of the variable resistive element transits from the low resistance state to the high resistance state and when it transits from the high resistance state to the low resistance state, and a polarity dependent load resistance circuit whose load resistive characteristic can be switched depending on polarity of voltage to be applied is provided on the current pathway to be commonly used.

The nonvolatile semiconductor memory device having the above eighteenth characteristics shall further have an nineteenth characteristic that the polarity dependent load resistance circuit comprises a polarity dependent load resistive element whose load resistive characteristic can be switched depending on polarity of voltage to be applied.

The nonvolatile semiconductor memory device having any of the twelfth to seventeenth characteristics shall further have a twentieth characteristic that the load circuit is configured so that the two load resistive characteristics can be switched on a current pathway which is commonly used when the resistive characteristic of the variable resistive element transits from the low resistance state to the high resistance state and when it transits from the high resistance state to the low resistance state, and a transistor element whose load resistive characteristic can be switched by voltage control or current control is provided on the current pathway to be commonly used.

The nonvolatile semiconductor memory device having any of the twelfth to seventeenth characteristics shall further have a twenty first characteristic that the load circuit is configured so that the two load resistive characteristics can be switched by switching at least a part of a circuit which activates when the resistive characteristic of the variable resistive element transits from the low resistance state to the high resistance state and at least a part of a circuit which activates when the resistive characteristic of the variable resistive element transits from the high resistance state to the low resistance state.

According to the nonvolatile semiconductor memory device having any of the twelfth to twenty first characteristics, the nonvolatile semiconductor memory device capable of stable bipolar switching operations that can produce the effect of the first characteristic described above can be embodied in concrete form.

In particular, according to the nonvolatile semiconductor memory device having the above sixteenth or seventeenth characteristic, voltage pulses of both positive and negative polarities can be commonly used, thus allowing the circuit configuration to be simplified.

The nonvolatile semiconductor memory device having any of the first to the twenty-first characteristics shall further have a twenty-second characteristic of comprising a memory cell comprised of the variable resistive elements, a memory cell array including a plurality of the memory cells arranged in a row direction and in a column direction, a plurality of word lines extending in the row direction and a plurality of bit lines extending in the column direction, wherein the memory cells in a same row are connected at one end of the memory cells to the word line in common and the memory cells in a same column are connected at the other end of the memory cells to the bit lines in common, a word line selection circuit for selecting a predetermined number of the word lines as a selected word line from the plurality of word lines, a bit line selection circuit for selecting a predetermined number of the bit lines as a selected bit line from the plurality of bit lines, and a control circuit for controlling switching of the two different load resistive characteristics of the load circuit.

The nonvolatile semiconductor memory device having the above twenty-second characteristics shall further have a twenty-third characteristic that a load resistance characteristic variable circuit for switching the two different load resistive characteristics of the load circuit is formed external to the memory cell array, and is configured to be able to electrically connect to at least either one side of the selected word line or the selected bit line.

The nonvolatile semiconductor memory device having the above twenty-second or twenty-third characteristic shall further have a twenty-fourth characteristic that the memory cell comprises only the variable resistive element.

The nonvolatile semiconductor memory device having the above twenty-second or twenty-third characteristic shall further have a twenty-fifth characteristic that the memory cell comprises a serial circuit of the variable resistive element and a diode, or a serial circuit of the variable resistive element and a varistor.

According to the nonvolatile semiconductor memory device having above twenty-second to the twenty-fifth characteristics, the nonvolatile semiconductor memory device having a cross-point type memory cell array structure capable of stable switching operations that can produce the first characteristic can be embodied in concrete form.

In particular, according to the nonvolatile semiconductor memory device having the above twenty-third characteristic, since the load circuit is formed external to the memory cell array, with use of the conventional memory array configuration, the nonvolatile semiconductor memory device having the cross-point type memory cell array structure capable of stable switching operations that can produce the effect of the first characteristic can be embodied in concrete form.

The nonvolatile semiconductor memory device having the above nineteenth characteristics shall further have a twenty-sixth characteristic of comprising a memory cell comprised of a serial circuit of the variable resistive element and the polarity dependent load resistive element, a memory cell array including a plurality of the memory cells arranged in a row direction and in a column direction, a plurality of word lines extending in the row direction and a plurality of bit lines extending in the column direction, wherein the memory cells in a same row are connected at one end of the memory cells to the word line in common and the memory cells in a same column are connected at the other end of the memory cells to the bit lines in common, a word line selection circuit for selecting a predetermined number of the word lines as a selected word line from the plurality of word lines, a bit line selection circuit for selecting a predetermined number of the bit lines as a selected bit line from the plurality of bit lines, and a control circuit for controlling switching of the two different load resistive characteristics of the load circuit, wherein the control circuit switches the two different load resistive characteristics of the load circuit by switching polarities of the voltage to be applied between the selected word line and the selected bit line.

According to the nonvolatile semiconductor memory device having the above twenty-sixth characteristic, the nonvolatile semiconductor memory device having the cross-point type memory cell array structure capable of stable bipolar switching operations that can produce the effect of the above first characteristic can be embodied in concrete form. Now, since the memory cell contains the polarity dependent load resistive element that is a circuit section of the load circuit in which at least two different load resistive characteristics vary, circuits around the memory cell array can use the conventional circuit configuration.

The nonvolatile semiconductor memory device having the above tenth or twentieth characteristic shall further have a twenty-seventh characteristic of comprising a memory cell comprised of a serial circuit of the variable resistive element and the transistor element that can switch the load resistive characteristics by voltage control or current control, a memory cell array including a plurality of the memory cells are arranged in a row direction and in a column direction, a plurality of word lines extending in the row direction and a plurality of bit lines and one or more source lines extending in the column direction, wherein the memory cells in a same row are connected to the word line in common at a control terminal for switching the load resistive characteristics of the load circuit of the memory cell by voltage control or current control, and the memory cells in a same column are connected at one end of the serial circuit of the memory cells to the bit line in common and are connected at the other end of the serial circuit of the memory cells to the source line in common, a word line selection circuit for selecting a predetermined number of the word lines as a selected word line from the plurality of word lines, a bit line selection circuit for selecting a predetermined number of the bit lines as a selected bit line from the plurality of bit lines, and a control circuit for controlling switching of the two different load resistive characteristics of the load circuit.

The nonvolatile semiconductor memory device having the above twenty-seventh shall have further a twenty-eight characteristic that the control circuit switches the two different load resistive characteristics of the load circuit by controlling voltage or current to be applied to the selected word line.

The nonvolatile semiconductor memory device having the above twenty-seventh or twenty-eighth characteristic shall further have a twenty-ninth characteristic that the transistor element in the memory cells serves as a selection transistor for selecting the memory cell as a target of writing.

According to the nonvolatile semiconductor memory device having any of the twenty-seventh to the twenty-ninth characteristic, the nonvolatile semiconductor memory device having 1T1R type memory cell array structure capable of stable switching operations that can produce the effect of the above first characteristic can be embodied in concrete form. Now, since the memory cell contains the transistor element that is a circuit section of the load circuit in which at least two varying different load resistive characteristics vary, circuits around the memory cell array can use the conventional circuit configuration.

The nonvolatile semiconductor memory device having any of the first to twenty-first characteristic shall further have a thirtieth characteristic of comprising a memory cell comprised of a serial circuit of the variable resistive element and a selection transistor, a memory cell array including a plurality of the memory cells arranged in a row direction and in a column direction, a plurality of word lines extending in the row direction and a plurality of bit lines and one or more source lines extending in the column direction, wherein the memory cells in a same row are connected to the word line in common at a gate terminal of the selection transistor, and the memory cells in a same column are connected at one end of the serial circuit of the memory cells to the bit line in common and are connected at the other end of the serial circuit of the memory cells to the source line in common, a word line selection circuit for selecting a predetermined number of the word lines as a selected word line from the plurality of word lines, a bit line selection circuit for selecting a predetermined number of the bit lines as a selected bit line from the plurality of bit lines, and a control circuit for controlling switching of the two different load resistive characteristics of the load circuit, wherein the load resistive characteristic variable circuit for switching the two different load resistive characteristics of the load circuit is formed external to the memory cell array, and is configured to be able to be electrically connected to the selected bit line or the source line when a memory state of the memory cell is written.

According to the nonvolatile semiconductor memory device having the above thirtieth characteristic, since the load circuit is formed external to the memory cell array, with use of the conventional memory array configuration, the nonvolatile semiconductor memory device having 1T1R type memory cell array structure capable of stable switching operations that can produce the effect of the above first characteristic can be embodied in concrete form.

The nonvolatile semiconductor memory device having any of the above first to the thirtieth characteristics shall further have a thirty-first characteristic that the variable resistive element has a variable resistor sandwiched between a first electrode and a second electrode, and the variable resistor is oxides or oxynitrides including a transition metal.

The nonvolatile semiconductor memory device having the above thirty-first characteristic shall further have a thirty-second characteristic that the variable resistor is oxides or oxynitrides including any element selected from Mn, Fe, Ni, Co., Ti, Cu, and V.

The nonvolatile semiconductor memory device having the above thirty-second characteristic shall further have a thirty-third characteristic that the variable resistor is a perovskite-type oxide.

The nonvolatile semiconductor memory device having any of the above thirty-first to thirty-third characteristics shall further have a thirty-fourth characteristic that the first electrode and the second electrode are made from same material.

According to the nonvolatile semiconductor memory device having any of the thirty-first to thirty-fourth characteristics, the nonvolatile semiconductor memory device allowing stable switching operations that can produce the effect of the above first characteristic can be provided in concrete form, wherein a variable resistive element having two-terminal structure, and when voltage application to one terminal based on the other terminal takes place with at least one of positive or negative polarities, the resistive characteristics to be specified by current-voltage characteristics between the two terminals can transit between the two resistive characteristics of low resistance state and high resistance state that can be taken stably, and the variable resistive elements having the different first threshold voltage being the lower limit of the absolute value of the applied voltage necessary for the resistive characteristics to transit from the low resistance state to the high resistance state and the second threshold voltage being the lower limit of the absolute value of the applied voltage necessary for the resistive characteristic to transit from the high resistance state to the low resistance state can be implemented in concrete form.

In particular, since a variable resistive element having symmetrical device structure can be used in the nonvolatile semiconductor memory device according to the present invention, a first electrode and a second electrode can be made of same material as with the nonvolatile semiconductor memory device having the above thirty-fourth characteristic, and manufacturing processes can be simplified, consequently enabling cheaper manufacturing cost.

BRIEF DESCRIPTION OF THE DRAWINGS

FIG. 10 is a circuit diagram showing an example of circuit configuration of the load resistance characteristic variable circuit to be used in the first embodiment.

FIG. 18 is a schematic cross sectional view and an equivalent circuit diagram showing one example of configuration of the 1D1R type memory cells in the third embodiment of the nonvolatile semiconductor memory device according to the present invention.

DETAILED DESCRIPTION OF THE INVENTION

In the following, we describe embodiments of a nonvolatile semiconductor memory device (hereinafter abbreviated as a "device of the present invention", as appropriate) with reference to the drawings.

First Embodiment

Figure 1:
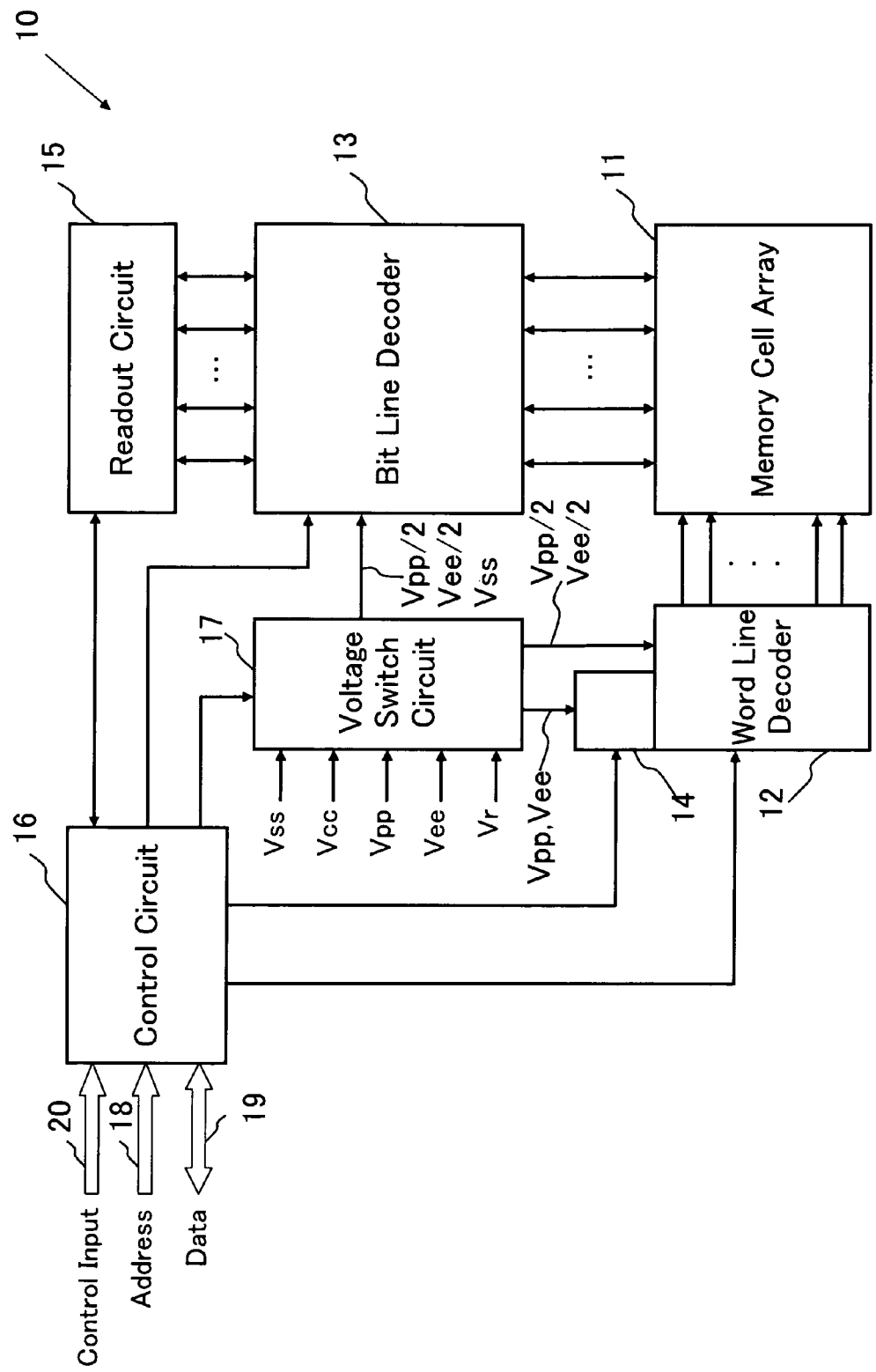
FIG. 1 is a block diagram of a schematic example of circuit configuration in the first embodiment of the nonvolatile semiconductor memory device according to the present invention.

FIG. 1 shows a block configuration of a device of the present invention 10 according to one embodiment. As shown in FIG. 1, the device of the present invention 10 comprises a memory cell array 11, a word line decoder (corresponding to a word line selection circuit) 12, a bit line decoder (corresponding to a bit line selection circuit) 13, a load resistance characteristic variable circuit 14, a readout circuit 15, a control circuit 16, and a voltage switch circuit 17.

The memory cell array 11 comprises a plurality of arrays of nonvolatile memory cells arranged in a row direction and in a column direction, respectively, and not only information can be electrically programmed into memory cells to be addressed from the external, but also information stored in the addressed memory cells can be read out. More specifically, information is stored in specific memory cells in the memory cell array 11 that correspond to an address signal entered from an address line 18, and the information is outputted to an external device through a data line 19.

Connecting to respective word lines of the memory cell array 11, the word line decoder 12 selects, as a selected word line, a word line of the memory cell array 11 that corresponds to an address signal entered in the address line 18 for row selection, and individually applies to the selected word line and an unselected word line selected word line voltage and unselected word line voltage for respective memory operations such as programming, erasing, and readout.

Connecting to respective bit lines of the memory cell array 11, the bit line decoder 13 selects, as a selected bit line, a bit line of the memory cell array 11 that corresponds to an address signal entered in the address line 18 for column selection, and individually applies to the selected bit line and an unselected bit line selected bit line voltage and unselected bit line voltage for respective memory operations such as programming, erasing, and readout.

Controlled by a control circuit 16, the load resistive characteristic variable circuit 14 switches between two different load resistive characteristics (low resistance state and high resistance state) the load resistive characteristics specified by the current-voltage characteristics of a load circuit that electrically connects to a selected memory cell in series that was selected from the memory cell array 11 as a target of writing by the word line decoder 12 and bit line decoder 13 in programming or erasing operation. In this embodiment, the load resistive characteristic variable circuit 14 is provided between the word line decoder 12 and a voltage switch circuit 17.

The control circuit 16 controls the respective memory operations of programming, erasing and read out of the memory cell array 11. Based on an address signal entered from the address line 18, data entry made from the data line 19 (in programming operation), and a control input signal entered from a control signal line 20, the control circuit 16 controls the word line decoder 12 and bit line decoder 13 to control readout, programming and erasing operations. Specifically, in each memory operation, the control circuit executes control for applying to each of the selected word line, unselected word line, selected bit line and unselected bit line, predetermined voltage corresponding to the respective memory operations, on the voltage switch circuit 17, the word line decoder 12, bit line decoder 13 or the like. In particular, in programming and erasing operations, it controls voltage amplitude and pulse width of each voltage pulse to be applied to a memory cell to be written through the load circuit. Furthermore, in programming and erasing operations, it executes control for switching the load resistive characteristics of the load circuit on the load resistive characteristic variable circuit 14. In the example shown in FIG. 1, the control circuit 16 is provided with the capability in general as an address buffer circuit, a data input/output buffer circuit, a control input buffer circuit (not shown). In addition, programming and erasing mean a transition (switching) between the two resistive characteristics (low resistance state and high resistance state) of a variable resistive element comprising memory cells, to be discussed later, and a transition from one resistive characteristic to the other is defined as programming and a transition in the reverse direction is defined as erasing.

The voltage switch circuit 17 provides the word line decoder 12 and the bit line decoder 13 with selected word line voltage, unselected word line voltage, selected bit line voltage and unselected bit line voltage necessary for readout, programming and erasing operations of the memory cell array 11. Vcc represents service voltage (supply voltage), Vss represents ground voltage, Vpp represents voltage for programming, Vee represents voltage for erasing, and Vr represents voltage for readout. In this embodiment, selected word line voltage in programming and erasing operations is supplied to the word line decoder 12 through the load resistive characteristic variable circuit 14.

Data readout is performed from the memory cell array 11 through the bit line decoder 13 and a readout circuit 15. The readout decoder 15 judges status of data, sends result thereof to the control circuit 16, and outputs it to the data line 19.

Figure 2:
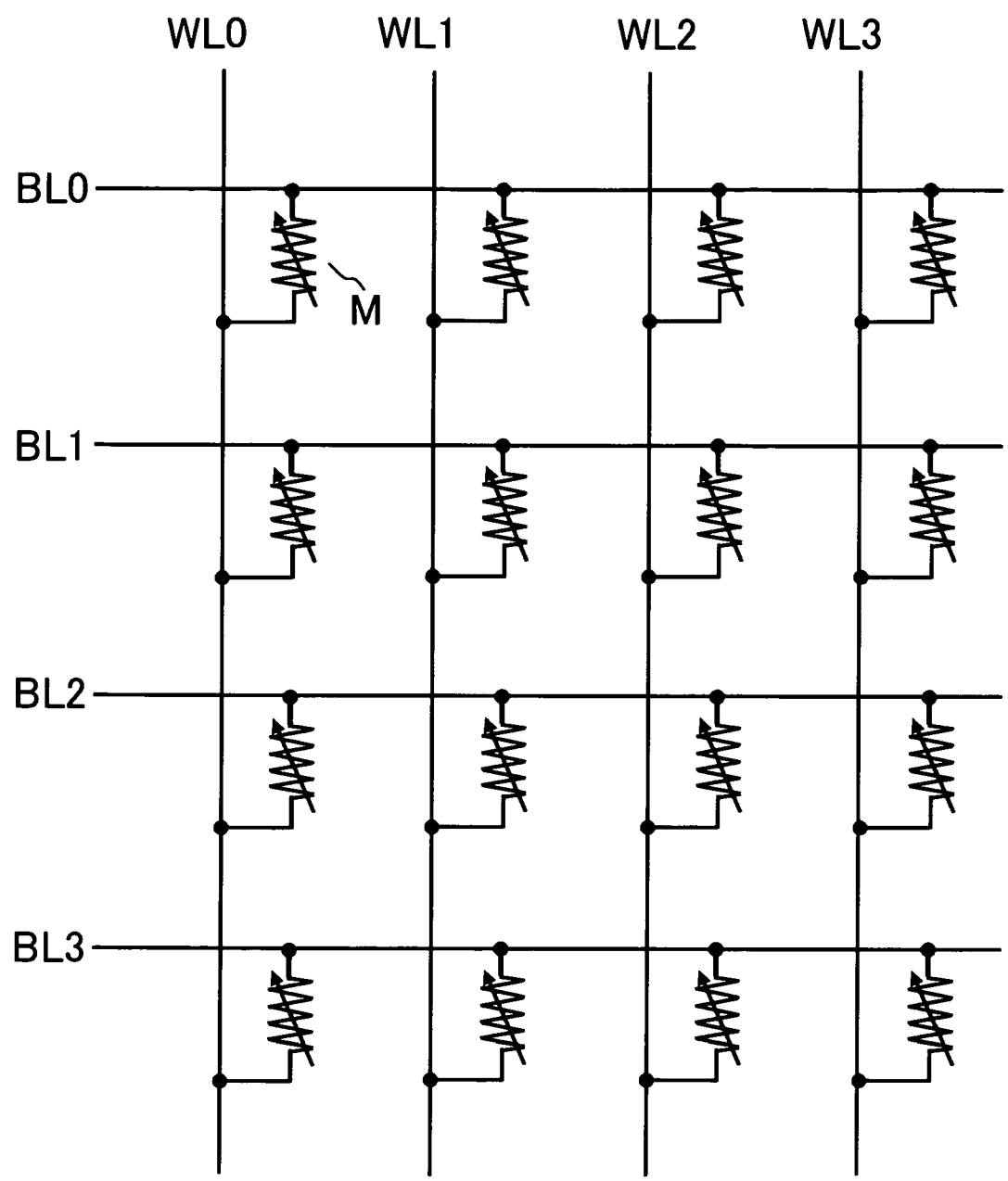
FIG. 2 is a circuit diagram showing partial configuration of a cross-point memory cell array.

FIG. 2 schematically shows partial configuration of the cross-point type memory cell array 11. In FIG. 2, in the memory cell array 11, memory cells M are held at intersections of four bit lines BL0 to BL3 and four word lines WL0 to WL3. As shown in FIG. 2, the memory cell array 11 has the cross-point type memory cell array structure, wherein a plurality of memory cells M of two-terminal structure having variable resistive elements that store information as a result changes in electrical resistance are arranged in a row direction and in a column direction, respectively. It comprises a plurality of word lines extending in the row direction and a plurality of bit lines extending in the column direction, wherein each of the memory cells in the same row has one end of the memory cell connected to a common word line, and each of the memory cells in the same column has the other end of the memory cell connected to a common bit line.

Figure 3:
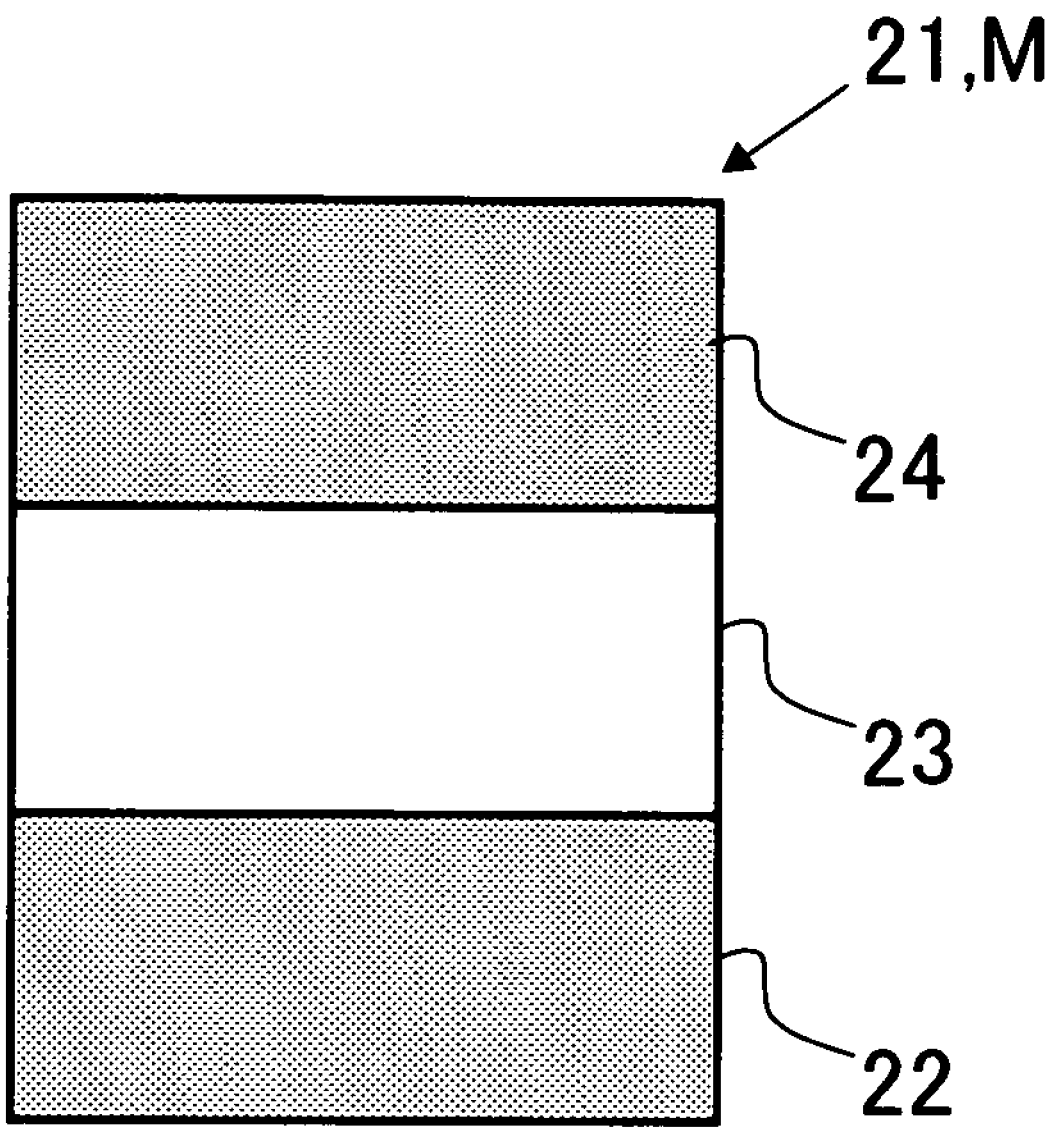
FIG. 3 is a schematic vertical sectional view of memory cells only consisting of variable resistive elements in the cross point memory cell array shown in FIG. 2.

As memory cells in this embodiment, memory cells configured as follows are assumed: when voltage pulses for writing (for programming and for erasing) are applied between two terminals of the variable resistive element having two-terminal structure, resistive characteristics specified by current-voltage characteristics of the variable resistive element change, i.e., electrical resistance changes under certain bias conditions, which thus enables programming of information. As shown in FIG. 3, the memory cell M is only composed of the variable resistive element 21 of three-layer structure comprising a lower electrode 22, a variable resistor 23, and an upper electrode 24. In this embodiment, the lower electrode 22 and the upper electrode 24 are made of same metallic material, such as platinum (Pt), and the variable resistor 23 is fabricated by oxides or oxynitrides including a transition metal such as $Fe_2O_3$ or the like. Either one of the lower electrode 22 or the upper electrode 24 is connected to the word line, while the other is connected to the bit line. As an example, the configuration is possible in which the lower electrode 22 extends in the column direction and forms the bit line and the upper electrode 24 extends in the row direction and forms the word line. Otherwise, wiring of the word lines, bit lines or the like and the electrodes of the lower electrode 22 and the upper electrode 24 may be formed of different materials. In addition, the variable resistive element 21 may be fabricated on a predetermined substrate of semiconductor or insulator by existing thin-film forming methods such as sputtering or the like, and photolithography technology or etching technology. Details of fabrication methods are omitted herein.

Figure 4:
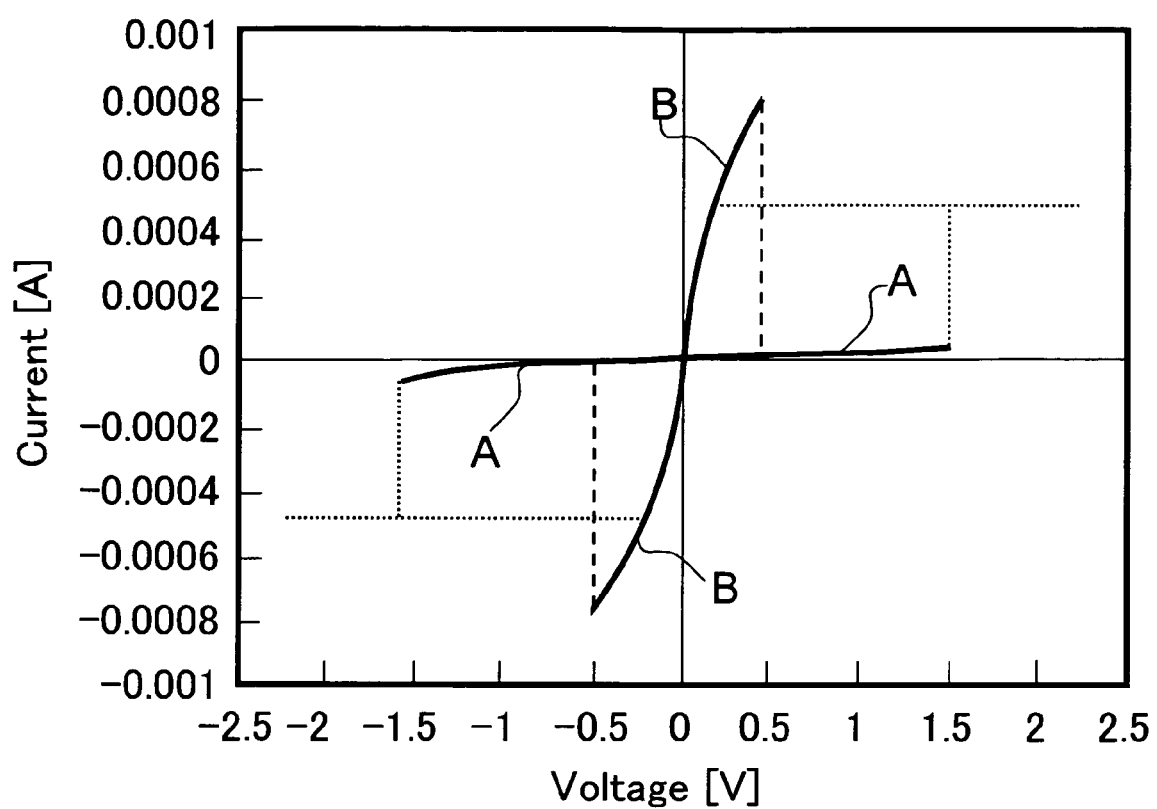
FIG. 4 is a volt-ampere curve showing resistive characteristics of the structure shown in FIG. 3.

The variable resistive element having the structure as shown in FIG. 3 has two resistive characteristics of high resistance state (characteristic A) and low resistance state (characteristic B), for instance, as shown in FIG. 4. The resistive characteristic of the variable resistive element can transit in both directions by applying voltage of same polarity between the two resistive characteristics. As the device structure of the variable resistive element is up-down symmetrical, the two resistive characteristics A, B are symmetrical to polarities of the applied voltage. Now, plus and minus of the voltage polarities may be specified by plus and minus polarities of voltage to be applied to the upper electrode 24 relative to the lower electrode 22.

Figure 25:
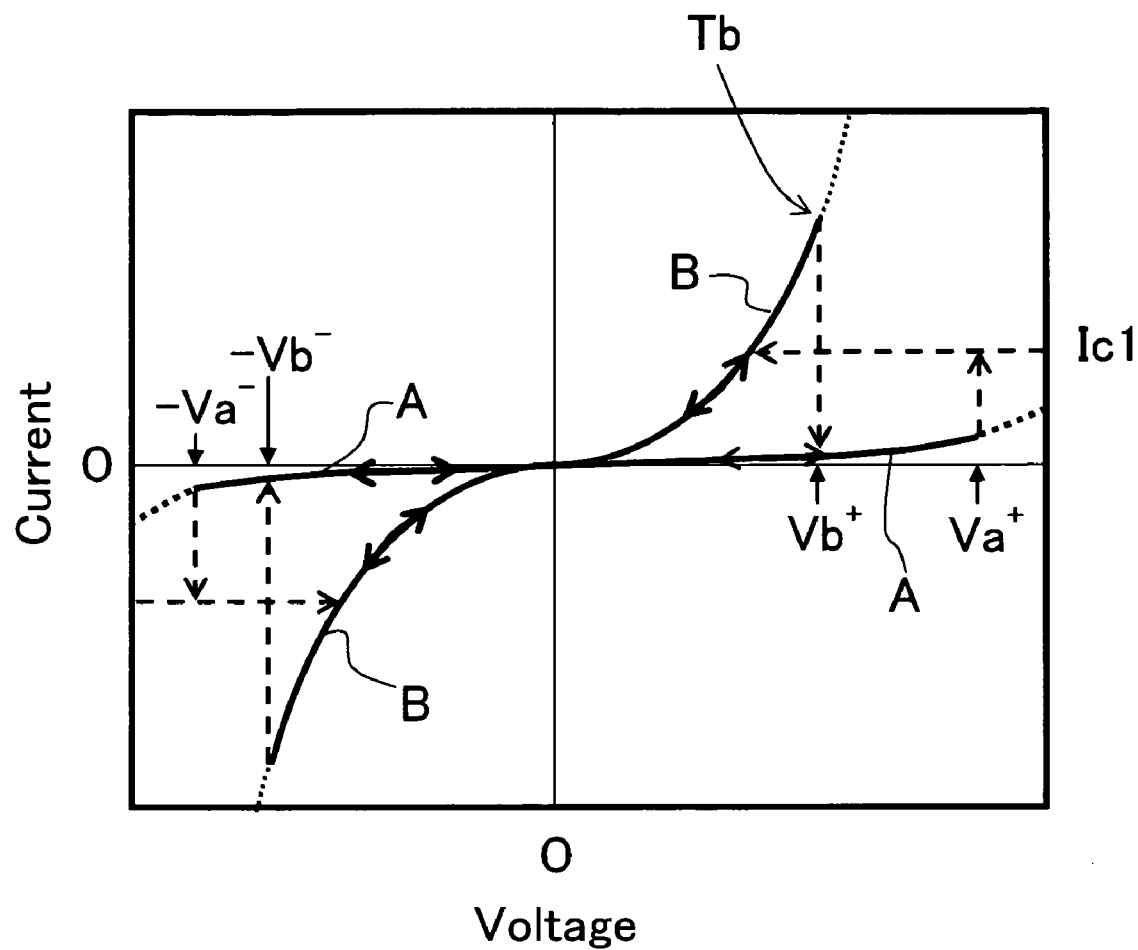
FIG. 25 is a volt-ampere curve showing the resistive characteristics of the conventional variable resistive element capable of bipolar switching operations measured without going through the load resistance.
Figure 26:
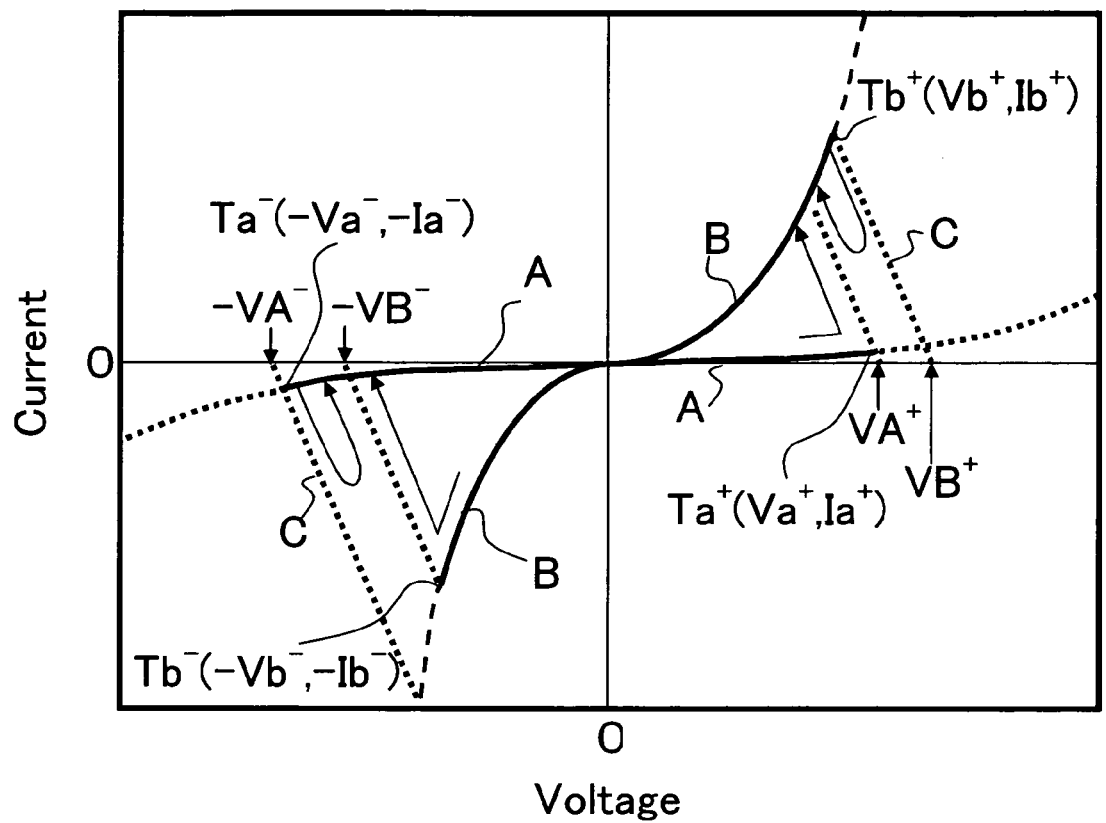
FIG. 26 is a volt-ampere curve showing the resistive characteristics of the conventional variable resistive element capable of bipolar switching operations measured through the load resistance.
Figure 27A:
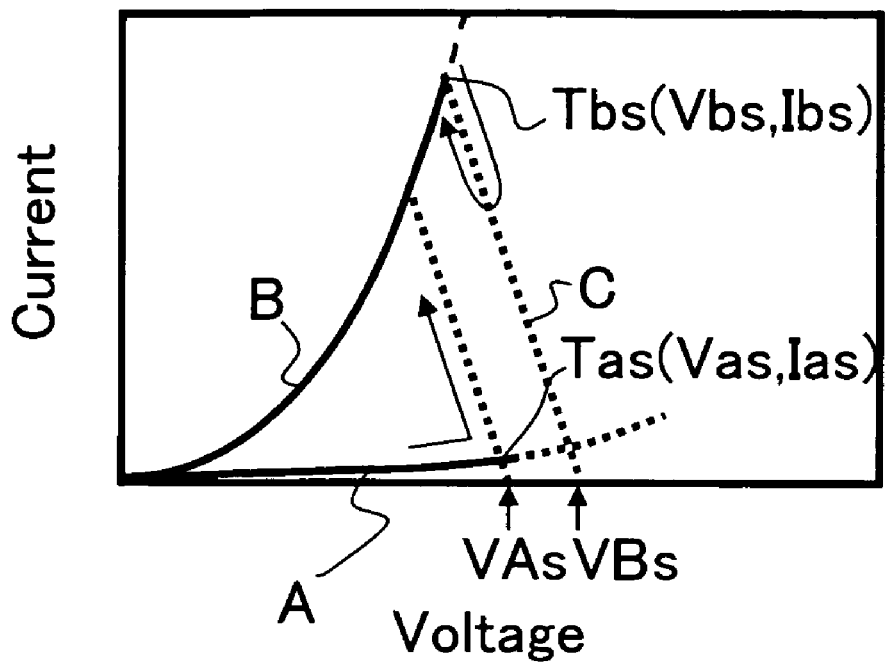
FIG. 27 are two types of volt-ampere curves showing the resistive characteristics of the conventional variable resistive element capable of unipolar switching operations measured through the load resistance.
Figure 27B:
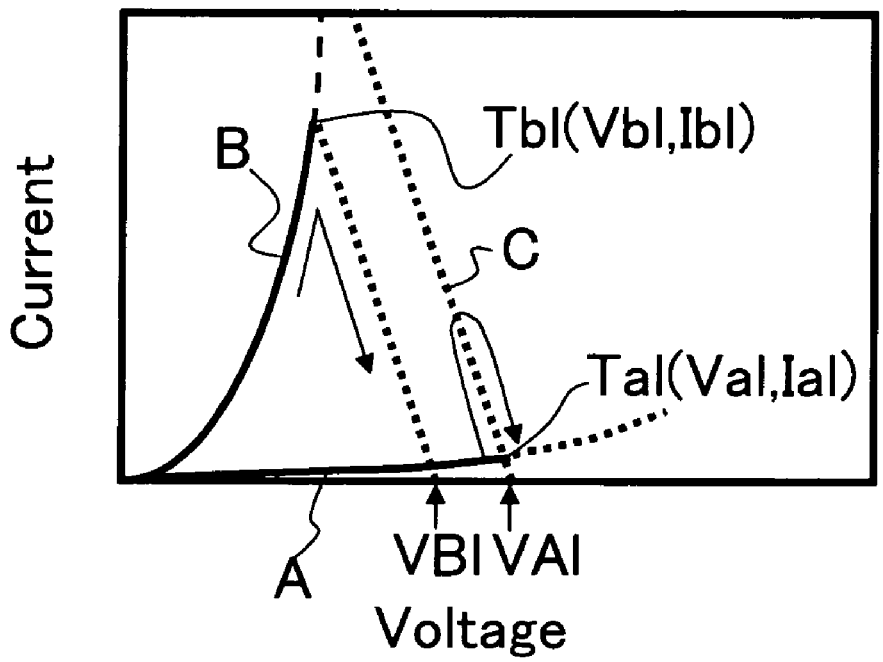
Figure 28A:
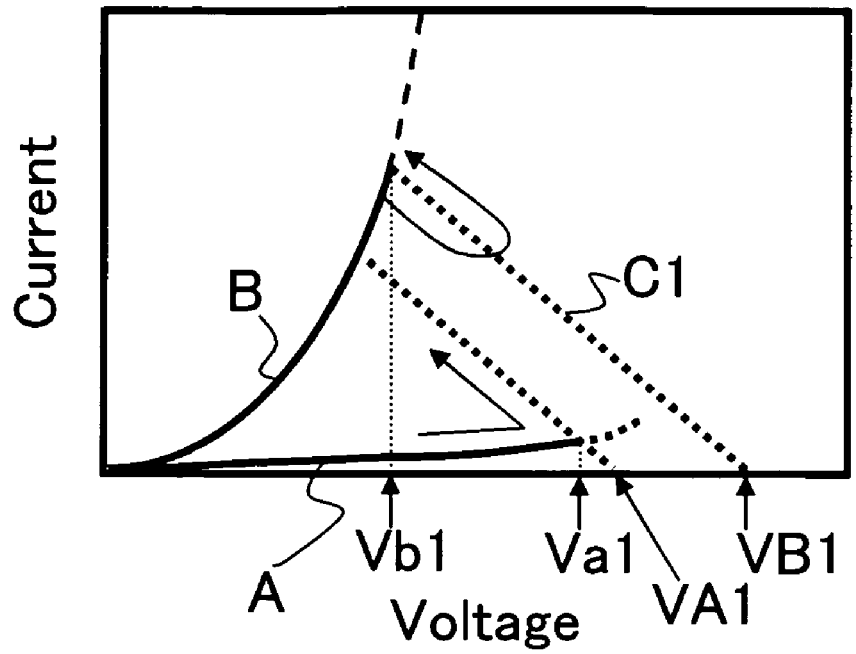
FIG. 28 are two types of volt-ampere curves showing the resistive characteristics of the variable resistive element capable of unipolar switching operations based on the present invention measured through the load resistance.
Figure 28B:
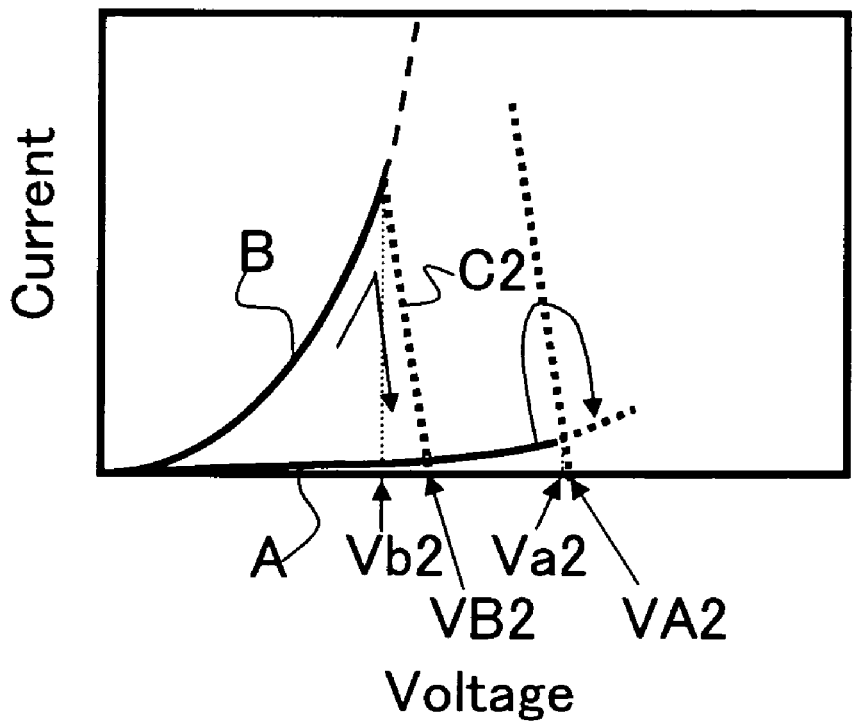
Figure 29:
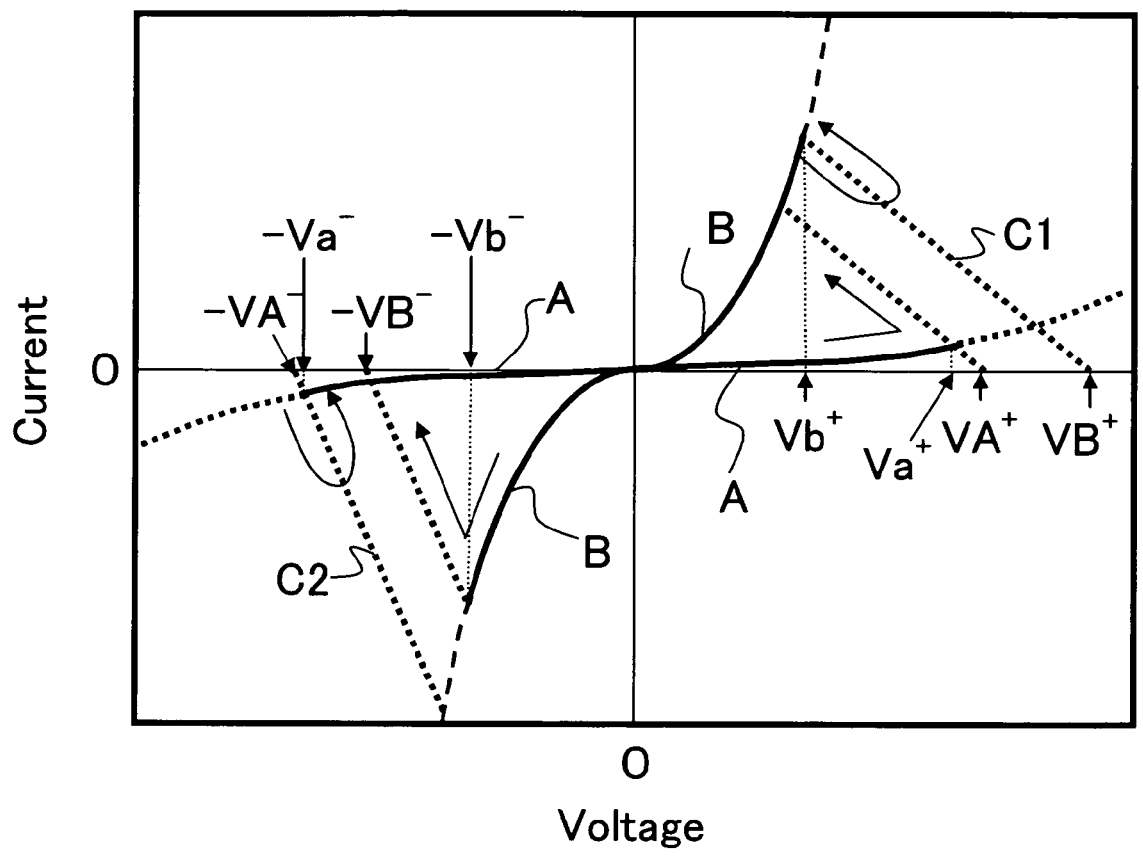
FIG. 29 is a volt-ampere curve showing the resistive characteristics of the variable resistive element capable of bipolar switching operations based on the present invention measured through the load resistance.

Similar to the resistive characteristics shown in FIG. 25, the resistive characteristics shown in FIG. 4 were measured in the following four steps by using a commercially available measuring apparatus (e.g., a parameter analyzer made by Agilent Technologies with the model number 4156B) that can set the upper limit (compliance) of current.

(1) Voltage sweep: 0V→+2.5V→0V, current compliance=+0.5 mA
(2) Voltage sweep: 0V→+1.0V→0V, current compliance=+5.0 mA
(3) Voltage sweep: 0V→−2.5V→0V, current compliance=−0.5 mA
(4) Voltage sweep: 0V→−1.0V→0V, current compliance=−5.0 mA Step (1) measures the high resistance state (characteristic A) on the side of positive polarity, and a transition from the high resistance state (characteristic A) to the low resistance state (characteristic B) on the side of positive polarity. Step (2) measures the low resistance state (characteristic B) on the side of positive polarity, and a transition from the low resistance state (characteristic B) to the high resistance state (characteristic A) on the side of positive polarity. Step (3) measures the high resistance state (characteristic A) on the side of negative polarity, and a transition from the high resistance state (characteristic A) to low resistance sate (characteristic B) on the side of negative polarity. Step (4) measures the low resistance state (characteristic B) on the side of negative polarity and a transition from the low resistance state (characteristic B) to the high resistance state (characteristic A) on the side of negative polarity. In addition, it is assumed that a voltage step during voltage sweep is 20 mV and interval of respective voltage steps is about 3 seconds.

The variable resistive element was initially in the high resistance state (characteristic A) of approximately 20 kΩ. In Step (1), when applied voltage reached the second threshold voltage (1.5V), a transition from the high resistance state to the low resistance state occurred and the amount of current flowing through the variable resistive element rapidly increased. While the amount of current reached the set compliance value (0.5 mA), applied voltage dropped to 0.22V, and then reached 0V along I-V curve of the low resistance state (characteristic B) of about 650Ω. Then, in step (2), voltage was applied. Although the variable resistive element was initially in the low resistance state, a transition from the low resistance state to the high resistance state occurred when the voltage reached the first threshold voltage (about 0.5V) and it returned to the I-V curve of the high resistance state (characteristic A). Furthermore, in Steps (3) and (4) occurred the phenomenon almost same as the case in which plus and minus of voltage and current values of Steps (1) and (2) were reversed. In fact, in Step (3), when applied voltage reached −1.5V (the absolute value was the fourth threshold voltage), a transition from the high resistance state to the low resistance state occurred, and the absolute value of the amount of current flowing through the variable resistive element rapidly increased. While the amount of current reached the set compliance value (−0.5 mA), the absolute value of applied voltage dropped to 0.22V, then reached 0V along the I-V curve of the low resistance state (characteristic B) of about 650Ω. Then, in Step (4), voltage was applied. Although the variable resistive element was initially in the low resistance state, a transition from the low resistance state to the high resistance state occurred when the voltage reached −1.5V (the absolute voltage was the third threshold voltage), and it returned to the I-V curve of the high resistance state (characteristic A).

Figure 5:
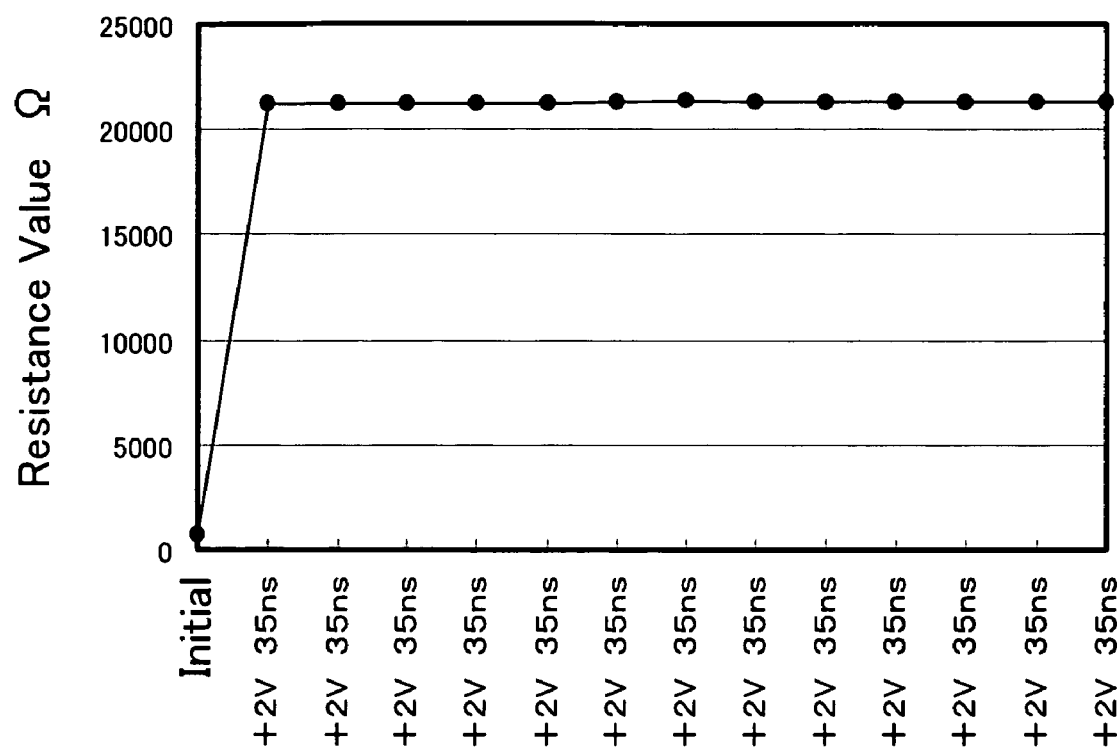
FIG. 5 is a view showing variations in resistance values when an experiment of unipolar switching operations was conducted on the variable resistive element to be used in the first embodiment, without going through load resistance.

With the following steps, voltage pulses were applied to this variable resistive element, without going through load resistance, and resistance values were measured every time voltage pulse was applied. FIG. 5 shows variations in the measured resistance values. The resistance values were read out by means of the parameter analyzer. A value obtained by dividing readout current at +0.3V with a voltage value is considered a resistance value. As shown in FIG. 5, voltage pulses having voltage amplitude of +2V and pulse width of 35 ns were applied to the variable resistive element that was initially in the low resistance state of 680Ω. Then, the resistance value increased and the variable resistive element transited to the high resistance state. Although voltage pulses having the same voltage amplitude of +2V and pulse width of 35 ns were further applied, the resistance value little changed and remained in the high resistance state, which prevented continuous switching operations (bidirectional transitions between the low resistance state and the high resistance state). This means that the variable resistive element cannot perform unipolar switching operations unless pulse width is changed between programming and erasing as with the conventional unipolar switching operations.

In the following, referring to FIG. 6, we describe the principle of operation whereby stable unipolar switching operations at same short pulse width of 100 ns or shorter (e.g., 35 ns) in programming and erasing can be performed on the variable resistive element having the up-down symmetrical structure as shown in FIG. 3, by using the load circuit that can switch two different load resistive characteristics between programming and erasing, and a method of determining optimal load resistive characteristics. In the device of the present invention, the load circuit connecting in series with the variable resistive element that is a memory cell in writing is assumed to be the word line decoder 12, the bit line decoder 13, the load resistive characteristic variable circuit 14 and a synthetic circuit such as parasitic resistance of signal wiring that connects these circuits. However, for simplicity of the description, as a load circuit, the description assumes stand-alone load resistance having a linear load resistive characteristic.

Figure 6A:
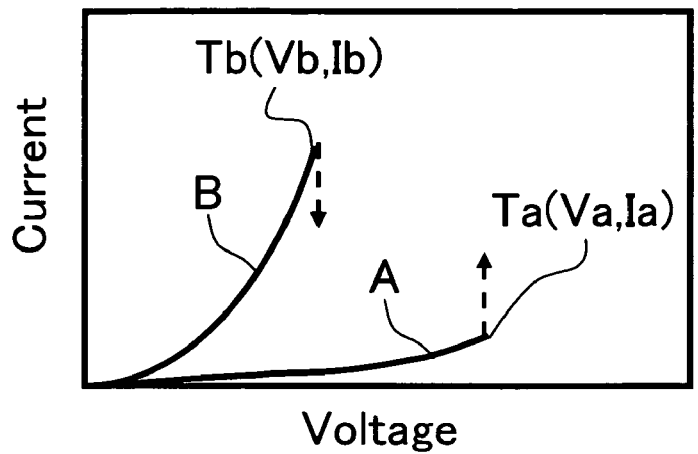
FIG. 6 are two types of volt-ampere curves: one is the volt-ampere curve showing two resistive characteristics in the high resistance state and in the low resistance state when the resistive characteristics of the variable resistive element to be used in the first embodiment was measured without going through load resistance, and the other is the volt-ampere curve showing two resistive characteristics in the high resistance state and in the low resistance state when measurement was taken through load resistance.
Figure 6B:
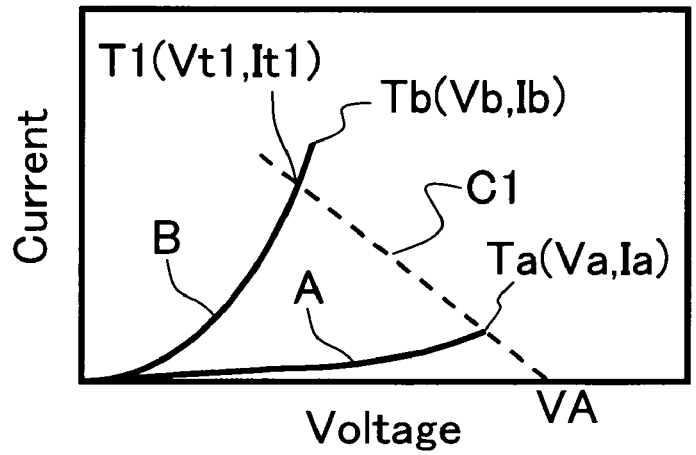

FIG. 6A is the I-V characteristic curve showing two resistive characteristics of high resistance state (characteristic A) and low resistance state (characteristic B) of a variable resistive element when it is measured without going through load resistance. In the high resistance state, a transition from the high resistance state to the low resistance state occurs at a transition point Ta (Va, Ia). In the low resistance state, a transition from the low resistance state to the high resistance state occurs at a transition point Tb (Vb, Ib). Now, voltage Va corresponds to the second threshold voltage, voltage Vb corresponds to the first threshold voltage, current Ia corresponds to the second threshold current, and current Ib corresponds to the first threshold current.

First, we describe a range of a load resistive characteristic desirable for a transition from the high resistance state to the low resistance state, and a range of drive voltage Vda (voltage amplitude of voltage pulses) to be applied to a serial circuit of a load circuit and a variable resistive element (memory cell). If load resistance of resistance value R1 is connected in series to a variable resistive element having the resistive characteristic shown in FIG. 6A, the load resistive characteristic passing through the transition point Ta (Va, Ia) is plotted as a straight line C1 in FIG. 6B. Then, the drive voltage Vda is defined as the second critical voltage VA. In order to perform stable operation from the high resistance state to the low resistance state, it is required that the load resistive characteristic line C1 intersect the I-V characteristic curve in the low resistance state at a point T1 (Vt1, It1) on the low voltage side of the transition point Tb (Vb, Ib) from the low resistance state to the high resistance state. In fact, the load resistance characteristic line C1 going through the transition point Ta in FIG. 6B can be expressed by the Equation (1):

$$V = -R1 \times (I - Ia) + Va \quad (1)$$

Now, in order to satisfy the above requirement, V<Vb should be satisfied when I=Ib. Thus, the Equation (1) and the condition lead to the following Equation (2):

$$(Va - Vb)/(Ib - Ia) < R1 \quad (2)$$

Now, the resistance value in the left term of the Equation (2) corresponds to the critical resistance value. The resistance value R1 corresponds to the first resistance value, and can be expressed by the following Equation (3) by using respective coordinate values of the transition point Ta (Va, Ia) and the intersecting point T1 (Vt1, It1).

$$R1 = (Va - Vt1)/(It1 - Ia) \quad (3)$$

Furthermore, then, the voltage amplitude Vda of voltage pulses that have the variable resistive element transit from the high resistance state to the low resistance state through load resistance should have higher voltage than the second critical voltage VA. In fact, since the value obtained by substituting 0 for I in the Equation (1) showing the load resistive characteristic line C1 is the second critical voltage VA, the voltage amplitude Vda should satisfy the following Equation (4).

$$Vda > Va + R1 \times Ia \quad (4)$$

We continue to describe a range of a load resistive characteristic desirable for a transition from the low resistance state to the high resistance state, and a range of drive voltage Vdb (voltage amplitude of voltage pulses) to be applied to a serial circuit of a load circuit and a variable resistive element (memory cell). If load resistance of resistance value R2 is connected in series to a variable resistive element having the resistive characteristic shown in FIG. 6A, the load resistive characteristic passing through the transition point Tb (Vb, Ib) is plotted as a straight line C2 in FIG. 6C. Then, the drive voltage Vdb is defined as the first critical voltage VB. In order to perform stable operation from the low resistance state to the high resistance state, it is required that the load resistive characteristic line C2 intersect the I-V characteristic curve in the high resistance state at a point T2 (Vt2, It2) on the low voltage side of the transition point Ta (Va, Ia) from the high resistance state to the low resistance state. In fact, the load resistance characteristic line C2 going through the transition point Tb in FIG. 6C can be expressed by the Equation (5):

$$V = -R2 \times (I - Ib) + Vb \quad (5)$$

Now, in order to satisfy the above requirement, V<Va should be satisfied when I=Ia. Thus, the Equation (5) and the condition lead to the following Equation (6):

$$(Va - Vb)/(Ib - Ia) > R2 \quad (6)$$

Now, the resistance value in the left term of the Equation (6) corresponds to the critical resistance value. The resistance value R2 corresponds to the second resistance value, and can be expressed by the following Equation (7) by using respective coordinate values of the transition point Tb (Vb, Ib) and the intersecting point T2 (Vt2, It2).

$$R2 = (Vt2 - Vb)/(Ib - It2) \quad (7)$$

Furthermore, then, the voltage amplitude Vdb of voltage pulses that have the variable resistive element transit from the low resistance state to the high resistance state through load resistance should have higher voltage than the first critical voltage VB. In fact, since the value obtained by substituting 0 for I in the Equation (5) showing the load resistive characteristic line C2 is the first critical voltage VB, the voltage amplitude Vdb should satisfy the following Equation (8).

$$Vdb > Vb + R2 \times Ib \quad (8)$$

In the above description, although the second critical voltage VA and the first critical voltage VB are different, it is possible to set same voltage to voltage amplitude Vda of voltage pulses for having the variable resistive element from the high resistance state to the low resistance state and voltage amplitude Vdb for having the variable resistive element from the low resistance state to the high resistance state, as far as they satisfy the Equations (4) and (8).

Figure 6C:
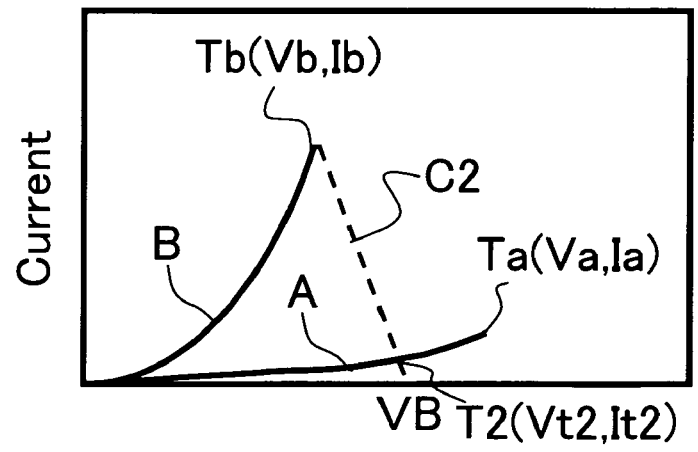

In this case, for instance, in switching operation from the low resistance state to the high resistance state, the voltage amplitude Vdc has considerably higher voltage than the first critical voltage VB, and in FIG. 6C, even if the load resistive characteristic line C2 moves in parallel to the right (the high voltage direction) and the intersection between the load resistive characteristic line C2 and the I-V characteristic curve in the high resistance state (characteristic A) moves to the high voltage side of the transition point Ta (Va, Ia), then bidirectional transitions occur between the high resistance state and the low resistance state, thus leading to unstable oscillation condition. However, when application of voltage pulses ends, the load resistive characteristic line C2 moves in parallel to the left (direction of low voltage) as the voltage amplitude Vdb lowers, and the intersection between the load resistive characteristic line C2 and the I-V characteristic curve in the high resistance state (characteristic A) moves to the low voltage side of the transition point Ta (Va, Ia). Thus, a transition to the high resistance state finally occurs and the resistive characteristic becomes stable in the high resistance state. Furthermore, in switching operation from the high resistance state to the low resistance state, the voltage amplitude Vda has considerably higher voltage than the second critical voltage VA, and in FIG. 6B, even if the load resistive characteristic line C1 moves in parallel to the right (the high voltage direction) and the intersection between the load resistive characteristic line C1 and the I-V characteristic curve in the low resistance state (characteristic B) moves to the high voltage side of the transition point Tb (Vb, Ib), then bidirectional transitions occur between the high resistance state and the low resistance state, thus leading to unstable oscillation condition. However, when application of voltage pulses ends, the load resistive characteristic line C1 moves in parallel to the left (direction of low voltage) as the voltage amplitude Vda lowers, and the intersection between the load resistive characteristic line C1 and the I-V characteristic curve in the low resistance state (characteristic B) moves to the low voltage side of the transition point Tb (Vb, Ib). Thus, a transition to the low resistance state finally occurs and the resistive characteristic becomes stable in the low resistance state. Then, due to the above, it is possible to set the voltage amplitude Vda and the voltage amplitude Vdb to same voltage in the device of the present invention.

Although we adopted the current-voltage characteristics measured by the commercially available parameter analyzer to describe the resistive characteristic of the variable resistive elements, as shown in FIG. 4, respective threshold voltages or threshold currents and critical voltages or the like in this invention should be measured or evaluated by means of voltage pulses of pulse width as short as voltage pulses to be actually applied to the serial circuits of the load circuits and the memory cells, and numeric values exemplified in FIG. 4 are for illustrative purposes of the invention. This is because each threshold voltage may change under the influence of voltage application duration when the resistive characteristics of the variable resistive element have remarkable temperature-responsiveness.

In the above description of the principle of operation and a method of determining optimal load resistive characteristics, although stand-alone load resistance having a linear load resistive characteristic is assumed as a load circuit, the load resistive characteristics are nonlinear in actual circuit configuration, as the load circuit includes transistors that have nonlinear current-voltage characteristics for selecting a word line or a bit line of the word line decoder 12 or the bit line decoder 13. Even when the load resistive characteristics are nonlinear, the idea about the above principle operation and the method of determining optimal load resistive characteristics would be same. However, as there are some points to be noted based on the current-voltage characteristics unique to MOSFET to be included in the load circuit, our description in the following assumes a stand-alone MOSFET having nonlinear load resistive characteristics.

Figure 7A:
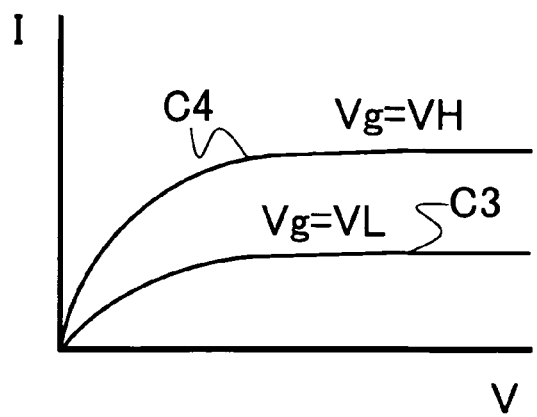
FIG. 7 are two types of volt-ampere curves: one is the volt-ampere curve showing a load resistive characteristic of MOSFET that serves as a load resistive characteristic variable circuit, and the other is the volt-ampere curve showing two resistive characteristics of high resistance state and low resistance state of the variable resistive element to be used in the first embodiment when measurement was conducted with MOSFET as the load circuit.
Figure 7B:
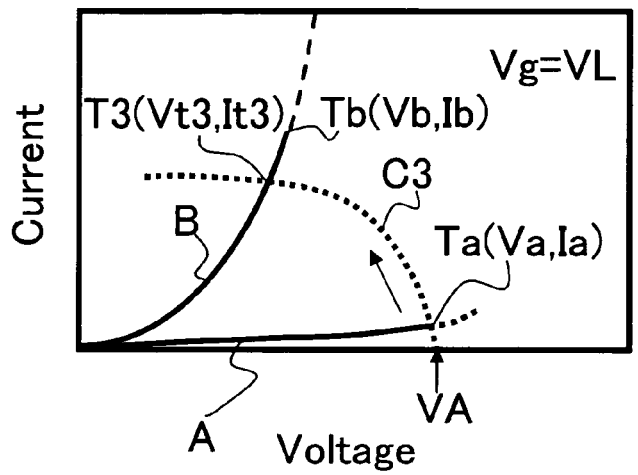
Figure 7C:
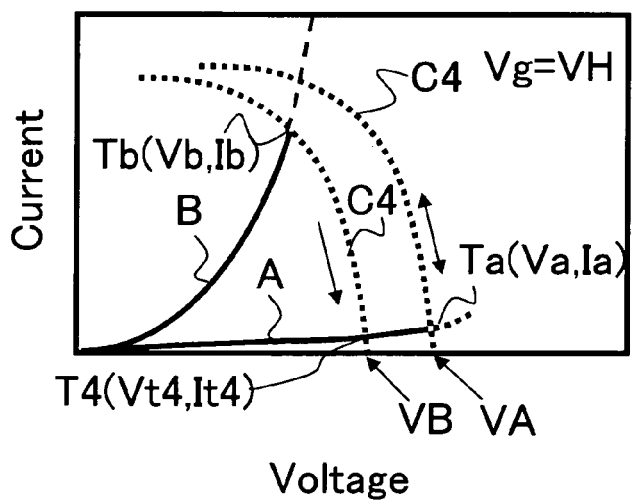

FIG. 7A shows load resistive characteristics C3, C4 specified by two current-voltage characteristics between source and drain at different gate voltage Vg of MOSFET. In fact, this MOSFET serves as a load resistive characteristic variable circuit 14 capable of switching load resistive characteristics by controlling the gate voltage. As shown in FIGS. 7B and 7C, the load resistive characteristic C3 having the lower gate voltage (Vg=VL) is used when the resistive characteristics of the variable resistive element transits from the high resistance state (characteristic A) to the low resistance state (characteristic B), while the load resistive characteristic C4 having the higher gate voltage (Vg=VH) is used when the resistive characteristics of the variable resistive element transits from the low resistance state (characteristic B) to the high resistance state (characteristic A).

First, we describe a range of load resistive characteristics desirable for transitions from the high resistance state to the low resistance state and a range of drive voltage Vda (voltage amplitude of voltage pulses) to be applied to a serial circuit of the load circuit and the variable resistive element (memory cell). If the variable resistive element has the resistive characteristics shown in FIG. 6A and the gate voltage of MOSFET is set to low level (VL) so as to use load resistive characteristic C3, the load resistive characteristics going through the transition point Ta (Va, Ia) are plotted like the curve C3 in FIG. 7B. The drive voltage Vda then is defined as the second critical voltage VA. In order to perform stable operation from the high resistance state to the low resistance state, it is required that the load resistive characteristic line C3 intersect the I-V characteristic curve in the low resistance state at a point T3 (Vt3, It3) on the low voltage side of the transition point Tb (Vb, Ib) from the low resistance state to the high resistance state. In fact, since, to the two resistive characteristics shown in FIG. 6A, the load resistance characteristic line C3 going through transition point Ta in FIG. 7B and the intersecting point T3 (Vt3, It3) functions equivalent to load resistance of the first resistance value R3 defined by respective coordinate values of the transition point Ta (Va, Ia) and the intersecting point T3 (Vt3, It3) of the Equation (9) as shown below, and thus the load resistance characteristic line C3 is expressed by the Equation (10) if the load resistive characteristic is represented by the first resistance value R3 for convenience.

$$R3=(Va-Vt3)/(It3-Ia) \quad (9)$$

$$V=-R3\times(I-Ia)+Va \quad (10)$$

Now, in order to satisfy the above requirement, V<Vb should be satisfied when I=Ib. Thus, the Equation (10) and the condition lead to the following Equation (11). The resistance value in the left term of the Equation (11) corresponds to the critical resistance value.

$$(Va-Vb)/(Ib-Ia)<R3 \quad (11)$$

In addition, in MOSFET, even though voltage between source and drain has increased, increase in current is controlled when the voltage reaches a saturation region. Thus, the Equation (11) can be satisfied if the gate voltage is set so that the saturated current will be smaller than the current value (first threshold current) at the transition point Tb (Vb, Ib).

Furthermore, as with the case in which linear load resistance is used, it is necessary that the voltage amplitude Vda of the voltage pulse for having the variable resistive element transit from the high resistance state to the low resistance state through MOSFET have higher voltage than the second critical voltage VA (Vda>VA). However, in FIG. 7B, the second critical voltage VA is given by a voltage value of the intersection of the load resistive characteristic curve C3 going through the transition point Ta (Va, Ia) and the voltage axis.

We continue to describe a range of load resistive characteristic desirable for a transition from the low resistance state to the high resistance state, and a range of drive voltage Vdb (voltage amplitude of voltage pulses) to be applied to a serial circuit of a load circuit and a variable resistive element (memory cell). If the variable resistive element has the resistive characteristics shown in FIG. 6A, and the gate voltage of MOSFET is set to high level (VH) so as to use load resistive characteristic C4, the load resistive characteristic going through the transition point Tb (Vb, Ib) is plotted like the curve C4 in FIG. 7C. Then, the drive voltage Vdb is defined as the first critical voltage VB. In order to perform stable operation from the low resistance state to the high resistance state, it is required that the load resistive characteristic line C4 intersect the I-V characteristic curve in the high resistance state at a point T4 (Vt4, It4) on the low voltage side of the transition point Ta (Va, Ia) from the high resistance state to the low resistance state. In fact, since, to the two resistive characteristics shown in FIG. 6A, the load resistance characteristic line C4 going through the transition point Tb in FIG. 7C and the intersecting point T4 (Vt4, It4) functions equivalent to load resistance of the second resistance value R4 defined by respective coordinate values of the transition point Tb (Vb, Ib) and the intersecting point T4 (Vt4, It4) of the Equation (12) as shown below, and thus the load resistance characteristic line C4 is expressed by the Equation (13) if the load resistive characteristic is represented by the second resistance value R4 for convenience.

$$R4=(Vt4-Vb)/(Ib-It4) \quad (12)$$

$$V=-R4\times(I-Ib)+Vb \quad (13)$$

Now, in order to satisfy the above requirement, V<Va should be satisfied when I=Ia. Thus, the Equation (13) and the condition lead to the following Equation (14). The resistance value in the left term of the Equation (14) corresponds to the critical resistance value.

$$(Va-Vb)/(Ib-Ia)>R4 \quad (14)$$

In addition, since the load resistive characteristic curve C4 needs to intersect the transition point Tb (Vb, Ib), the gate voltage should be set so that the saturated current of MOSFET can be larger than the current value Ib at the transition point Tb (Vb, Ib) (first threshold current).

Furthermore, then, as with the case in which linear load resistance is used, it is necessary that the voltage amplitude Vdb of the voltage pulse for having the variable resistive element transit from the low resistance state to the high resistance state through MOSFET have higher voltage than the first critical voltage VB (Vdb>VB). However, in FIG. 7C, the first critical voltage VB is given by a voltage value of the intersection of the load resistive characteristic curve C4 going through the transition point Tb (Vb, Ib) and the voltage axis.

In addition, due to similar reasons to those in the case in which linear load resistance is used, although the second critical voltage VA and the first critical voltage VB differ, it is possible to set them to same voltage as far as the condition that the voltage amplitude Vda of voltage pulses for having the variable resistive element transit from the high resistance state to the low resistance state has higher voltage than the second critical voltage VA (Vda>VA), and the condition that the voltage amplitude Vdb of voltage pulses for having the variable resistive element transit from the low resistance state to the high resistance state has higher voltage than the first critical voltage VB (Vdb>VB) are met, respectively.

Figure 8:
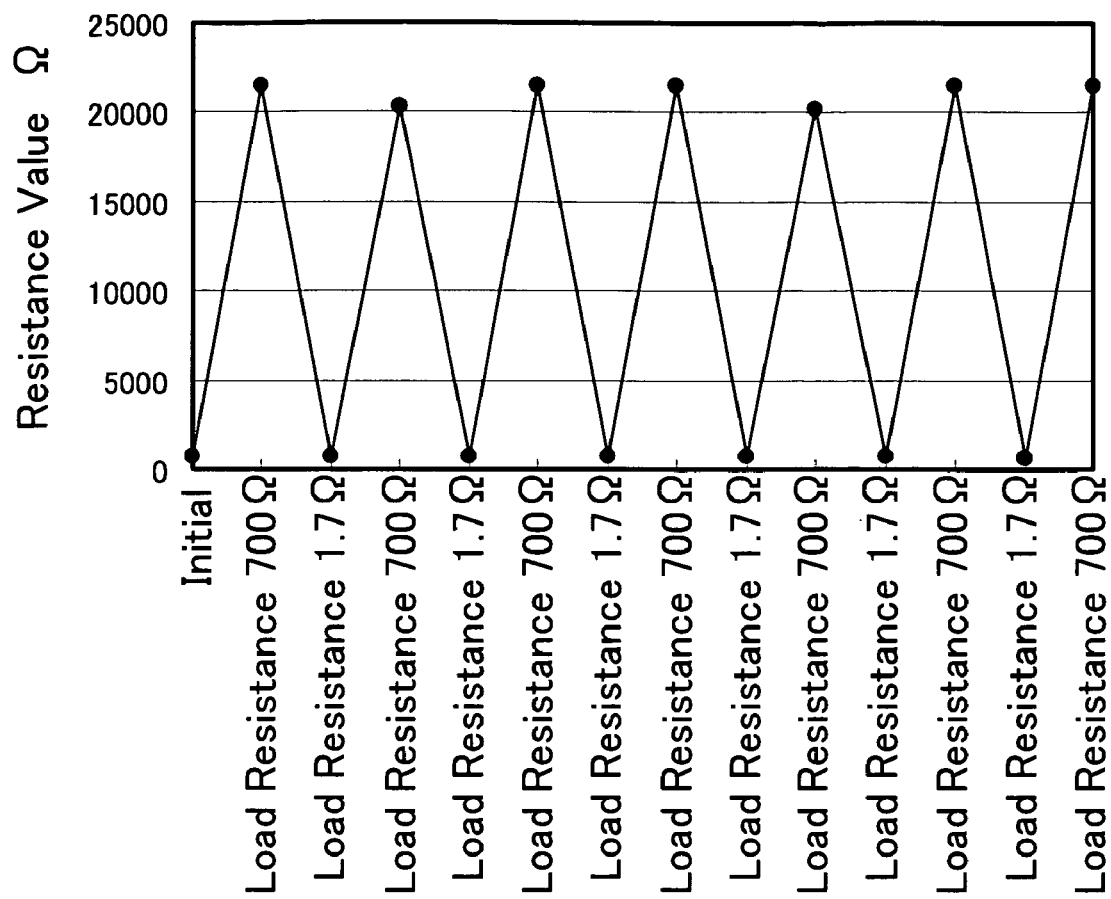
FIG. 8 is a view showing variations in the resistance value when an experiment of unipolar switching operations was conducted on the variable resistive element to be used in the first embodiment, through load resistance.

In the following, in comparison with FIG. 5, we describe effect of the case in which the load circuit capable of switching two different load resistive characteristics in programming and erasing is used. In the variable resistive element that could not perform continuous unipolar switching operations in the measurement in which voltage pulses were applied without going through load resistance shown in FIG. 5, we used MOSFET as the load circuit, applied voltage pulses in the following manner, using the gate voltage to be switched according to the switching direction, and measured resistance value every time voltage pulse was applied. FIG. 8 shows variations in the measured resistance values. The resistance values were read out by means of the parameter analyzer. A value equal to readout current at +0.3V divided by a voltage value is considered a resistance value. As shown in FIG. 8, the gate voltage of MOSFET was set to 3V (ON resistance was 700Ω), and then voltage pulses having the voltage pulse +2V and pulse width of 35 ns was applied to the variable resistive element that was initially in the low resistance state of 720Ω, the resistance value increased and it transited to the high resistance state (21 kΩ). Next, when the gate voltage of MOSFET was changed to 1.8V (ON resistance was 1700Ω), and voltage pulses having the same voltage amplitude of +2V and pulse width of 35 ns were applied, the resistance value changed to the low resistance state of 680Ω. Furthermore, switching was repeated alternately between the low resistance state and the high resistance state, by similarly switching the gate voltage according to the switching direction and repeatedly applying the voltage pulses having the same voltage amplitude of +2V and pulse width of 35 ns. Hence, stable and continuous unipolar switching operations were confirmed.

Figure 9:
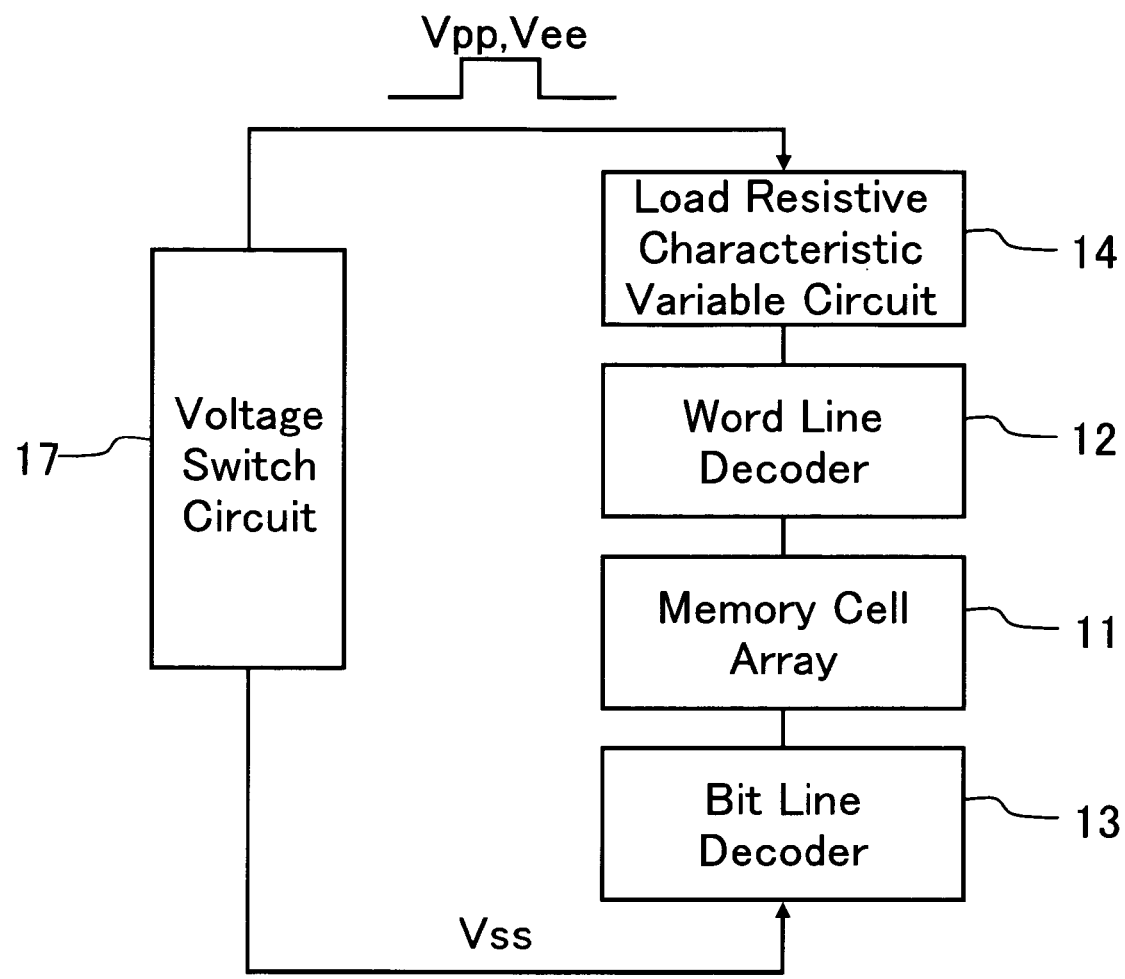
FIG. 9 is a block diagram schematically showing a relation among the variable resistive element of the selected memory cell, the load circuit, and the voltage switching circuit being a target of writing in the first embodiment.

In the following, we describe specific circuit configuration of the load resistive characteristic variable circuit 14 to be used in this embodiment, with reference to FIG. 9 and FIG. 10. FIG. 9 schematically shows a relation of the variable resistive element 21 of the selected memory cell to be written, the load circuit and the voltage switch circuit 17. In FIG. 9, the load circuit can be treated as all circuits excluding the selected memory cell in the circuit to which voltage pulses are applied from the voltage switch circuit 17, and include the word line decoder 12, the bit line decoder 13, the load resistive characteristic variable circuit 14, and parasitic resistance of signal wiring such as the selected word line or selected bit line or the like. Thus, the load resistive characteristics are assumed as the current-voltage characteristics of synthetic circuit of all circuits excluding the selected memory cell. In the example shown in FIG. 9, ground voltage Vss is applied to the selected bit line through the bit line decoder 13 from the voltage switch circuit 17, voltage for programming Vpp or voltage for erasing Vee are applied to the selected word line through the load resistance characteristic variable circuit 14 and the word line decoder 12. Although voltage for programming Vpp and voltage for erasing Vee are applied as voltage pulses to the selected word line, the pulse width (application duration) thereof is adjusted through control from the control circuit on the side of the voltage switch circuit 17 that supplies voltage for programming Vpp or voltage for erasing Vee, or on the side of the load resistive characteristic variable circuit 14 or the word line decoder 12 that is supplied with the voltage.

FIGS. 10 A to 10E show five examples of circuit configurations of the load resistive characteristic variable circuit 14. FIG. 10A shows the load resistive characteristic variable circuit 14 configured by parallel connection of P-type MOSFET 31 that is always in ON state and P-type MOSFET 32 that can be switched ON and OFF by a control signal Sc1. If the P-type MOSFET 31 and P-type MOSFET 32 are set to same size, switching of the load resistive characteristics as shown in FIG. 7A becomes possible by the control signal Sc1. In addition, use of a resistive element having linear or nonlinear resistive characteristics or a diode adapted to voltage polarities could also implement the load resistance characteristic circuit 14 capable of switching the load resistive characteristics by turning the P-type MOSFET 32 ON and OFF.

FIG. 10B shows the load resistive characteristic variable circuit 14 configured by parallel connection of P-type MOSFETs 33, 34 that can be switched ON or OFF by two control signals Sc2, Sc3. The P-type MOSFETs 33, 34 are controlled so that one is turned ON while the other is turned OFF. In the example shown in FIG. 10B, switching of the load resistive characteristics as shown in FIG. 7A becomes possible by making gate width or the like of the P-type MOSFETs 33, 34. In addition, the P-type MOSFETs 33, 34 may have same size and resistance component of different resistance values may be added in series to both or any one of them.

FIG. 10C shows the load resistive characteristic variable circuit 14 configured by one P-type MOSFET 35 that can control the gate voltage in multiple stages by one control signal Sc4. Switching of the load resistive characteristics as shown in FIG. 7A becomes possible, by configuring the control signal Sc4 so that one signal level for turning OFF the P-type MOSFET 35 and two signal levels for turning ON the P-type MOSFET 35 can be outputted, and by switching the two signal levels for turning ON the P-type MOSFET 35.

FIG. 10D shows the load resistive characteristic variable circuit 14 configured by one P-type MOSFET 36 that can control the gate voltage and back gate (substrate) voltage in two stages, respectively, with two control signals Sc5, Sc6. The control signal Sc5 controls whether to turn ON or OFF the P-type MOSFET 36, while the control signal Sc6 adjusts the back gate voltage of the P-type MOSFET 36, thus changing the threshold voltage. Switching of the load resistive characteristics as shown in FIG. 7A becomes possible by turning ON the P-type MOSFET 36 and switching the threshold voltage in two ways to high or low, with the back gate voltage.

FIG. 10E shows the load resistive characteristic variable circuit 14 configured by one resistive control element 37 that can control the gate voltage in multiple stages with one control signal Sc7. As the resistive control element 37, a transfer gate composed of anything other than MOSFET or that composed of a single channel transistor or the like can be used. Switching of the load resistive characteristics becomes possible by switching signal levels of the control signal Sc7.

As shown in FIG. 1 and FIG. 9, in this embodiment, we described the case in which with the load resistive characteristic variable circuit 14 is provided between the voltage switch circuit 17 and the word line decoder 12, voltage for programming Vpp and voltage for erasing Vee of same voltage polarity is applied to the load resistive characteristic circuit 14 from the voltage switch circuit 17. However, the load resistive characteristic variable circuit 14 is not limited to this configuration example, and may be provided within the word line decoder 12, between the word line decoder 12 and the memory cell array 11, between the bit line decoder 13 and the memory cell array 11, within the bit line decoder 13, between the bit line decoder 13 and the voltage switch circuit 17, or within the voltage switch circuit 17, for instance. In addition, if the load resistive characteristic variable circuit 14 is provided within the word line decoder 12 or the bit line decoder 13, a transistor for selecting a word line constituting the word line decoder 12 or that for selecting a bit line constituting the bit line decoder 13 may be configured by the same transistor as the load resistive characteristic variable circuit 14. In addition, the load resistive characteristic variable circuit 14 may not only be formed in one location, but also distributed in more than one location.

In addition, if the load resistive characteristic variable circuit 14 is configured by using MOSFET, depending on where it is formed or voltage polarity of voltage for programming Vpp and voltage for erasing Vee, N-type MOSFET may replace P-type MOSFET.

In the following, we describe the programming operation of the memory cells of the device of the present invention. In the following description, the programming operation is the case of having the resistive characteristics of the variable resistive element of the selected memory cell transit from the low resistance state to the high resistance state.

First, when the control circuit 16 is instructed by an address signal, a data entry signal, a control input signal, or the like from the external to program into a memory cell specified by the address signal, it activates the voltage switch circuit 17 and gives instruction to output voltage to be applied to each of the selected word line, unselected word line, selected bit line, and unselected bit line, during programming. The voltage switch circuit 17 supplies voltage for programming Vpp generated at the voltage generation circuit (not shown) to the word line decoder 12 through the load resistive characteristic variable circuit 14, supplies to the word line decoder 12 and the bit line decoder 13 programming inhibit voltage Vpp/2 that is one-half of the voltage for programming Vpp, and supplies ground voltage Vss to the bit line decoder 13. In addition, the control circuit 16 controls so that the load resistive characteristic variable circuit 14 can be load resistive characteristic for programming operation. In this embodiment, it controls so that the load resistive characteristic can be in the lower resistance state. As a result, by setting the voltage for programming Vpp higher than or equal to the above first critical voltage, voltage obtained by subtracting voltage decreased in the load resistive characteristic variable circuit 14 and the word line decoder 12 from the voltage for programming Vpp is applied to the selected word line through the load resistive characteristic variable circuit 14 and the word line decoder 12, while voltage increased from ground voltage Vss corresponding to the voltage drop at the bit line decoder 13 is applied to the selected bit line. Then, voltage higher than or equal to the first threshold voltage necessary for having the resistive characteristics transit from the low resistance state to the high resistance state is applied to both ends of the selected memory cell, the resistive characteristic transits from the low resistance state to the high resistance state, and programming completes. Then, as the variable resistive element transits to the high resistance state, a synthetic resistance value of the serial circuit of the load circuit and the memory cells increases, current flowing through the load circuit decreases, and voltage drop at the load circuit decreases. Thus, although voltage to be applied to both ends of the selected memory cell after transition to the high resistance state increases, the variable resistive element can maintain the high resistance state in a stable manner after voltage surges, because due to the load resistive characteristic selected by control of the load resistive characteristic variable circuit 14, voltage at both ends of the selected memory cell is stable in lower voltage condition than the second threshold voltage and a transition to the high resistance state occurs.

In addition, since voltage obtained by subtracting the voltage drop at the word line decoder 12 from the programming inhibit voltage Vpp/2 is applied to the unselected word line through the word line decoder 12 while voltage that increases by the voltage drop at the bit line decoder 13 from the programming inhibit voltage Vpp/2 is applied to the unselected bit line through the bit line decoder 13, no voltage is applied to the unselected memory cells that connect to the unselected word line and unselected bit line, and voltage obtained by subtracting the voltage drop of the word line decoder 12 and bit line decoder 13 from the programming inhibit voltage Vpp/2 is applied to the unselected memory cells that connect to the unselected word line and the selected bit line and those that connect to the selected word line and unselected bit line. Thus, any unwanted programming operation to the unselected memory cells can be prevented, by setting the voltage for programming Vpp so that at least the programming inhibit voltage Vpp/2 is lower than the first threshold voltage necessary for transiting the resistive characteristics from the low resistance state to the high resistance state.

In the following, we describe the erasing operation of memory cells. Now, the erasing operation is the case of having the resistive characteristics of the variable resistive element of the selected memory cell transit from the high resistance state to the low resistance state.

First, when the control circuit 16 is instructed by an address signal, a data entry signal, or a control input signal, etc. from the external to perform erasing of a target memory cell specified by the address signal, it activates the voltage switch circuit 17 and gives instruction to output voltage to be applied to each of the selected word line, unselected word line, selected bit line, and unselected bit line, during erasing. The voltage switch circuit 17 supplies voltage for erasing Vee of the same polarity as voltage for programming Vpp generated at the voltage generation circuit (not shown) to the word line decoder 12 through the load resistive characteristic variable circuit 14, supplies to the word line decoder 12 and the bit line decoder 13 erasing inhibit voltage Vee/2 that is one-half of the voltage for erasing Vee, and supplies ground voltage Vss to the bit line decoder 13. In addition, the control circuit 16 controls so that the load resistive characteristic variable circuit 14 can be load resistive characteristic for erasing operation. In this embodiment, it controls so that the load resistive characteristic can be in higher resistance state. As a result, by setting the voltage for erasing Vee higher than or equal to the above second critical voltage, voltage obtained by subtracting voltage decreased in the load resistive characteristic variable circuit 14 and the word line decoder 12 from the voltage for erasing Vee is applied to the selected word line through the load resistive characteristic variable circuit 14 and the word line decoder 12, while voltage increased from ground voltage Vss corresponding to the voltage drop at the bit line decoder 13 is applied to the selected bit line. Then, voltage higher than or equal to the second threshold voltage necessary for having the resistive characteristics transit from the high resistance state to the low resistance state is applied to both ends of the selected memory cell, the resistive characteristic transits from the high resistance state to the low resistance state, and erasing completes. Then, as the variable resistive element transits to the low resistance state, a synthetic resistance value of the serial circuit of the load circuit and the memory cells decreases, current flowing through the load circuit increases, and voltage drop at the load circuit increases. Thus, although voltage to be applied to both ends of the selected memory cell after transition to the low resistance state decreases, the variable resistive element can maintain the low resistance state in a stable manner after voltage surges, because due to the load resistive characteristic selected by control of the load resistive characteristic variable circuit 14, voltage at both ends of the selected memory cell is stable in lower voltage condition than the first threshold voltage and a transition to the low resistance state occurs.

In addition, since voltage obtained by subtracting the voltage drop at the word line decoder 12 from the erasing inhibit voltage Vee/2 is applied to the unselected word line through the word line decoder 12 while voltage that increases by the voltage drop at the bit line decoder 13 from the erasing inhibit voltage Vee/2 is applied to the unselected bit line through the bit line decoder 13, no voltage is applied to the unselected memory cells that connect to the unselected word line and unselected bit line, and voltage obtained by subtracting the voltage drop of the word line decoder 12 and bit line decoder 13 from the erasing inhibit voltage Vee/2 is applied to the unselected memory cells that connect to the unselected word line and the selected bit line and those that connect to the selected word line and unselected bit line. Thus, any unwanted erasing operation to the unselected memory cells can be prevented, by setting the voltage for erasing Vee so that at least the erasing inhibit voltage Vee/2 is lower than the second threshold voltage necessary for transiting the resistive characteristics from the high resistance state to the low resistance state.

In addition, although the second critical voltage VA and the first critical voltage VB are different, due to the reasons described above, it is possible to set the voltage for programming Vpp and that for erasing Vee to same voltage in this embodiment. In addition, the pulse width of both voltage for programming Vpp and that for erasing Vee may be set to short pulse width such as 100 ns or shorter, for instance, and both pulse width may be of same length. This could make it possible to distinguish programming operations from erasing operations only by switching the load resistive characteristics of the load resistive characteristic variable circuit 14, thereby considerably simplify the circuit configuration.

A known readout operation for memory cells written through the conventional unipolar switching operation or bipolar switching operations may be used as readout operations of memory cells of the device of the present invention. In addition, we omit detailed description of the readout operation as it is not the main object of the present invention.

Second Embodiment

In the following, we describe a second embodiment of the present invention. One major characteristic of this invention lies in that it can enable stable high-speed unipolar switching operations by switching load resistive characteristics of a load circuit according to the switching direction, and without using voltage pulses having different long and short pulse width or asymmetrical variable resistive elements, whereas in the past, stable unipolar or bipolar switching operations were enabled by using voltage pulses having different, i.e., long and short pulse width or making device structure of variable resistive elements asymmetrical. We elaborately described this point in the above first embodiment. However, the technical idea of the present invention should not be limited only to the unipolar switching operations, and may also be applicable to the bipolar switching operations. In fact, the bipolar switching operations in the device of this invention, device structure of a variable resistive element need not necessarily to be asymmetrical.

In the following, we describe the second embodiment of the device of the present invention wherein programming and erasing operations are performed by the bipolar switching operations.

Figure 11:
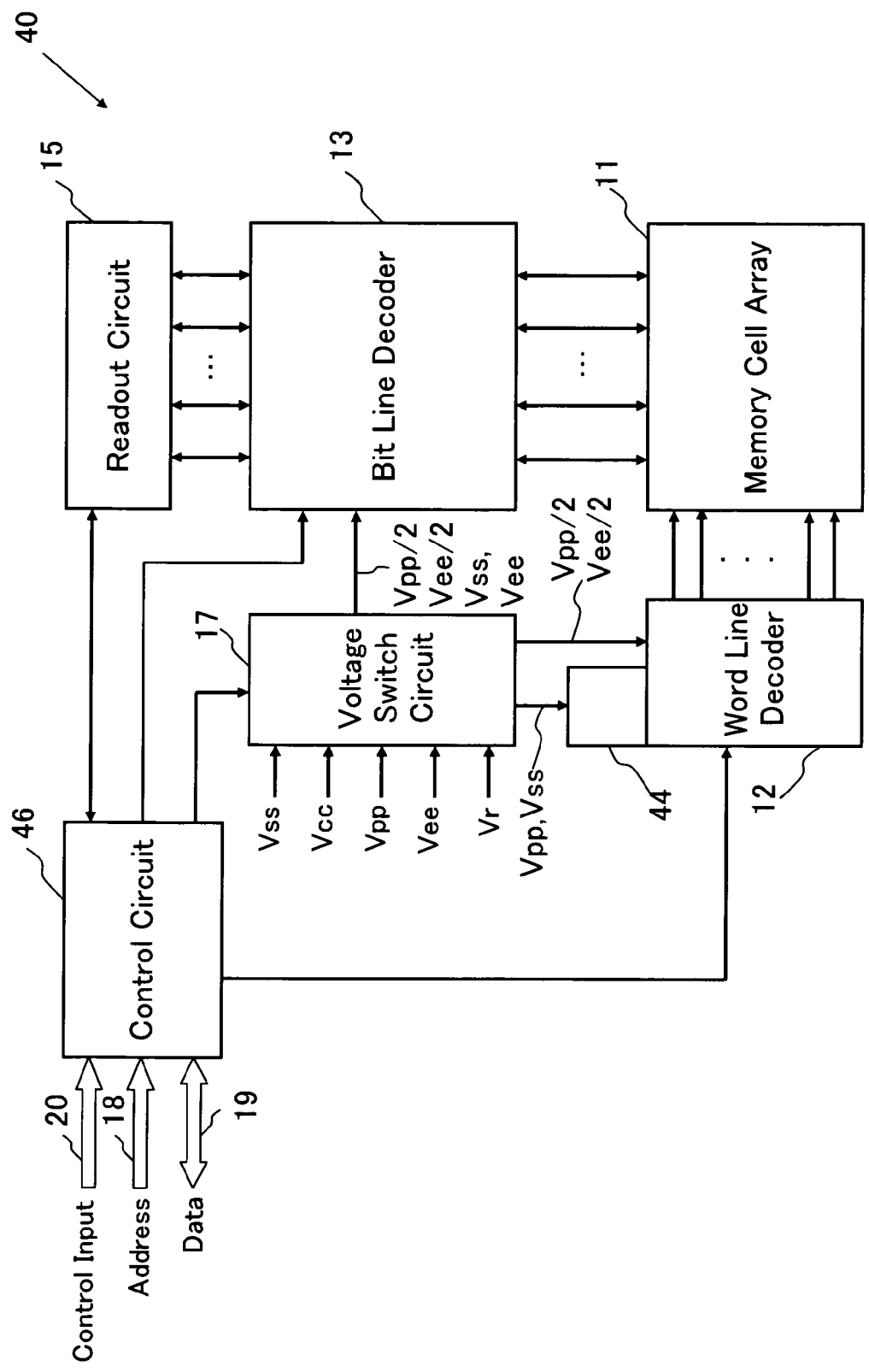
FIG. 11 is a block diagram showing a schematic example of circuit configuration in the second embodiment of the nonvolatile semiconductor memory device according to the present invention.

FIG. 11 shows block configuration of a device 40 of the present invention in the second embodiment. As shown in FIG. 11, the device 40 of the present invention comprises a memory cell array 11, a word line decoder (corresponding to a word line selection circuit) 12, a bit line decoder (corresponding to a bit line selection circuit) 13, a load resistance characteristic variable circuit 44, a readout circuit 15, a control circuit 46, and a voltage switch circuit 17.

Since the memory cell array 11, the word line decoder 12, the bit line decoder 13, the readout circuit 15, and the voltage switch circuit 17 are same as those in the first embodiment, we spare overlapping description.

The load resistive characteristic variable circuit 44 is a circuit (corresponding to a polarity dependent load resistive circuit) for automatically switching, depending on voltage polarities to be applied to the load resistive characteristic variable circuit 44, between two different load resistive characteristics (low resistance state and high resistance state) the load resistive characteristics specified by the current-voltage characteristics of a load circuit that electrically connects in series to a selected memory cell that was selected from the memory cell array 11 as a target of writing by the word line decoder 12 and bit line decoder 13 in programming or erasing operation. In this embodiment, the load resistive characteristic variable circuit 14 is provided between the word line decoder 12 and a voltage switch circuit 17. In addition, similar to the first embodiment, it is possible to use, as the load resistive characteristic variable circuit 44, the load resistive characteristic variable circuit 14 of the first embodiment (see FIG. 1 and FIG. 10) for switching the load resistive characteristics under the control of the control circuit 46.

The control circuit 46 is a circuit for controlling respective memory operations of programming, erasing, and readout of the memory cell array 11, and the basic functions thereof are same as those of the control circuit 16 of the first embodiment. It differs from the control circuit 16 of the first embodiment in that it does control supply sources in programming and erasing of various voltages to be supplied from the voltage switch circuit 17 to the word line decoder 12 and the bit line decoder 13. In fact, in the first embodiment, because of the unipolar switching operations, voltage for programming Vpp and that for erasing Vee having same polarity and programming inhibit voltage Vpp/2 and erasing inhibit voltage Vee/2 having same polarity are similarly supplied to the word line decoder 12 and bit line decoder 13. However, in the second embodiment, because of bipolar switching operations, control is such performed that polarity of the voltage to be applied to a selected memory cell should be inversed in programming operation and erasing operation, and thus in the programming operation, voltage for programming Vpp is supplied to the word line decoder 12 and ground voltage Vss to the bit line decoder 13, while in the erasing operation, voltage for erasing Vee is supplied to the bit line decoder 13 and ground voltage Vss to the world line decoder 12. In addition, as the load resistive characteristic variable circuit 44 automatically switches the load resistive characteristics depending on voltage polarity to be applied, said switching control is not directly performed by the control circuit 46. Instead, configuration to invert the voltage polarity to be applied to the load resistive characteristic variable circuit 44 by switching a destination to which voltage for programming Vpp and that for erasing Vee are supplied between programming and erasing operations could implement indirect switching control of the load resistive characteristics.

Similar to the first embodiment, the memory cell to be used in the second embodiment is assumed to be the variable resistive element 21 having the up down symmetrical device structure as shown in FIG. 3. Therefore, as shown in FIG. 4, the resistive characteristics of the variable resistive element also have two resistive characteristics of high resistance state (characteristic A) and low resistance state (characteristic B), and it can transit bi-directionally between the two resistive characteristics by application of voltage having same polarity. As the variable resistive element has the up down symmetrical device structure, each of the two resistive characteristics A, B is symmetrical to polarity of applied voltage.

In the following, using a simple embodiment, we describe that even in the bipolar switching operations, stable switching operations can be effected by switching the load resistive characteristics of the load circuit according to the switching direction, if a variable resistive element has symmetrical device structure.

Figure 12:
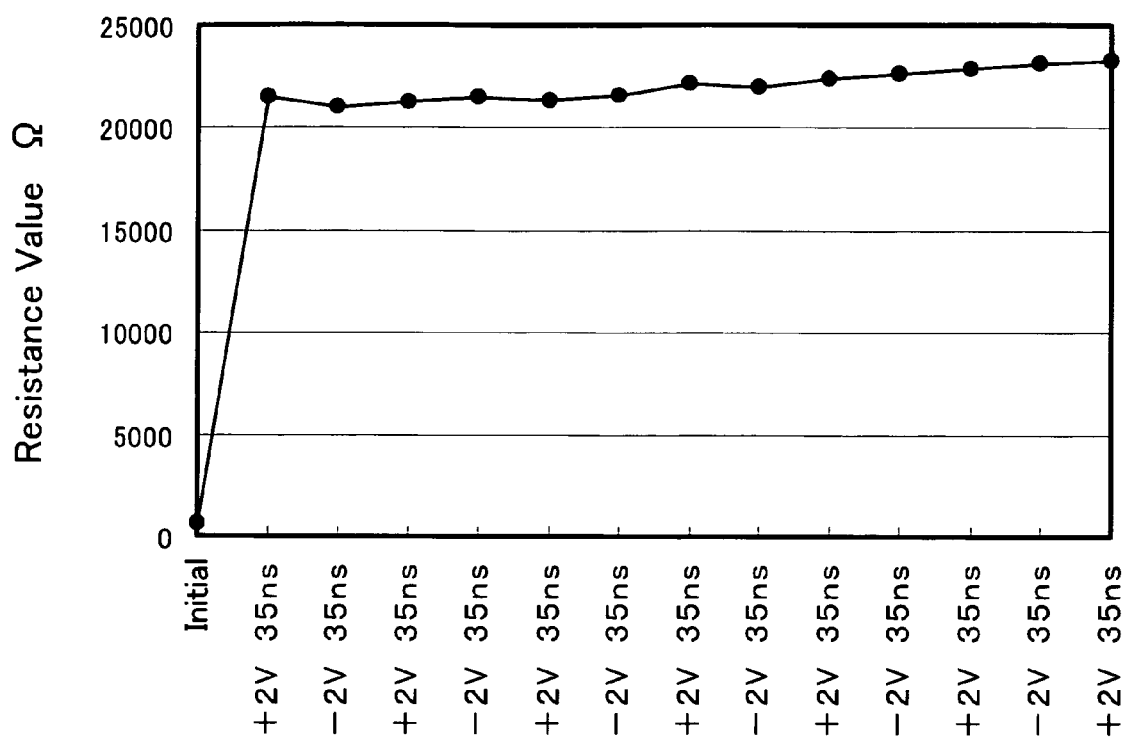
FIG. 12 is a view showing variations in the resistance value when an experiment of bipolar switching operations was conducted on the variable resistive element to be used in the second embodiment, without going through load resistance.

First, with the following steps, voltage pulses having positive and negative polarities were alternately applied to the variable resistive element without going through load resistance, and resistance values were measured every time voltage pulse was applied. FIG. 12 shows variations in the measured resistance values. The resistance values were read out by the parameter analyzer. A value equal to readout current at +0.3V divided by a voltage value is considered a resistance value. As shown in FIG. 12, voltage pulses having voltage amplitude of +2V and pulse width of 35 ns were applied to the variable resistive element that was initially in the low resistance state of 660Ω. Then, the resistance value increased and the variable resistive element transited to the high resistance state of about 21 kΩ. Although voltage pulses having reverse polarity, voltage amplitude of −2V and pulse width of 35 ns were further applied, the resistance value little changed. Then, although voltage pulses having same positive and negative polarities were alternately applied, the variable resistive element remained in the high resistance state, which prevented continuous switching operations (bidirectional transitions between the low resistance state and the high resistance state). This means that the variable resistive element cannot perform bipolar switching operations unless the device structure of the variable resistive element is made so asymmetrical that the resistive characteristics becomes asymmetrical according to voltage polarities, as with the conventional bipolar switching operations.

Figure 13:
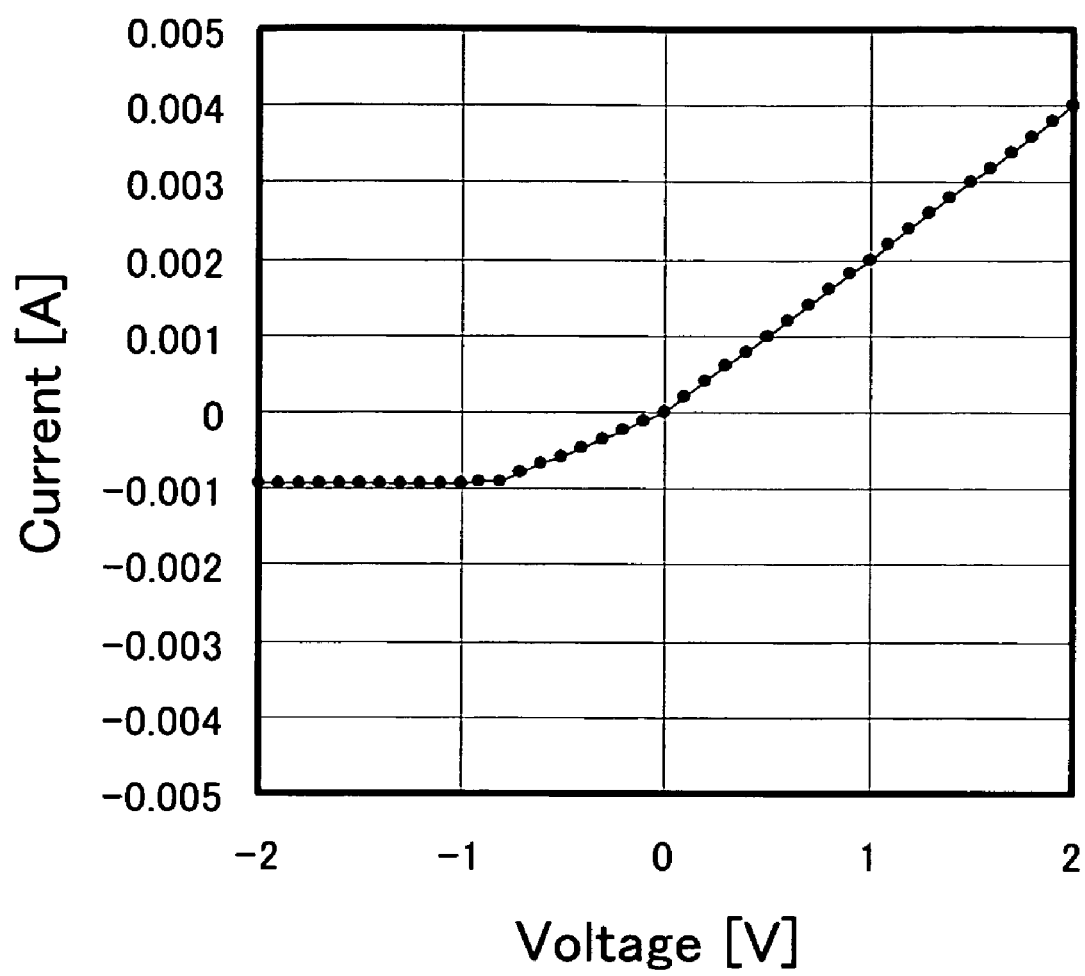
FIG. 13 is a volt-ampere curve of the polarity dependent load resistance circuit to be used in the experiment of bipolar switching operations as shown in FIG. 14.
Figure 14:
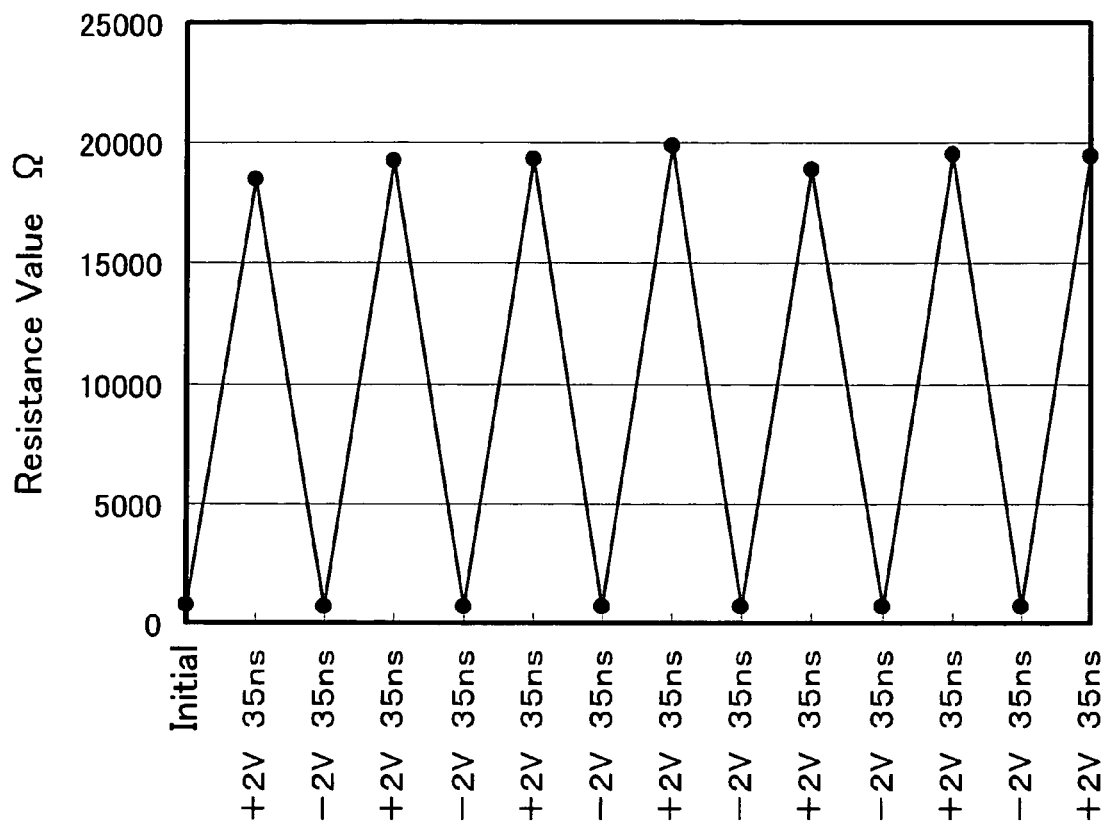
FIG. 14 is a view showing variations in the resistance value when an experiment of bipolar switching operations was conducted on the variable resistive element to be used in the second embodiment, through the polarity dependent load resistive circuit as the load circuit.

In the following, in comparison with FIG. 12, we describe effect of the case in which the load circuit capable of switching two different load resistive characteristics in programming and erasing is used. In the variable resistive element that could not perform continuous bipolar switching operations in the measurement in which voltage pulses were applied without going through load resistance shown in FIG. 12, we used, as the load circuit, the polarity dependent load resistive circuit having asymmetrical current-voltage characteristics to polarity of applied voltage as shown in FIG. 13, applied voltage pulses in the following manner, inverting the voltage polarity according to the switching direction, and measured resistance value every time voltage pulse was applied. FIG. 14 shows variations in the measured resistance values. The resistance values were read out by means of the parameter analyzer. A value equal to readout current at +0.3V divided by a voltage value is considered a resistance value. As shown in FIG. 14, voltage pulses having the voltage amplitude of +2V, i.e., having the polarity in which the polarity dependent load resistance shows lower resistance, and pulse width of 35 ns was applied to the variable resistive element that was initially in the low resistance state of 780Ω, the resistance value increased and the variable resistive element transited to the high resistance state (18 kΩ). Next, when voltage pulses having the voltage amplitude of −2V, i.e., having the polarity in which the polarity dependent load resistance shows higher resistance and pulse width 35 ns of reverse polarity were applied, the resistance value changed to the low resistance state of about 700Ω. Furthermore, by switching the voltage polarity according to the switching direction, and repeatedly applying the voltage pulses having voltage amplitude of +2V and −2V, pulse width of 35 ns and both positive and negative polarities alternately, the resistive characteristics of the variable resistive element repeated switching alternately. Thus, stable and continuous unipolar switching operations were confirmed.

Figure 15:
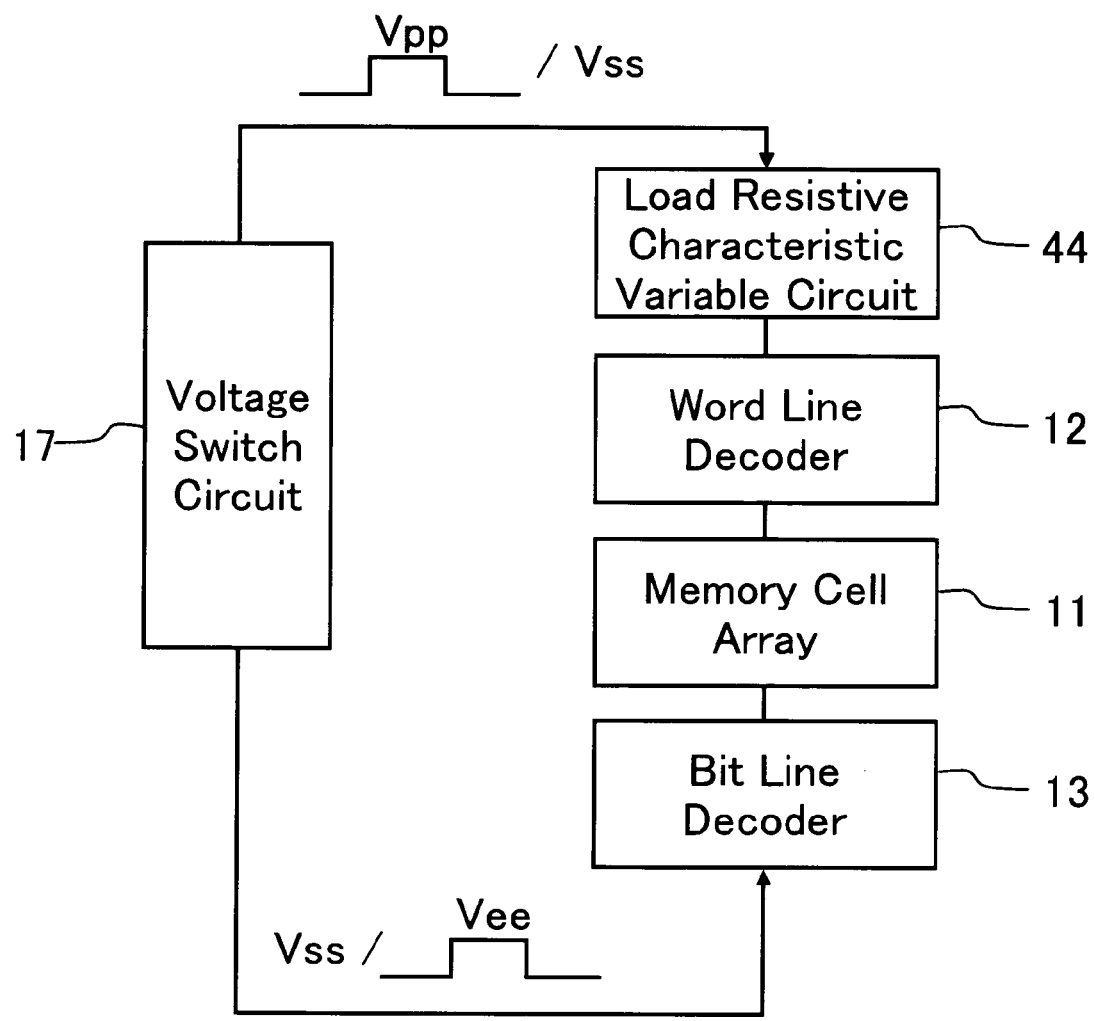
FIG. 15 is a block diagram schematically showing a relation among the variable resistive elements of the selection memory cell, the load circuit, and the voltage switching circuit being a target of writing in the second embodiment.

In the following, with reference to FIG. 15 to FIG. 17, we describe specific circuit configuration of the load resistive characteristic circuit 44 to be used in the second embodiment. FIG. 15 schematically shows a relation of the variable resistive element 21 of the selected memory cell to be written, the load circuit, and the voltage switch circuit 17. In FIG. 15, the load circuit can be treated as all circuits excluding the selected memory cell in the circuit to which voltage pulses are applied from the voltage switch circuit 17, and include the word line decoder 12, the bit line decoder 13, the load resistive characteristic variable circuit 44, and parasitic resistance of signal wiring such as the selected word line or selected bit line, etc. Thus, the load resistive characteristics are assumed as the current-voltage characteristics of synthetic circuit of all circuits excluding the selected memory cell. In the example shown in FIG. 15, in the programming operation, ground voltage Vss is applied to the selected bit line through the bit line decoder 13 from the voltage switch circuit 17, and voltage for programming Vpp is applied to the selected word line through the load resistance characteristic variable circuit 44 and the word line decoder 12. In addition, in the erasing operation, voltage for erasing Vee is applied to the selected bit line through the bit line decoder 13 from the voltage switch circuit 17, and ground voltage Vss is applied to the selected word line through the load resistive characteristic variable circuit 44 and the word line decoder 12. Although voltage for programming Vpp and voltage for erasing Vee are applied as voltage pulses to the selected word line or the selected bit line, the pulse width (application duration) thereof is adjusted under control of the control circuit on the side of the voltage switch circuit 17 that supplies voltage for programming Vpp or voltage for erasing Vee, or on the side of the load resistive characteristic variable circuit 44 or the word line decoder 12 that is supplied with said voltage, or in the bit line decoder 13.

Figure 16A:
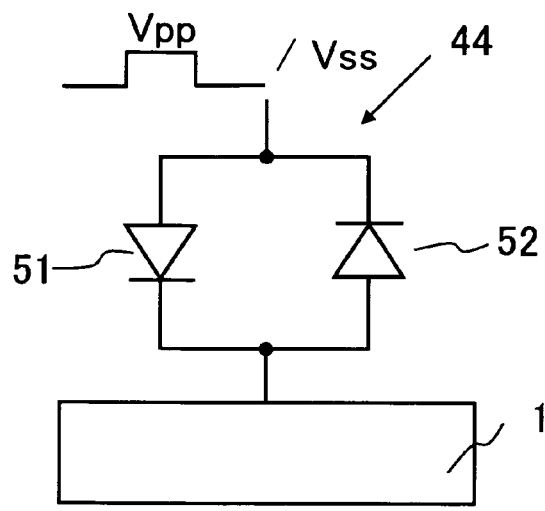
FIG. 16 is a circuit diagram showing an example of circuit configuration of the load resistive characteristic variable circuit to be used in the second embodiment.
Figure 16B:
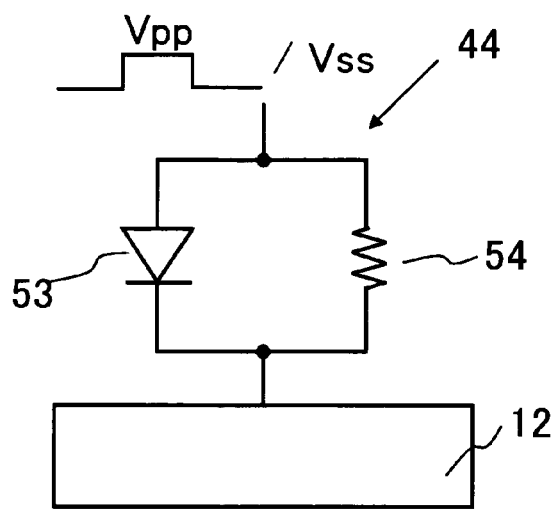
Figure 16C:
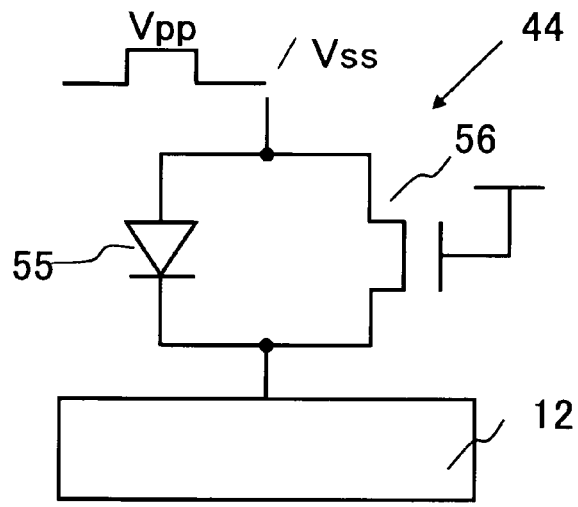

FIGS. 16A to 16C show three examples of circuit configurations of the load resistive characteristic variable circuit 44. FIG. 16A shows the load resistive characteristic variable circuit 44 configured by arranging two diodes 51, 52 having different current-voltage characteristics in opposite direction to each other and connecting them in parallel. Such the configuration could implement the polarity dependent load resistance circuit that has the current-voltage characteristics as shown in FIG. 17 and whose load resistive characteristics are automatically switched depending on polarity of applied voltage. In the example as shown in FIG. 16A, by having the current-volume characteristics of each of the diodes 51, 52 differ, the current-voltage characteristic asymmetrical to the voltage polarity as shown in FIG. 16 becomes possible. In addition, the polarity dependent load resistive circuit whose load resistive characteristics are automatically switched by polarity of the applied voltage could even be implemented by having the diodes 51, 52 have the same current-voltage characteristics and adding in series to both or any one of them resistance component of different resistance values.

FIG. 16B shows the load resistive characteristic variable circuit 44 configured by connecting in parallel a diode 53 and load resistance 54 having linear resistive characteristics. With such the configuration, the load resistive characteristics of when voltage is applied to the diode 53 in forward direction will be synthetic characteristics of the current-voltage characteristics of the diode 53 in the forward direction and those of the load resistance 54, and the load resistive characteristics of when voltage is applied to the diode 53 in backward direction will be the current-voltage characteristics at the load resistance 54 alone. Thus, the polarity dependent load resistive circuit whose load resistive characteristics are automatically switched depending on polarity of the applied voltage could be implemented.

FIG. 16C shows the load resistive characteristic variable circuit 44 configured by connecting in parallel a diode 55 and MOSFET 56 that is always in ON state. With such the configuration, the load resistive characteristics of when voltage is applied to the diode 55 in forward direction will be synthetic characteristics of the current-voltage characteristics of the diode 55 in the forward direction and the current-voltage characteristics between source and drain of the MOSFET 56, and the load resistive characteristics of when voltage is applied to the diode 55 in backward direction will be the current-voltage characteristics at the MOSFET 56 alone. Thus, the polarity dependent load resistive circuit whose load resistive characteristics are automatically switched depending on polarity of the applied voltage could be implemented.

Figure 17:
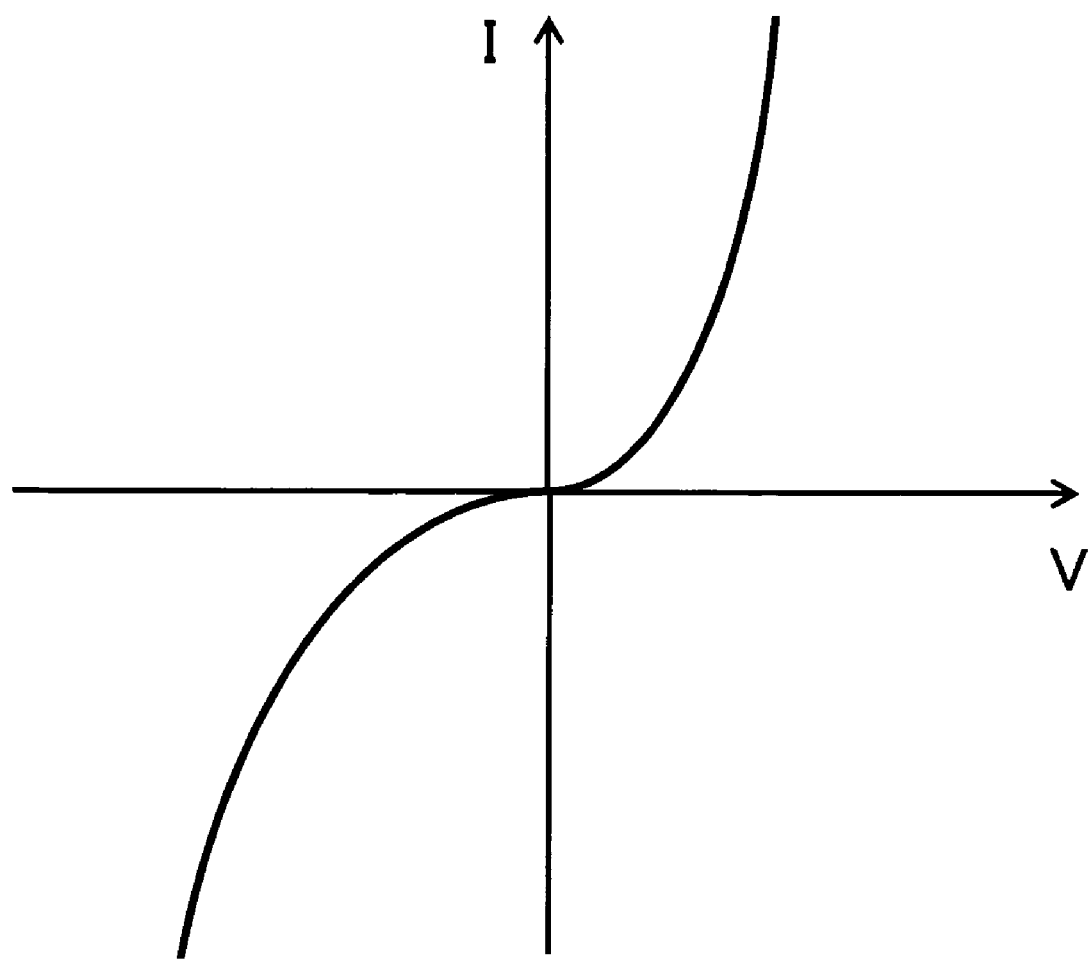
FIG. 17 is a volt-ampere curve showing one example of the load resistive characteristic of the polarity dependent load resistive circuit that can be used as the load resistive characteristic variable circuit in the second embodiment.

Besides the circuit configuration examples exemplified in FIGS. 16A to 16C, by using a nonlinear device such as a varistor, etc., the current-voltage characteristics asymmetrical to the voltage polarity shown in FIG. 17 can be obtained. In addition, by increasing leak current in reverse bias of Schottky barrier diode, the current-voltage characteristics similar to that asymmetrical to the voltage polarity shown in FIG. 13 can be obtained.

In addition, in this embodiment, as shown in FIG. 11 and FIG. 15, we described that the load resistive characteristic variable circuit 44 was provided between the voltage switch circuit 17 and the word line decoder 12, voltage for programming Vpp and ground voltage Vss were applied in programming operation and in erasing operation from the voltage switch circuit 17 to the load resistive characteristic variable circuit 44, respectively. However, the load resistive characteristic variable circuit 44 is not limited to this example of configuration, and may be provided within the word line decoder 12, between the word line decoder 12 and the memory cell array 11, between the bit line decoder 13 and the memory cell array 11, within the bit line decoder 13, between the bit line decoder 13 and the voltage switch circuit 17 or within the voltage switch circuit 17. In addition, the load resistive characteristic variable circuit 44 may not only be formed in one location, but also distributed in more than one location.

As programming operation in the second embodiment is basically same as that in the first embodiment, we omit overlapping description. In addition, in erasing operation in the second embodiment, polarity of applied voltage is reversed and a relation of the selected word line and the selected bit line is simply inverted from the erasing operation of the first embodiment. Thus, as the similar description could be made by simply replacing that in the erasing operation of the first embodiment with the relation of the load resistive characteristic variable circuit 44 and the word line decoder 12 that communicate with the selected word line and the bit line decoder 13 that communicates with the selected bit line, we omit overlapping description.

Third Embodiment

In the following, we describe a third embodiment of the present invention. In the conventional bipolar switching operations, although high-speed switching operation was possible, application of voltage of both positive and negative polarities was required to repeatedly perform programming and erasing of selected memory cells. Thus, the memory cells were required to conduct voltage in both directions irrespective of the polarity of voltage to be applied. In the device of the present invention, however, as we described in the above first embodiment in detail, since high-speed unipolar switching operations are possible in a stable manner, memory cells do not necessarily need to be capable of bipolar operations. In fact, as shown in FIG. 18, the memory cells can have 1D1R structure in which a variable resistive element 61 and a diode 62 are connected in series. Thus, by providing a diode in memory cells, limiting direction of current flowing through the memory cells, turning ON the diode, and thus adjusting threshold voltages at which current starts to run, leak current through unselected memory cells, which is the problem in the cross-point array memory cell array configuration, can be substantially lowered, thus enabling improvement of operation margin in readout operations.

FIG. 18A is a schematic sectional view that schematically shows cross sectional structure of the 1D1R type memory cell to be used in the device of the present invention of the third embodiment. FIG. 18B is an equivalent circuit diagram of the memory cell shown in FIG. 18A. As shown in FIG. 18A, it is configured by up-down connection in series of a variable resistive element 61 having a three-layered structure consisting of a lower electrode 63, a variable resistor 64 and an upper electrode 65, and a diode 62 composed of PN-junction of P-type semiconductor layer 66 and N-type semiconductor layer 67. The P-type semiconductor layer 66 and the N-type semiconductor layer 67 are formed by injecting impurities of P-type and N-type into silicon, respectively. Although the variable resistive element 61 can be formed of similar material to the first embodiment, in this embodiment, TiON made by oxidizing TiN is used for the variable resistor 64, Ti for the lower electrode 63, and TiN for the upper electrode 65, in addition to Pt/Fe$_2$O$_3$/Pt. One of the lower wiring 68 and the upper wiring 69 may be a word line, and the other may be a bit line. In order to reduce wiring resistance, the lower wiring 68 and the upper wiring 69 shall be made of different material and have different structure from the lower electrode 63 and the upper electrode 65. For instance, the lower wiring 68 shall be formed of AlCu, while the upper wiring 69 shall have laminated structure of AlCu and TiN, for instance.

Figure 19:
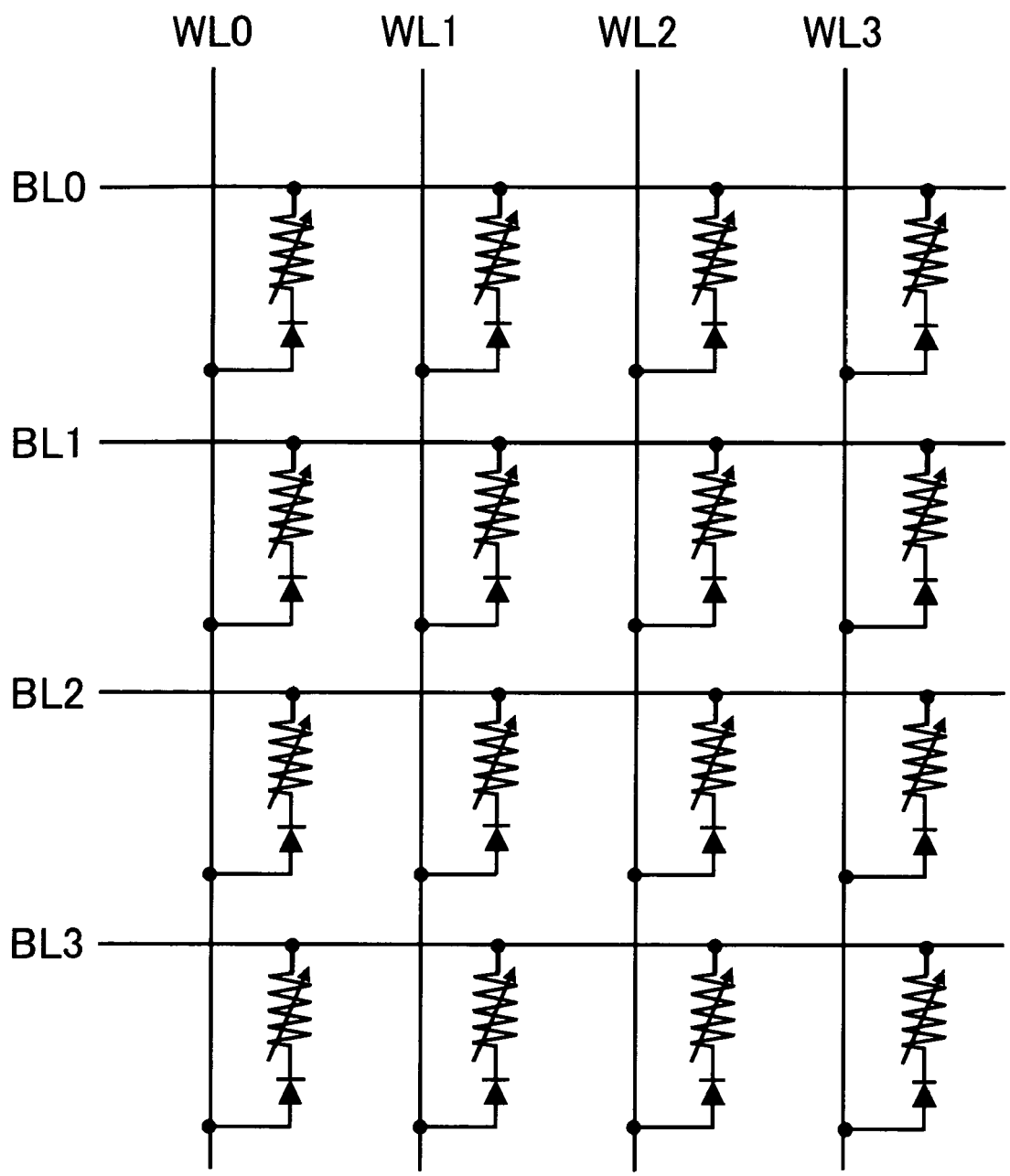
FIG. 19 is a circuit diagram showing a partial configuration of the cross-point memory cell array that uses the 1D1R type memory cells as shown in FIG. 18.

FIG. 19 schematically shows partial configuration of the cross-point type memory array 11 using the 1D1R type memory cells shown in FIG. 18. In FIG. 19, in the memory cell array 11, memory cells are held at intersections of four bit lines BL0 to BL3 and four word lines WL0 to WL3.

As the circuit configuration other than the memory cells are same as the first embodiment, we omit overlapping description of respective circuits comprising the device of the present invention in the third embodiment.

The characteristic of the present invention lies in that to a serial circuit of memory cells and a load circuit, load resistive characteristics of the load circuit are switched between programming operation and erasing operation. However, effect of this invention can be produced similarly, even if the load resistive characteristic of the load circuit is adjusted by including current-voltage characteristics of a diode in the current-voltage characteristics of the memory cell when a memory cell contains a current limiting element such as a diode, etc., or even if the load resistive characteristic of the load circuit is adjusted by including the current-voltage characteristic of the diode in the current-voltage characteristics of the load circuit.

Fourth Embodiment

In the following, we describe a fourth embodiment of the present invention. The device of the present invention in the fourth embodiment uses 1T1R type memory cells composed of a variable resistive element and a selected transistor. In the following description, although our description assumes unipolar switching operations, it may also adapt to the bipolar switching operations.

Figure 20:
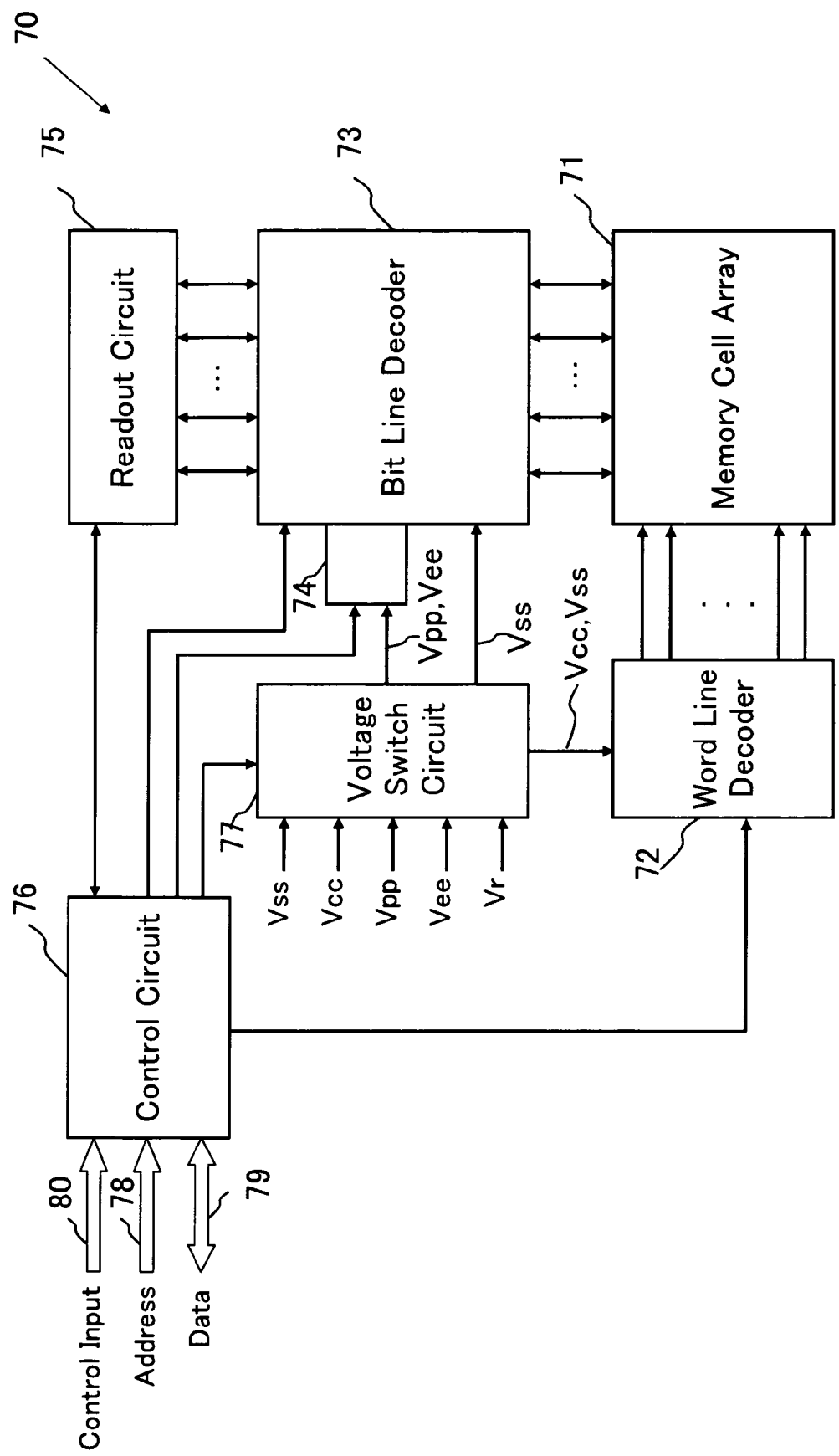
FIG. 20 is a block diagram showing a schematic example of circuit configuration in the fourth embodiment of the nonvolatile semiconductor memory device according to the present invention.

FIG. 20 shows block configuration of a device 70 of the present invention in the fourth embodiment. As shown in FIG.

20, the device 70 of the present invention comprises a memory cell array 71, a word line decoder (corresponding to a word line selection circuit) 72, a bit line decoder (corresponding to a bit line selection circuit) 73, a load resistance characteristic variable circuit 74, a readout circuit 75, a control circuit 76, and a voltage switch circuit 77.

Figure 21A:
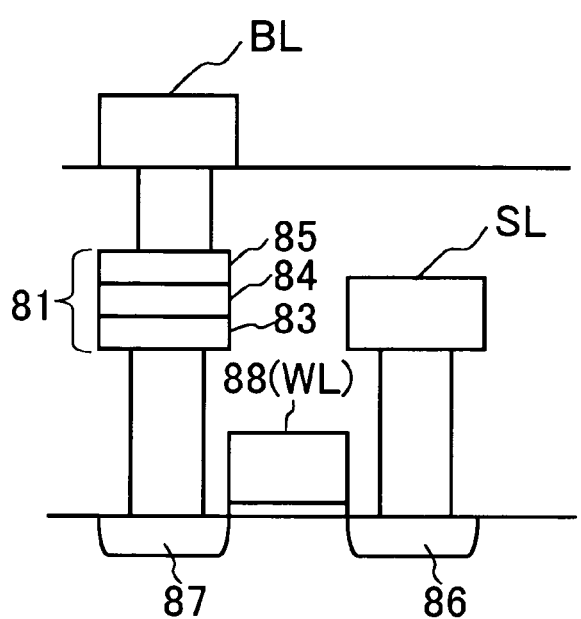
FIG. 21 is a schematic cross sectional view and an equivalent circuit diagram showing one example of configuration of the 1T1R type memory cell in the fourth embodiment.
Figure 21B:
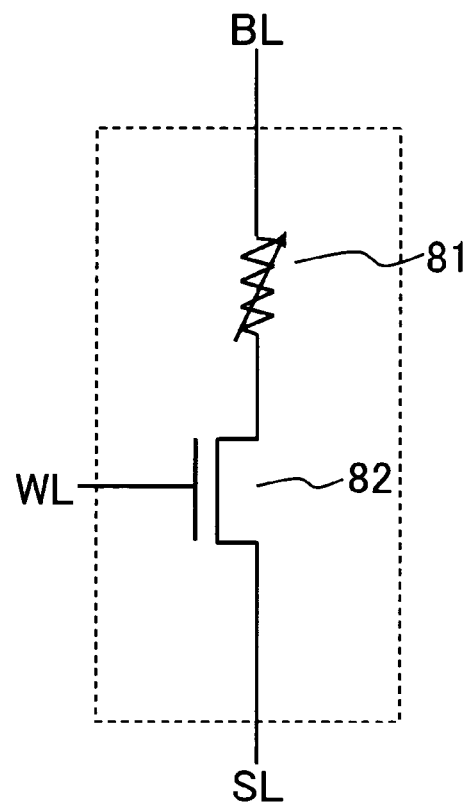

FIG. 21A shows a schematic sectional view of 1T1R memory cell. Memory cells comprising the memory cell 71 is formed as a serial circuit of a selection transistor 82 and a variable resistive element 81, the selection transistor 82 consisting of a source region 86 and a drain region 87 formed on a semiconductor substrate and a gate electrode 88 formed on a gate oxide film, and the variable resistive element 81 having the three-layered structure composed by laminating a lower electrode 83, a variable resistor 84 and an upper electrode 85, by electrically connecting the drain region 87 of the selection transistor 82 and the lower electrode 83 of the variable resistive element 81. The gate electrode 88 is connected to the word line WL, the source region 86 is connected to the source line SL, and the upper electrode 85 is connected to the bit line BL. The variable resistive element 84 is made of TiON made by oxidizing TiN, and both the upper and lower electrodes are made of TiN. FIG. 21B is an equivalent circuit diagram of 1T1R type memory cell of the cross sectional structure shown in FIG. 21A.

Figure 22:
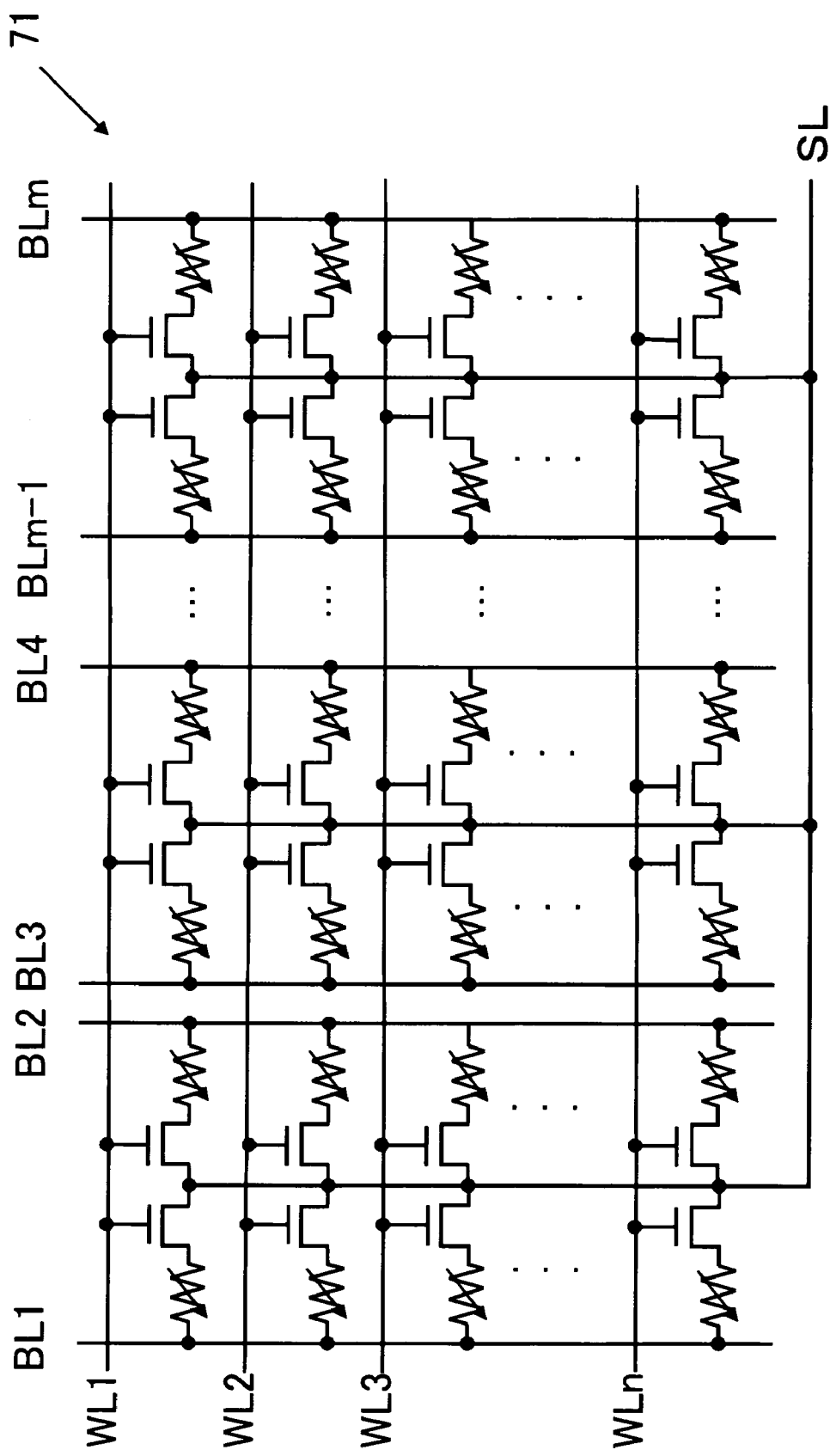
FIG. 22 is a circuit diagram showing a partial configuration of the memory cell array 11 that uses the 1T1R type memory cells as shown in FIG. 21.

FIG. 22 schematically shows partial configuration of the memory cell array 71 in which 1T1R type memory cells are arranged like a matrix. In FIG. 22, a gate of a selection transistor of each memory cell is connected to the word line (WL1 to WLn), a source of the selection transistor of each memory cell is connected to the common source line SL, and one end (on the side of upper electrode) of the variable resistive element of each memory cell is connected to the bit line (BL1 to BLm). In this embodiment, as unipolar switching operations are assumed, ground voltage is applied to the source line in respective memory operations of programming, erasing, and readout. Thus, as there is no need of switching the source line voltage depending on a type of memory operation, direct fixing to the ground voltage without going through the voltage switch circuit 77 for switching the source line voltage is possible.

The word line decoder 72 connects to each word line of the memory cell array 71, and selects, as a selected word line, a word line of the memory cell array 71 corresponding to an address signal for row selection entered into the address line 78. It individually applies to the selected word line and an unselected word line selected word line voltage and unselected word line voltage for respective memory operations of programming, erasing, and readout. Then, it turns on the selected transistor of the memory cell connecting to the selected word line, and off the selected transistor of the memory cell connecting to the unselected word line.

The bit line decoder 73 connects to each bit line of the memory cell array 71, and selects, as a selected bit line, a bit line of the memory cell array 71 corresponding to an address signal for column selection entered into the address line 78. It individually applies to the selected bit line and unselected bit line selected bit line voltage and unselected bit line voltage for respective memory operations of programming, erasing and readout. In programming and erasing operations, voltage for programming Vpp and that for erasing Vee is respectively supplied from the voltage switch circuit 77 to the bit line decoder 73 to apply selected bit line voltage to the selected bit line. In addition, in programming and erasing operations, the unselected bit line is either in the open condition in which no voltage is applied or in ground voltage applied condition. Consequently, in the 1T1R type memory cell array, voltage for programming Vpp or that for erasing Vee is only applied through the load circuit to the selected memory cells that connect to the selected word line and the selected bit line.

Controlled by a control circuit 76, the load resistive characteristic variable circuit 74 switches between two different load resistive characteristics (low resistance state and high resistance state) the load resistive characteristics specified by the current-voltage characteristics of a load circuit that electrically connects to a selected memory cell in series that was selected as a target of writing by the word line decoder 72 and bit line decoder 73 from the memory cell array 71 in programming or erasing operation. In this embodiment, the load resistive characteristic variable circuit 74 is provided between the bit line decoder 73 and a voltage switch circuit 77.

In addition, the load resistive characteristic variable circuit 74 having the same circuit configuration as the load resistive characteristic variable circuit 14 of the first embodiment illustrated in FIG. 10 can be used. The load resistive characteristic variable circuit 74 is not limited to the configuration shown in FIG. 20, and may be provided within the bit line decoder 73, between the bit line decoder 73 and the memory cell array 71, between the memory cell array 71 and the source line, or within the voltage switch circuit 77. In addition, if the load resistive characteristic variable circuit 74 is provided within the bit line decoder 73, a transistor for selecting a bit line comprising the bit line decoder 73 may be configured by the same transistor as the load resistive characteristic variable circuit 74. In addition, the load resistive characteristic variable circuit 74 may not only be formed in one location, but also distributed in more than one location. In addition, if the load resistive characteristic variable circuit 74 is configured by using MOSFET, depending on where it is formed or voltage polarity of voltage for programming Vpp and voltage for erasing Vee, N-type MOSFET may replace P-type MOSFET.

The control circuit 76 controls the respective memory operations of programming, erasing and read out of the memory cell array 71. Based on an address signal entered from the address line 78, data entry made from the data line 79 (in programming operation), and a control input signal entered from a control signal line 80, the control circuit 76 controls the word line decoder 72 and bit line decoder 73 to control readout, programming and erasing operations of the memory cell array 71. Specifically, in each memory operation, the control circuit executes control for applying to each of the selected word line, unselected word line, selected bit line and unselected bit line, predetermined voltage corresponding to the respective memory operations, on the voltage switch circuit 77, the word line decoder 72, bit line decoder 73, etc. In particular, in programming and erasing operations, it controls voltage amplitude and pulse width of each voltage pulse to be applied to a memory cell that is subject to writing through the load circuit. Furthermore, in programming and erasing operations, it executes control for switching the load resistive characteristics of the load circuit on the load resistive characteristic variable circuit 74. In the example shown in FIG. 20, the control circuit 76 is provided with the capability in general as an address buffer circuit, a data input/output buffer circuit, a control input buffer circuit (not shown).

The voltage switch circuit 77 provides the word line decoder 72 and the bit line decoder 75 with selected word line voltage, unselected word line voltage, selected bit line voltage and unselected bit line voltage necessary for readout, programming and erasing operations of the memory cell array 71. Vcc represents service voltage (supply voltage), Vss represents ground voltage, Vpp represents voltage for programming, Vee represents voltage for erasing, and Vr represents voltage for readout of the device 70 of the present invention. In this embodiment, selected bit line voltage in programming and erasing operations is supplied to the bit line decoder 75 through the load resistive characteristic variable circuit 74.

Data readout is performed from the memory cell array 71 through the bit line decoder 73 and a readout circuit 75. The readout decoder 75 judges status of data, sends result thereof to the control circuit 76, and outputs it to the data line 79.

In the following, we describe the programming operation of memory cells of the device of the present invention. Now, the programming operation is the case of having the variable resistive element of the selected memory cell transit from the high resistance state to the low resistance state.

First, when the control circuit 76 is instructed by an address signal, a data entry signal, or a control input signal, etc. from the external, to perform programming into a target memory cell specified by the address signal, it activates the voltage switch circuit 77 and gives instruction to output voltage to be applied to each of the selected word line, unselected word line, selected bit line, and unselected bit line, during programming. The voltage switch circuit 77 supplies voltage for programming Vpp generated at the voltage generation circuit (not shown) to the bit line decoder 73 through the load resistive characteristic variable circuit 74. In addition, the control circuit 76 controls so that the load resistive characteristic variable circuit 74 can be load resistive characteristic for programming operation. In this embodiment, it controls so that the load resistive characteristic can be in lower resistance state. As a result, by setting the voltage for programming Vpp higher than or equal to the above first critical voltage, voltage obtained by subtracting voltage decreased in the load resistive characteristic variable circuit 74 and the bit line decoder 73 from the voltage for programming Vpp is applied to the selected bit line, i.e., to the upper electrode of the variable resistive element of the selected memory cell through the load resistive characteristic variable circuit 74 and the bit line decoder 73, while voltage increased from the ground voltage Vss by drain/source voltage of the selected transistor of the selected memory cell is applied to the lower electrode of the variable resistive element of the selected memory cell. Then, voltage higher than or equal to the first threshold voltage necessary for having the resistive characteristics transit from the low resistance state to the high resistance state is applied to both terminals of the variable resistive element of the selected memory cell, the resistive characteristic transits from the low resistance state to the high resistance state, and programming completes. Then, as the variable resistive element transits to the high resistance state, a synthetic resistance value of the serial circuit of the load circuit including the selected transistor of the selected memory cell and the variable resistive element increases, current flowing through the load circuit decreases, and voltage drop at the load circuit decreases. Thus, although voltage to be applied to both terminals of the variable resistive element of the selected memory cell after transition to the high resistance state increases, the variable resistive element can maintain the high resistance state in a stable manner, because voltage at both ends of the variable resistive element of the selected memory cell after said increase is controlled lower than the second threshold voltage necessary for having the resistive characteristics transit from the high resistance state to the low resistance state by the selected load resistive characteristic under control of the load resistive characteristic variable circuit 74. In addition, no voltage is applied to the unselected memory cells connecting to the unselected bit lines. In addition, for the unselected memory cells connecting to the unselected word lines, no voltage is applied to the variable resistive element as the selected transistor is in off state, and thus no programming of data is performed on any unselected memory cell.

In the following, we describe the erasing operation of memory cells. Now, the erasing operation is the case of having the variable resistive element of the selected memory cell transit from the high resistance state to the low resistance state.

First, when the control circuit 76 is instructed by an address signal, a data entry signal, or a control input signal, etc. from the external, to perform erasing of a target memory cell specified by the address signal, it activates the voltage switch circuit 77 and gives instruction to output voltage to be applied to each of the selected word line, unselected word line, selected bit line, and unselected bit line, during erasing. The voltage switch circuit 77 supplies voltage for erasing Vee of the same polarity as voltage for programming Vpp generated at the voltage generation circuit (not shown) to the bit line decoder 73 through the load resistive characteristic variable circuit 74. In addition, the control circuit 76 controls so that the load resistive characteristic variable circuit 74 can be load resistive characteristic for erasing operation. In this embodiment, it controls so that the load resistive characteristic can be in higher resistance state. As a result, by setting the voltage for erasing Vee higher than or equal to the above second critical voltage, voltage obtained by subtracting voltage decreased in the load resistive characteristic variable circuit 74 and the bit line decoder 73 from the voltage for erasing Vee is applied to the selected bit line, i.e., to the upper electrode of the variable resistive element of the selected memory cell through the load resistive characteristic variable circuit 74 and the bit line decoder 73, while voltage increased from the ground voltage Vss by drain/source voltage of the selected transistor of the selected memory cell is applied to the lower electrode of the variable resistive element of the selected memory cell. Then, voltage higher than or equal to the second threshold voltage necessary for having the resistive characteristics transit from the high resistance state to the low resistance state is applied to both terminals of the variable resistive element of the selected memory cell, the resistive characteristic transits from the high resistance state to the low resistance state, and erasing completes. Then, as the variable resistive element transits to the low resistance state, a synthetic resistance value of the serial circuit of the load circuit including the selected transistor of the selected memory cell and the variable resistive element decreases, current flowing through the load circuit increases, and voltage drop at the load circuit increases. Thus, although voltage to be applied to both terminals of the variable resistive element of the selected memory cell after transition to the low resistance state decreases, the variable resistive element can maintain the low resistance state in a stable manner, because voltage at both ends of the variable resistive element of the selected memory cell after said decrease is controlled lower than the first threshold voltage necessary for transiting the resistive characteristics from the low resistance state to the high resistance state by the selected load resistive characteristic under control of the load resistive characteristic variable circuit 74. In addition, no voltage is applied to the unselected memory cells connecting to the unselected bit lines. In addition, for the unselected memory cells connecting to the unselected word lines, no voltage is applied to the variable resistive element as the selected transistor is in off state, and thus no erasing of data is performed on any unselected memory cell.

In addition, although the second critical voltage VA and the first critical voltage VB are different, due to the reasons similar to those of the first embodiment, it is possible set the voltage for programming Vpp and that for erasing Vee to same voltage in this embodiment. In addition, the pulse width of both voltage for programming Vpp and that for erasing Vee may be set to short pulse width such as 100 ns or shorter, for instance, and both pulse width may be of same length. This could make it possible to distinguish programming operations from erasing operations only by switching the load resistive characteristics of the load resistive characteristic variable circuit 74, thereby considerably simplify the circuit configuration.

In the following, we describe alternative embodiments of the device of the present invention.

(1) In the respective embodiments described above, as a variable resistive element comprising memory cells, Pt/Fe$_2$O$_3$/Pt structure is adopted in the first and the second embodiments, Ti/TiON/TiN structure in the third embodiment, and TiN/TiON/TiN structure in the fourth embodiment, respectively. However, the structure and material of the variable resistive element in each embodiment shall not be limited to the materials of the respective structures described above. As the variable resistive element, when voltage is applied to the other terminal relative to one terminal with at least one of positive or negative polarities, the resistive characteristics specified by the current-voltage characteristics between two terminals can transmit between two resistive characteristics of low resistance state and high resistance state that can be taken stably, and if the variable resistive element has different first threshold voltage being the lower limit of an absolute value of applied voltage necessary for said resistive characteristics to transit from the low resistance state to the high resistance state and the second threshold voltage being the lower limit of an absolute value of applied voltage necessary for said resistive characteristic to transit from the high resistance state to the low resistance state, the present invention may be applicable to any material or structure.

Figure 23:
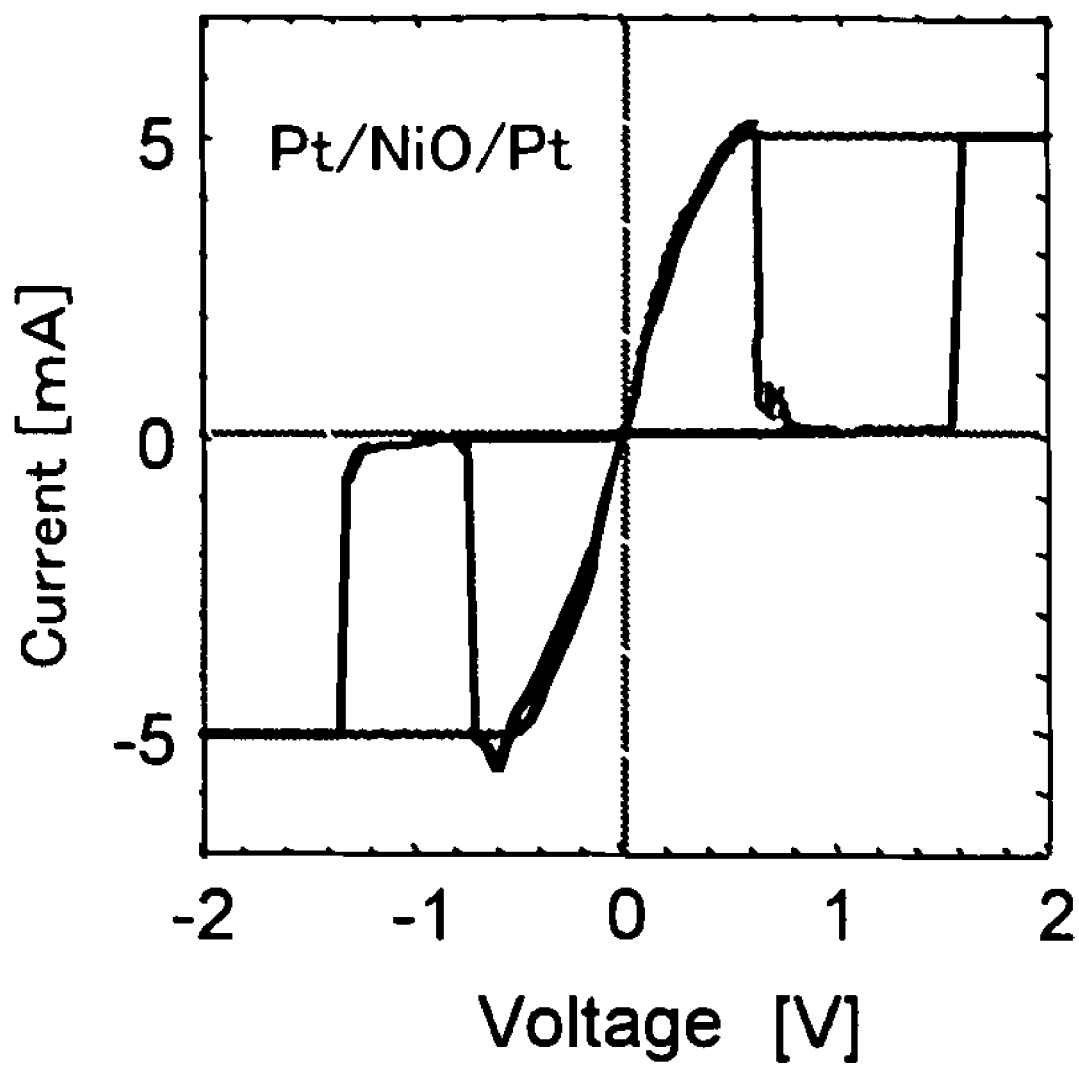
FIG. 23 is a volt-ampere curve showing the resistive characteristics of the variable resistive element having Pt/NiO/Pt structure.
Figure 24:
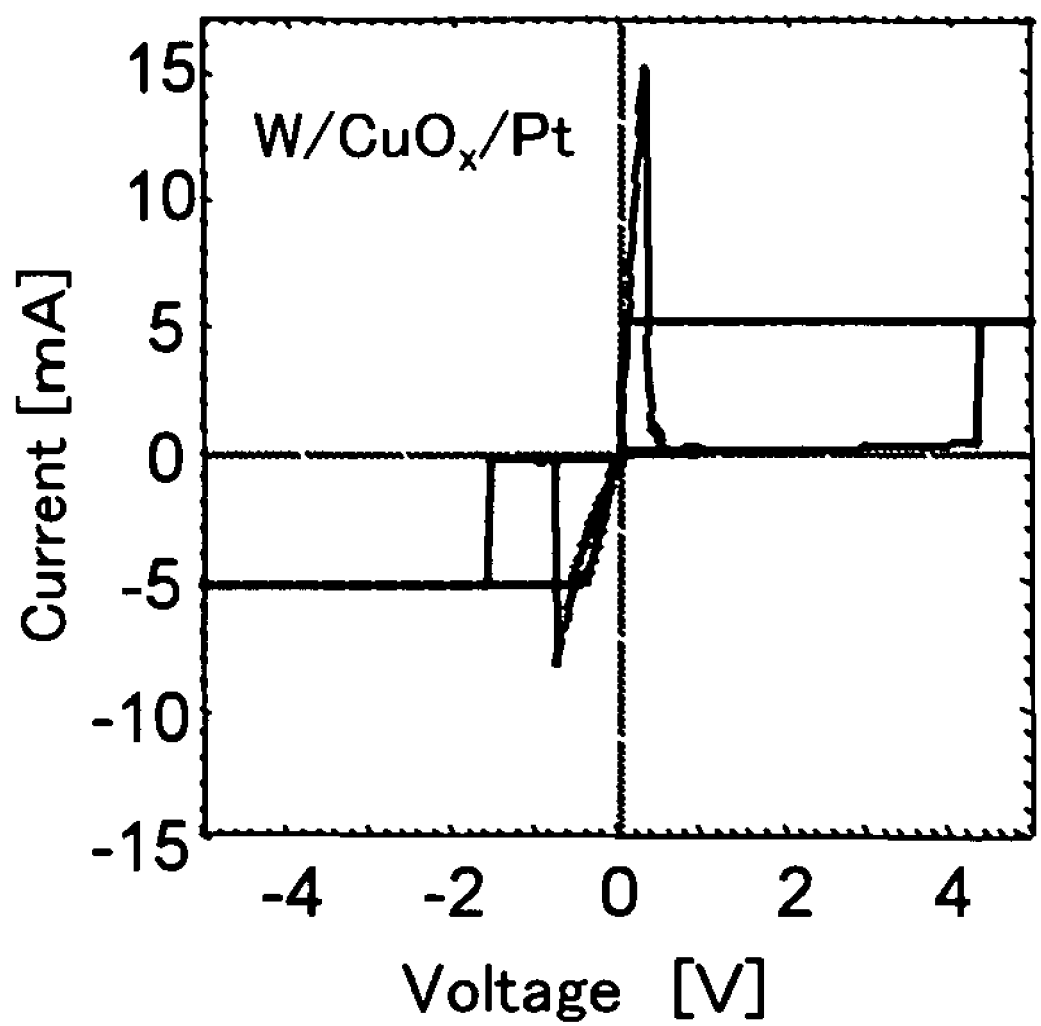
FIG. 24 is a volt-ampere curve showing the resistive characteristics of the variable resistive element having W/CuOx/Pt structure.

As a variable resistor of a variable resistive element to which the present invention can apply, metal oxides, metal oxynitrides, or organic thin film, etc. may be applied. In particular, the variable resistive element using oxides or oxynitrides including transition metal, oxides or oxynitrides including elements to be selected from Mn, Fe, Ni, Co, Ti, Cu and V or that using perovskite-type oxides such as PCMO, etc. is a variable resistive element having different first threshold voltage and second threshold voltage and capable of producing similar effect when used in the present invention, although voltage values of the first threshold voltage and the second threshold voltage differ for individual structure or every material. For instance, the variable resistive element having Pt/NiO/Pt structure exhibits the current-voltage characteristics as shown in FIG. 23, and that having W/CuOx/Pt structure exhibits the current-voltage characteristics as shown in FIG. 24, both of which have different first threshold voltage and second threshold voltage, and can produce similar effect when used in the device of the present invention.

In addition, not only material of the upper and lower electrodes of the variable resistive element but also that of the word line and bit line shall not be limited to those in the respective embodiments described above.

(2) In the above third embodiment, the diode 62 comprising the memory cells may be formed either on upper or lower side of the variable resistive element 61. In addition, the diode 62 shall not be limited to the PN-junction type diode, and may be formed of Schottky barrier diodes. Otherwise, depending on polarity of applied voltage, forward direction of the diode 62 may be reversed to the direction shown in the above third embodiment.

In addition, use of a nonlinear device such as a varistor, etc., that does not conduct electricity unless applied voltage exceed certain point, instead of the diode 62 comprising the memory cells, could produce the effect of leak current in the cross-point type memory cell array. If a serial circuit of a bidirectional nonlinear element such as a varistor, etc., and the variable resistive element comprises the memory cells, it can be used in not only unipolar switching operations but also bipolar switching operations. As the circuit configuration when applying bipolar switching operations, the device configuration exemplified in the second embodiment may be used.

(3) In the above fourth embodiment, MOSFET was used as a selection transistor comprising the memory cells. However, a bipolar transistor may also be used as the selection transistor. In addition, the memory cells may be such configured that the selection transistor connects to the bit line and the variable resistive element connects to the source line.

(4) In the respective embodiments described above, although the configuration is such that the load resistive characteristic variable circuits 14, 44, 74 are provided outside of the memory cell arrays 11, 71, and selectively connected to either the selected word line or the selected bit line, it is also preferable to configure the memory cells by connecting the load resistive characteristic circuit in series to the variable resistive element in each memory cell. In such a case, the load resistive characteristic variable circuit provided outside of the memory cell array is made redundant. However, the load resistive characteristic variable circuit being directly controlled by the control circuits 16, 46, 76 to switch the load resistive characteristics should have the circuit configuration that makes it possible to perform said control to the selected memory cells.

For instance, in the second embodiment described above that assumes bipolar switching operations, if the load resistive characteristic variable circuit is provided in each memory cell, the load resistive characteristic variable circuit shall be configured by polarity dependent load resistive elements that can automatically switch the load resistive characteristics depending on polarity of voltage to be applied, and the memory cells shall be configured by a serial circuit of said polarity dependent load resistive elements and variable resistive element. As it has already been described in the second embodiment, a nonlinear element such as a varistor, etc., that exhibits asymmetrical current-voltage characteristics to the voltage polarity shown in FIG. 17 or Schottky barrier diode in which leak current in reverse bias is increased showing the current-voltage characteristics asymmetrical to the voltage polarity shown in FIG. 13 or the current-voltage characteristics similar to that may be applied to the polarity dependent load resistive element. In this embodiment, since the load resistive characteristics of the polarity dependent load resistive element can be automatically switched depending on the polarity of voltage to be applied, there is no need of directly receiving control for said switching from the control circuit 16, and the control circuit 16 has only to perform control for inverting polarities of voltage for programming and that for erasing.

In addition, it would be also acceptable to configure the memory cells by the serial circuit of the transistor elements capable of switching the load resistive characteristics through voltage control or current control and the variable resistive element. In this case, the transistor elements serve as the load resistive characteristic variable circuit in the memory cells, and the load resistive characteristics are switched by voltage control or current control from the control circuit 16. Thus, it can be applied either to unipolar switching operations or bipolar switching operations. In addition, if MOSFET is used as transistor elements, by controlling the gate voltage, the current-voltage characteristics between source/drain may change and the load resistive characteristic will switch. In addition, if bipolar transistors are used as the transistor elements, the load resistive characteristics change by controlling the base current, the current-voltage characteristics between a collector/an emitter change and the load resistive characteristics will switch.

In addition, since transistor elements provided in the memory cells as the load resistive characteristic variable circuit can be used as the selection transistor for selecting memory cells, by connecting a gate terminal or a base terminal of the above transistor element to the word line, one transistor element can perform operation for selecting memory cells and operation for switching the load resistive characteristics, through control of the word line voltage or word line current. For instance, the selection transistor in the memory cells in the fourth embodiment described above can be used as the load resistive characteristic variable circuit. In this case, voltage of the selected word line will be controlled in two ways to be higher than or equal to the threshold voltage of the selection transistors.

(5) In the respective embodiments described above, it was explained that the invention can be applied to either case whether the current-voltage characteristics of the variable resistive element is symmetrical or asymmetrical, and unipolar switching operations use voltage application of any one polarity, while bipolar switching operations use one polarity in programming and the other polarity in erasing. Now, if the current-voltage characteristic of the variable resistive element is asymmetrical to the polarity of applied voltage, there is a problem that, in the unipolar switching operations, which voltage polarity is advantageous in terms of stable switching operations or low power consumption, or in the bipolar switching operations, which voltage polarity is advantageous for use in programming operations in terms of stable switching operations or low power consumption. For instance, in the case of unipolar switching operations, if higher voltage of two different threshold voltages (first threshold voltage and second threshold voltage) to be specified by the absolute value of the lower limit of voltage value necessary for switching between the two resistive characteristics uses the voltage polarity on the lower voltage side, the higher voltage of the above first and second critical voltages can be reduced and power consumption in programming and erasing operations can also be reduced. In addition, from the standpoint of stable switching operations, a voltage difference between the first threshold voltage and the second threshold voltage is small in one of voltage polarities, and it is difficult to satisfy the conditions required for two variable resistive characteristics necessary for stable switching operations, the voltage polarity that is easier to implement the variable resistive characteristics that satisfy the above condition will be selected.

(6) The characteristic of the present invention is to switch load resistive characteristics of the load circuit according to the switching direction, and to enable high-speed switching operations in a stable manner even without using voltage pulses having different long and short pulse width or variable resistive elements having asymmetrical structure. In the respective embodiments described above, the load circuit was defined to be all circuit excluding selected memory cells in the circuit to which voltage pulses (voltage for programming and that for erasing) are applied from the voltage switch circuit. However, to the contrary, it would be acceptable to define the load circuit as the load resistive characteristic variable circuit that is the circuit section for switching two different load resistive characteristics and to include the current-voltage characteristics of the remaining circuit sections in the variable resistive element and adjust the two different load resistive characteristics that switch in the load resistive characteristic variable circuit.

The present invention can be used in a nonvolatile semiconductor memory device comprising a variable resistive element resistive characteristics of which change as result of voltage application, and, in particular, is effective in implementation of the nonvolatile semiconductor memory device capable of high-speed switching operations to the variable resistive element in a stable manner.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A nonvolatile semiconductor memory device comprising:
   a variable resistive element having a two-terminal structure wherein a resistive characteristic specified by current-voltage characteristics between two terminals can transit between two resistive characteristics of low resistance state and high resistance state that can be taken stably when voltage is applied to one terminal based on the other terminal with at least one of positive or negative polarities, the variable resistive element including different first threshold voltage and second threshold voltage, the first threshold voltage being the lower limit of an absolute value of applied voltage necessary for the resistive characteristic to transit from the low resistance state to the high resistance state, and the second threshold voltage being the lower limit of an absolute value of applied voltage necessary for the resistive characteristic to transit from the high resistance state to the low resistance state, wherein
   a memory state of the variable resistive element is determined by whether the resistive characteristic is either in the low resistance state or in the high resistance state, and the memory state can be written as a result of a transition of the resistive characteristic between the low resistance state and the high resistance state by applying voltage between both terminals of the variable resistive element,
   a load circuit for applying voltage between both terminals of the variable resistive element when the memory state of the variable resistive element is written is provided so as to be electrically connected in series with the variable resistive element to be written,
   a load resistive characteristic specified by current-voltage characteristics of the load circuit can be switched between two different load resistive characteristics,
   the two load resistive characteristics of the load circuit is selectively switched depending on whether the resistive characteristic of the variable resistive element to be written transits from the low resistance state to the high resistance state or from the high resistance state to the low resistance state,
   predetermined voltage for writing applied to both ends of a serial circuit of the variable resistive element to be written and the load circuit allows voltage necessary for transition from one of the two resistive characteristics to the other to be applied between both terminals of the variable resistive element, and after the resistive characteristic of the variable resistive element transits from the one resistive characteristic to the other resistive characteristic, the voltage applied between both terminals of the variable resistive element does not allow the resistive characteristic to return from the other resistive characteristic to the one resistive characteristic depending on the selected load resistive characteristic.

2. The nonvolatile semiconductor memory device according to claim 1, wherein
a memory state of the variable resistive element can be switched between the two resistance states by applying voltage having same polarity to one terminal based on the other terminal, and
each of the two load resistive characteristics of the load circuit selectively occurs when voltage having same polarity is applied to the load circuit.

3. The nonvolatile semiconductor memory device according to claim 2, wherein
under a first load resistive characteristic which is one of the two load resistive characteristics when the resistive characteristic of the variable resistive element transits from the low resistance state to the high resistance state, an absolute value of applied voltage between both terminals of the variable resistive element will be the first threshold voltage by resistive voltage division of the variable resistive element and the load circuit when first critical voltage is applied to both ends of the serial circuit of the variable resistive element of which the resistive characteristic is in the low resistance state and the load circuit, and will be second device voltage that is lower than the second threshold voltage after the resistive characteristic of the variable resistive element transits to the high resistance state, and
under a second load resistive characteristic which is the other of the two load resistive characteristics when the resistive characteristic of the variable resistive element transits from the high resistance state to the low resistance state, an absolute value of the applied voltage between both terminals of the variable resistive element will be the second threshold voltage by resistive voltage division of the variable resistive element and the load circuit when second critical voltage having same polarity as the first critical voltage is applied to both ends of the serial circuit of the variable resistive element of which the resistive characteristic is in the high resistance state and the load circuit, and will be first device voltage that is lower than the first threshold voltage after the resistive characteristic of the variable resistive element transits to the low resistance state.

4. The nonvolatile semiconductor memory device according to claim 3, wherein
the first threshold voltage is lower than the second threshold voltage, and
a first resistance value representing the first load resistive characteristic which is equal to a difference between the second device voltage and the first threshold voltage divided by a difference between a first threshold current and a second device current is less than a critical resistance value, and a second resistance value representing the second load resistive characteristic which is equal to a difference between the second threshold voltage and the first device voltage divided by a difference between a first device current and a second threshold current is more than a critical resistance value, wherein
the first threshold current is an absolute value of current when voltage between both terminals when the resistive characteristic of the variable resistive element is in the low resistance state is the first threshold voltage, the first device current is an absolute value of current at the first device voltage,
the second threshold current is an absolute value of current when voltage between both terminals when the resistive characteristic of the variable resistive element is in the high resistance state is the second threshold voltage, the second device current is an absolute value of current at the second device voltage, and
the critical resistance value is a resistance value equal to a difference between the second threshold voltage and the first threshold voltage divided by a difference between the first threshold current and the second threshold current.

5. The nonvolatile semiconductor memory device according to claim 3, wherein
an absolute value of voltage amplitude of a first voltage pulse to be applied to both ends of the serial circuit of the variable resistive element of which the resistive characteristic is in the low resistance state and the load circuit is set higher than an absolute value of the first critical voltage when the resistive characteristic of the variable resistive element transits from the low resistance state to the high resistance state,
an absolute value of voltage amplitude of a second voltage pulse to be applied to both ends of the serial circuit of the variable resistive element of which the resistive characteristic is in the high resistance state and the load circuit is set higher than an absolute value of the second critical voltage when the resistive characteristic of the variable resistive element transits from the high resistance state to the low resistance state, and
the first voltage pulse and the second voltage pulse have same polarity.

6. The nonvolatile semiconductor memory device according to claim 5, wherein
an absolute value of voltage amplitude is same between the first voltage pulse and the second voltage pulse.

7. The nonvolatile semiconductor memory device according to claim 5, wherein
pulse width of the first voltage pulse and that of the second voltage pulse are both 100 ns or less.

8. The nonvolatile semiconductor memory device according to claim 5, wherein
pulse width of the first voltage pulse and that of the second voltage pulse have same length.

9. The nonvolatile semiconductor memory device according to claim 2 comprising the variable resistive element, wherein
a resistive characteristic to be specified by current-voltage characteristics between both terminals of the variable resistive element can transit between two resistive characteristics of low resistance state and high resistance state even when application of voltage to one terminal based on the other terminal is conducted at either positive or negative polarity,
to voltage application at one polarity, first threshold voltage that is the lower limit of an absolute value of applied voltage necessary for the resistive characteristic to transit from the low resistance state to the high resistance state differs from second threshold voltage that is the lower limit of an absolute value of applied voltage necessary for the resistive characteristic to transit from the high resistance state to the low resistance state,
also to voltage application at the other polarity, third threshold voltage that is the lower limit of an absolute value of applied voltage necessary for the resistive characteristic to transit from the low resistance state to the high resistance state differs from fourth threshold voltage that is the lower limit of an absolute value of applied voltage necessary for the resistive characteristic to transit from the high resistance state to the low resistance state, and the polarity of voltages having the same polarity to be applied to the load circuit is either one or the other polarity corresponding to lower voltage as a result of comparing higher voltage of the first threshold voltage and the second threshold voltage with higher voltage of the third threshold voltage and the fourth threshold voltage.

10. The nonvolatile semiconductor memory device according to claim 1, wherein the load circuit is configured so that the two load resistive characteristics can be switched on a current pathway which is commonly used when the resistive characteristic of the variable resistive element transits from the low resistance state to the high resistance state and when it transits from the high resistance state to the low resistance state, and a transistor element whose load resistive characteristic can be switched by voltage control or current control is provided on the current pathway which is commonly used.

11. The nonvolatile semiconductor memory device according to claim 1, wherein the load circuit is configured so that the two load resistive characteristics can be switched by switching at least a part of a circuit which activates when the resistive characteristic of the variable resistive element transits from the low resistance state to the high resistance state and at least a part of a circuit which activates when the resistive characteristic of the variable resistive element transits from the high resistance state to the low resistance state.

12. The nonvolatile semiconductor memory device according to claim 1 comprising the variable resistive element, wherein a resistive characteristic to be specified by current-voltage characteristics between both terminals of the variable resistive element can transit between two resistive characteristics of low resistance state and high resistance state even when application of voltage to one terminal based on the other terminal is conducted at either positive or negative polarity, to voltage application at one polarity, first threshold voltage that is the lower limit of an absolute value of applied voltage necessary for the resistive characteristic to transit from the low resistance state to the high resistance state differs from second threshold voltage that is the lower limit of an absolute value of applied voltage necessary for the resistive characteristic to transit from the high resistance state to the low resistance state, also to voltage application at the other polarity, third threshold voltage that is the lower limit of an absolute value of applied voltage necessary for the resistive characteristic to transit from the low resistance state to the high resistance state differs from fourth threshold voltage that is the lower limit of an absolute value of applied voltage necessary for the resistive characteristic to transit from the high resistance state to the low resistance state, a memory state of the variable resistive element can be written by voltage application at both positive and negative polarities to one terminal based on the other terminal of the variable resistive element, and one of the two load resistive characteristics of the load circuit occurs when voltage of one polarity is applied to the load circuit, and the other of the two load resistive characteristics of the load circuit occurs when voltage of the other polarity is applied to the load circuit.

13. The nonvolatile semiconductor memory device according to claim 12, wherein under a first load resistive characteristic which is one of the two load resistive characteristics when the resistive characteristic of the variable resistive element transits from the low resistance state to the high resistance state, an absolute value of applied voltage between both terminals of the variable resistive element will be the first threshold voltage by resistive voltage division of the variable resistive element and the load circuit when first critical voltage is applied to both ends of the serial circuit of the variable resistive element of which the resistive characteristic is in the low resistance state and the load circuit, and will be second device voltage that is lower than the second threshold voltage after the resistive characteristic of the variable resistive element transits to the high resistance state, and under a third load resistive characteristic which is the other of the two load resistive characteristics when the resistive characteristic of the variable resistive element transits from the high resistance state to the low resistance state, an absolute value of the applied voltage between both terminals of the variable resistive element will be the fourth threshold voltage by resistive voltage division of the variable resistive element and the load circuit when third critical voltage having opposite polarity to the first critical voltage is applied to both ends of the serial circuit of the variable resistive element of which the resistive characteristic is in the high resistance state and the load circuit, and will be third device voltage that is lower than the third threshold voltage after the resistive characteristic of the variable resistive element transits to the low resistance state.

14. The nonvolatile semiconductor memory device according to claim 13, wherein the first threshold voltage is lower than the second threshold voltage, the third threshold voltage is lower than the fourth threshold voltage, and a first resistance value representing the first load resistive characteristic which is equal to a difference between the second device voltage and the first threshold voltage divided by a difference between a first threshold current and a second device current is less than a first critical resistance value, and a third resistance value representing the third load resistive characteristic which is equal to a difference between the fourth threshold voltage and the third device voltage divided by a difference between a third device current and a fourth threshold current is more than a second critical resistance value, wherein with the first critical voltage applied, the first threshold current is an absolute value of current when voltage between both terminals when the resistive characteristic of the variable resistive element is in the low resistance state is the first threshold voltage, the second device current is an absolute value of current when voltage between both terminals when the resistive characteristic of the variable resistive element is in the high resistance state is the second device voltage, the second threshold current is an absolute value of current when voltage between both terminals when the resistive characteristic of the variable resistive element is in the high resistance state is the second threshold voltage, with the third critical voltage applied, the fourth threshold current is an absolute value of current when voltage between both terminals when the resistive characteristic of the variable resistive element is in the high resistance state is the fourth threshold voltage, the third device current is an absolute value of current when voltage between both terminals when the resistive characteristic of the variable resistive element is in the low resistance state is the third device voltage, the third threshold current is an absolute value of current when voltage between both terminals when the resistive characteristic of the variable resistive element is in the low resistance state is the third threshold voltage, the first critical resistance value is a resistance value equal to a difference between the second threshold voltage and the first threshold voltage divided by a difference between the first threshold current and the second threshold current, and the second critical resistance value is a resistance value equal to a difference between the fourth threshold voltage and the third threshold voltage divided by a difference between the third threshold current and the fourth threshold current.

15. The nonvolatile semiconductor memory device according to claim 13, wherein an absolute value of voltage amplitude of the first voltage pulse to be applied to both ends of the serial circuit of the variable resistive element of which the resistive characteristic is in the low resistance state and the load circuit is set higher than an absolute value of the first critical voltage when the resistive characteristic of the variable resistive element transits from the low resistance state to the high resistance state, an absolute value of the voltage amplitude of the third voltage pulse to be applied to both ends of the serial circuit of the variable resistive element of which the resistive characteristic is in the high resistance state and the load circuit is set higher than an absolute value of the third critical voltage when the resistive characteristic of the variable resistive element transits from the high resistance state to the low resistance state, and the first voltage pulse and the third voltage pulse have a polarity opposite to each other.

16. The nonvolatile semiconductor memory device according to claim 15, wherein an absolute value of voltage amplitude is same between the first voltage pulse and the third voltage pulse.

17. The nonvolatile semiconductor memory device according to claim 15, wherein pulse width of the first voltage pulse and that of the third voltage pulse have same length.

18. The nonvolatile semiconductor memory device according to claim 12, wherein the load circuit is configured so that the two load resistive characteristics can be switched on a current pathway which is commonly used when the resistive characteristic of the variable resistive element transits from the low resistance state to the high resistance state and when it transits from the high resistance state to the low resistance state, and a polarity dependent load resistance circuit whose load resistive characteristic can be switched depending on polarity of voltage to be applied is provided on the current pathway to be commonly used.

19. The nonvolatile semiconductor memory device according to claim 18, wherein the polarity dependent load resistance circuit comprises a polarity dependent load resistive element whose load resistive characteristic can be switched depending on polarity of voltage to be applied.

20. The nonvolatile semiconductor memory device according to claim 12, wherein the load circuit is configured so that the two load resistive characteristics can be switched on a current pathway which is commonly used when the resistive characteristic of the variable resistive element transits from the low resistance state to the high resistance state and when it transits from the high resistance state to the low resistance state, and a transistor element whose load resistive characteristic can be switched by voltage control or current control is provided on the current pathway which is commonly used.

21. The nonvolatile semiconductor memory device according to claim 12, wherein the load circuit is configured so that the two load resistive characteristics can be switched by switching at least a part of a circuit which activates when the resistive characteristic of the variable resistive element transits from the low resistance state to the high resistance state and at least a part of a circuit which activates when the resistive characteristic of the variable resistive element transits from the high resistance state to the low resistance state.

22. The nonvolatile semiconductor memory device according to claim 1 comprising:

a memory cell comprised of the variable resistive elements;

a memory cell array including a plurality of the memory cells arranged in a row direction and in a column direction, a plurality of word lines extending in the row direction and a plurality of bit lines extending in the column direction, wherein the memory cells in a same row are connected at one end of the memory cells to the word line in common and the memory cells in a same column are connected at the other end of the memory cells to the bit lines in common;

a word line selection circuit for selecting a predetermined number of the word lines as a selected word line from the plurality of word lines;

a bit line selection circuit for selecting a predetermined number of the bit lines as a selected bit line from the plurality of bit lines; and a control circuit for controlling switching of the two different load resistive characteristics of the load circuit.

23. The nonvolatile semiconductor memory device according to claim 22, wherein a load resistance characteristic variable circuit for switching the two different load resistive characteristics of the load circuit is formed external to the memory cell array, and is configured to be able to electrically connect to at least either one side of the selected word line or the selected bit line.

24. The nonvolatile semiconductor memory device according to claim 22, wherein the memory cell comprises only the variable resistive element.

25. The nonvolatile semiconductor memory device according to claim 22, wherein the memory cell comprises a serial circuit of the variable resistive element and a diode, or a serial circuit of the variable resistive element and a varistor.

26. The nonvolatile semiconductor memory device according to claim 19 comprising:

a memory cell comprised of a serial circuit of the variable resistive element and the polarity dependent load resistive element;

a memory cell array including a plurality of the memory cells arranged in a row direction and in a column direction, a plurality of word lines extending in the row direction and a plurality of bit lines extending in the column direction, wherein the memory cells in a same row are connected at one end of the memory cells to the word line in common and the memory cells in a same column are connected at the other end of the memory cells to the bit lines in common;
- a word line selection circuit for selecting a predetermined number of the word lines as a selected word line from the plurality of word lines;
- a bit line selection circuit for selecting a predetermined number of the bit lines as a selected bit line from the plurality of bit lines; and
- a control circuit for controlling switching of the two different load resistive characteristics of the load circuit, wherein
- the control circuit switches the two different load resistive characteristics of the load circuit by switching polarities of the voltage to be applied between the selected word line and the selected bit line.

27. The nonvolatile semiconductor memory device according to claim 10 comprising:
- a memory cell comprised of a serial circuit of the variable resistive element and the transistor element that can switch the load resistive characteristics by voltage control or current control;
- a memory cell array including a plurality of the memory cells are arranged in a row direction and in a column direction, a plurality of word lines extending in the row direction and a plurality of bit lines and one or more source lines extending in the column direction, wherein the memory cells in a same row are connected to the word line in common at a control terminal for switching the load resistive characteristics of the load circuit of the memory cell by voltage control or current control, and the memory cells in a same column are connected at one end of the serial circuit of the memory cells to the bit line in common and are connected at the other end of the serial circuit of the memory cells to the source line in common;
- a word line selection circuit for selecting a predetermined number of the word lines as a selected word line from the plurality of word lines;
- a bit line selection circuit for selecting a predetermined number of the bit lines as a selected bit line from the plurality of bit lines; and
- a control circuit for controlling switching of the two different load resistive characteristics of the load circuit.

28. The nonvolatile semiconductor memory device according to claim 27, wherein the control circuit switches the two different load resistive characteristics of the load circuit by controlling voltage or current to be applied to the selected word line.

29. The nonvolatile semiconductor memory device according to claim 27, wherein the transistor element in the memory cells serves as a selection transistor for selecting the memory cell as a target of writing.

30. The nonvolatile semiconductor memory device according to claim 1 comprising:
- a memory cell comprised of a serial circuit of the variable resistive element and a selection transistor;
- a memory cell array including a plurality of the memory cells arranged in a row direction and in a column direction, a plurality of word lines extending in the row direction and a plurality of bit lines and one or more source lines extending in the column direction, wherein the memory cells in a same row are connected to the word line in common at a gate terminal of the selection transistor, and the memory cells in a same column are connected at one end of the serial circuit of the memory cells to the bit line in common and are connected at the other end of the serial circuit of the memory cells to the source line in common;
- a word line selection circuit for selecting a predetermined number of the word lines as a selected word line from the plurality of word lines;
- a bit line selection circuit for selecting a predetermined number of the bit lines as a selected bit line from the plurality of bit lines; and
- a control circuit for controlling switching of the two different load resistive characteristics of the load circuit, wherein
- the load resistive characteristic variable circuit for switching the two different load resistive characteristics of the load circuit is formed external to the memory cell array, and is configured to be able to be electrically connected to the selected bit line or the source line when a memory state of the memory cell is written.

31. The nonvolatile semiconductor memory device according to claim 1, wherein
- the variable resistive element has a variable resistor sandwiched between a first electrode and a second electrode, and
- the variable resistor is oxides or oxynitrides including a transition metal.

32. The nonvolatile semiconductor memory device according to claim 31, wherein the variable resistor is oxides or oxynitrides including any element selected from Mn, Fe, Ni, Co., Ti, Cu, and V.

33. The nonvolatile semiconductor memory device according to claim 32, wherein the variable resistor is a perovskite-type oxide.

34. The nonvolatile semiconductor memory device according to claim 31, wherein the first electrode and the second electrode are made from same material.

* * * * *